(12) United States Patent
Shalibo et al.

(10) Patent No.: US 12,095,226 B2
(45) Date of Patent: *Sep. 17, 2024

(54) PASSIVE Q-SWITCHED LASERS AND METHODS FOR OPERATION AND MANUFACTURE THEREOF

(71) Applicant: TriEye Ltd., Tel Aviv (IL)

(72) Inventors: Yoni Prosper Shalibo, Tel Aviv (IL); Ariel Danan, Tel-Aviv (IL); Omer Kapach, Tel Aviv (IL)

(73) Assignee: TriEye Ltd., Tel Aviv (IL)

(*) Notice: Subject to any disclaimer, the term of this patent is extended or adjusted under 35 U.S.C. 154(b) by 0 days.

This patent is subject to a terminal disclaimer.

(21) Appl. No.: 18/471,350

(22) Filed: Sep. 21, 2023

(65) Prior Publication Data
US 2024/0014630 A1 Jan. 11, 2024

Related U.S. Application Data

(63) Continuation of application No. 17/202,501, filed on Mar. 16, 2021, now Pat. No. 11,811,194, which is a
(Continued)

(51) Int. Cl.
*H01S 5/06* (2006.01)
*B32B 18/00* (2006.01)
(Continued)

(52) U.S. Cl.
CPC ............ *H01S 5/0615* (2013.01); *B32B 18/00* (2013.01); *C04B 35/495* (2013.01); *G01S 7/484* (2013.01);
(Continued)

(58) Field of Classification Search
CPC ..... B32B 18/00; C04B 35/495; C04B 35/553; C04B 2235/3203; C04B 2235/3224;
(Continued)

(56) References Cited

U.S. PATENT DOCUMENTS

| 9,810,775 | B1 | 11/2017 | Welford et al. |
| 11,811,194 | B2 * | 11/2023 | Shalibo ............ G01S 7/484 |

(Continued)

FOREIGN PATENT DOCUMENTS

| CN | 103581488 A | 2/2014 |
| CN | 104848803 A | 8/2015 |
| WO | 2014156544 A1 | 10/2014 |

OTHER PUBLICATIONS

European Search Report in related EP application 23185908.3 dated Oct. 30, 2023.
(Continued)

*Primary Examiner* — Mark R Gaworecki
(74) *Attorney, Agent, or Firm* — Nathan & Associates; Menachem Nathan

(57) ABSTRACT

Systems and methods for imaging in the short wave infrared (SWIR), photodetectors with low dark current and associated circuits for reducing dark currents and methods for generating image information based on data of a photodetector array. A SWIR imaging system may include a pulsed illumination source operative to emit radiation pulses in the SWIR band towards a target resulting in reflected radiation from the target; (b) an imaging receiver including a plurality of Ge PDs operative to detect the reflected SWIR radiation and a controller, operative to control activation of the receiver for an integration time during which the accumulated dark current noise does not exceed the time independent readout noise.

17 Claims, 28 Drawing Sheets

Related U.S. Application Data continuation of application No. 17/266,142, filed as application No. PCT/IB2020/060011 on Oct. 24, 2020, now Pat. No. 11,606,515, which is a continuation-in-part of application No. 16/662,665, filed on Oct. 24, 2019, now Pat. No. 10,978,600.

(60) Provisional application No. 63/094,913, filed on Oct. 22, 2020, provisional application No. 63/093,945, filed on Oct. 20, 2020, provisional application No. 63/075,426, filed on Sep. 8, 2020.

(51) Int. Cl.
| | |
|---|---|
| *C04B 35/495* | (2006.01) |
| *G01S 7/484* | (2006.01) |
| *H01S 3/06* | (2006.01) |
| *H01S 3/11* | (2023.01) |
| *H01S 3/113* | (2006.01) |
| *H01S 3/16* | (2006.01) |
| *H01S 5/00* | (2006.01) |
| *H01S 3/0941* | (2006.01) |
| *H01S 3/131* | (2006.01) |

(52) U.S. Cl.
CPC ............ *H01S 3/113* (2013.01); *H01S 3/1685* (2013.01); *H01S 5/0071* (2013.01); *C04B 2235/3203* (2013.01); *C04B 2235/3224* (2013.01); *C04B 2235/3225* (2013.01); *C04B 2235/9653* (2013.01); *C04B 2237/343* (2013.01); *C04B 2237/36* (2013.01); *H01S 3/061* (2013.01); *H01S 3/0627* (2013.01); *H01S 3/09415* (2013.01); *H01S 3/1312* (2013.01); *H01S 3/1643* (2013.01)

(58) Field of Classification Search
CPC .... C04B 2235/3225; C04B 2235/9653; C04B 2237/343; C04B 2237/36; C04B 2237/78; G01S 7/484; G01S 7/4863; G01S 17/89; G01S 17/931; H01S 3/061; H01S 3/0612; H01S 3/0627; H01S 3/092; H01S 3/09415; H01S 3/113; H01S 3/1312; H01S 3/1643; H01S 3/1685; H01S 5/0071; H01S 5/0615
See application file for complete search history.

(56) References Cited

U.S. PATENT DOCUMENTS

| | | |
|---|---|---|
| 2003/0214986 A1 | 11/2003 | Kouta et al. |
| 2008/0247425 A1 | 10/2008 | Welford |
| 2008/0317072 A1 | 12/2008 | Essaian et al. |
| 2015/0117476 A1 | 4/2015 | Akino et al. |
| 2020/0076152 A1* | 3/2020 | Eichenholz .......... G02B 26/125 |

OTHER PUBLICATIONS

Office Action in related EP application 23185908.3 dated Dec. 4, 2023.

Balashov, V.V., Bezotosnyi, V.V., Cheshev, E.A. et al. Composite Ceramic Nd3+:YAG/Cr4+:YAG Laser Elements. J Russ Laser Res 40, 237-242 (2019).

Wang, S., Zhu, S., Chen, Z et al. High average power, side-pumped passively Q-switched laser of 1064 nm by using composite crystal Nd: YAG/Cr4+: YAG/YAG. J Opt 43, 183-187 (2014).

Office Action in related TW application 112116055 dated Dec. 13, 2023.

* cited by examiner

510 Emitting at least one illumination pulse toward the FOV, resulting in SWIR radiation reflecting from at least one targe

520 Triggering initiation of continuous signal acquisition by an imaging receiver which includes a plurality of Ge photodiodes operable to detect the reflected SWIR radiation

530 Collecting for each of the plurality of Ge photodiodes, as a result of the triggering, charge resulting from at least: the impinging of the SWIR reflection radiation on the respective Ge photodiode, dark current that is larger than $50\mu A/cm^2$, integration-time dependent dark current noise, and integration-time independent readout noise

540 Triggering ceasing of the collection of the charge when the amount of charge collected as a result of dark current noise is still lower than the amount of charge collected as a result of the integration-time independent readout noise

550 Reading by readout circuitry a signal correlated to the amount of charge collected by each of the Ge photodiodes, amplifying the read signal, and providing the amplified signals to an image processor

560 Generating an image of the FOV based on the levels of charge collected by each of the plurality of Ge PDs.

500      FIG. 5

2010 Based on dark current level(s) in the reference PD(s), generating a control voltage that, when provided to the at least one reference VCCC causes it to generate a current that reduces an effect of dark current of the reference PD on an output of the reference photosite

2020 Providing the control voltage to at least one first VCCC, thereby causing it to generate a current that reduces an effect of dark current of the active PDs on outputs of the plurality of active photosites

When a PDD operates in temperature $T_1$:

2110 Determining a first control voltage based on dark current of at least one reference PD of the PDD 2112 Providing the first control voltage to a first voltage controlled current circuit which is coupled to at least one active PD of an active photosite of the PDD, thereby causing the first voltage controlled current circuit to impose a first dark-current countering current in the active photosite 2114 Generating by the active PD a first detection current in response to: (a) light impinging of the active PD originating in an object in a field of view of the PDD, and (b) dark current generated by the active PD 2116 Outputting by the active photosite a first detection signal whose magnitude is smaller than the first detection current in response to the first detection current and to the first dark-current countering current, thereby compensating effect of dark current on the first detection signal 2118 Image the FOV based on multiple first detection signals

When the PDD operates in temperature $T_2$ higher than $T_1$ by at least 10°C

2120 Determining a second control voltage based on dark current of at least one reference PD of the PDD 2122 Providing the second control voltage to the first voltage controlled current circuit, thereby causing the first voltage controlled current circuit to impose in the active photosite a second dark-current countering current having magnitude which is larger than a magnitude of the first dark-current countering current by a factor of at least two 2124 Generating by the active PD a second detection current in response to: (a) light impinging of the active PD originating in the object, and (b) dark current generated by the active PD 2126 Outputting by the active photosite a second detection signal whose magnitude is smaller than the second detection current in response to the second detection current and to the second dark-current countering current, thereby compensating effect of dark current on the second detection signal 2128 Image the FOV based on multiple first detection signals

2100      FIG. 21

2210 Providing a first voltage to a first input of an amplifier of a control-voltage generating circuitry, when the second input of the amplifier is connected to a reference PD and to a second VCCC that supplies current in a level responsive to an output voltage of the amplifier, thereby causing the amplifier to generate a first control voltage for a first current circuit of a photosite (PS) of the PDD

2220 Reading a first output signal of the PS, generated by the PS in response to current generated by the first current circuit and by a PD of the PS

2230 Providing to the first input of the amplifier a second voltage different than the first voltage, thereby causing the amplifier to generate a second control voltage for the first current circuit

2240 Reading a second output signal of the PS, generated by the PS in response to current generated by the first current circuit and by a PD of the PS

2250 Determining a defectivity state of a detection path of the PDD based on the first output signal and on the second output signal

| | |
|---|---|
| 2402 | Receiving first frame information including for each out of a plurality of photosites first frame detection level indicative of an intensity of light detected by the respective photosite during a first frame exposure time |
| 2404 | Based on the first frame exposure time, identifying out of the plurality of photosites: (a) a first group of usable photosites including a first photosite, a second photosite, and a third photosite, and (b) a first group of unusable photosites including a fourth photosite |
| 2406 | Generating a first image based on the first frame detection levels of the first group of usable photosites, disregarding first frame detection levels of the first group of unusable photosites |
| 2408 | Determining, after receiving the first frame information, a second frame exposure time which is longer than the first frame exposure time |
| 2410 | Receiving second frame information including for each of the plurality of photosites a second frame detection level indicative of an intensity of light detected by the respective photosite during a second frame exposure time |
| 2412 | Based on the second frame exposure time, identifying out of the plurality of photosites of the photosensor array: (a) a second group of usable photosites including the first photosite, and (b) a second group of unusable photosites including the second photosite, and the third photosite, and the fourth photosite |
| 2414 | Generating a second image based on the second frame detection levels of the second group of usable photosites, disregarding second frame detection levels of the second group of unusable photosites |
| 2416 | Determining, after receiving the second frame information, a third frame exposure time which is longer than the first frame exposure time and shorter than the second frame exposure time |
| 2418 | Receiving third frame information including for each of the plurality of photosites a third frame detection level indicative of an intensity of light detected by the respective photosite during a third frame exposure time |
| 2420 | Based on the third frame exposure time, identifying out of the plurality of photosites of the photosensor array: (a) a third group of usable photosites including the first photosite and the second photosite, and (b) a third group of unusable photosites including the third photosite and the fourth photosite |
| 2422 | Generating a third image based on the third frame detection levels of the third group of usable photosites, disregarding third frame detection levels of the third group of unusable photosites |

FIG. 24    2400

For each out of a plurality of detection frames:

> 3510 Receiving from a photodetector array frame information indicative of detection signals pertaining to the frame duration provided by a plurality of photosensor elements > 3520 Receiving operational conditions data indicative of operational conditions of the photodetector array during the frame duration > 3530 Determining based on the operational conditions data a group of defective photosensor elements which includes at least one of the photosensor element and excludes a plurality of the other photosensor elements (such that different groups are selected for different frames, based on different operational conditions on these frames)

> 3540 Processing the first frame information based on the group of defective photosensor elements, to provide an image representing the frame, basing the processing on detection signals of photosensor elements of the photodetector excluding photosensor element included in the group of defective elements.

FIG. 27      3500

3710 Receiving from a photodetector array first frame information of a black target which includes a white area, indicative of light intensities of different parts of the target detected by the photodetector array during a first FET

3720 Processing the first frame information based on the first FET to provide a first image which includes a bright region surrounded by a dark background

3730 Receiving from the photodetector array second frame information of the black target which includes the white area, indicative light intensities of the different parts of the target detected by the photodetector array during a second FET which is longer than the first FET

3740 Processing the second frame information based on the second FET to provide a second image which includes a dark background without a bright region

FIG. 29 3700

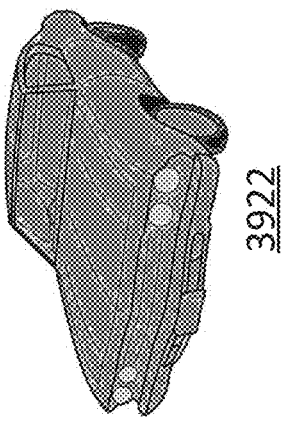
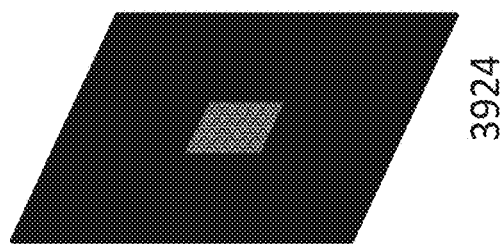

Longer frame exposure time

3922

3924

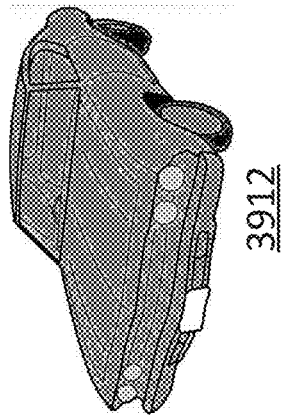
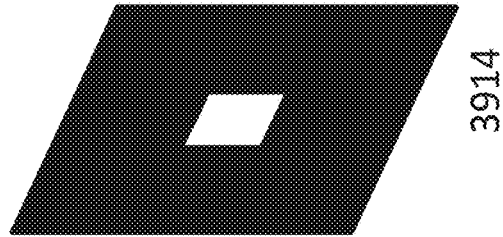

Shorter frame exposure time

PASSIVE Q-SWITCHED LASERS AND METHODS FOR OPERATION AND MANUFACTURE THEREOF

CROSS REFERENCE TO RELATED APPLICATIONS

This application is a continuation of U.S. patent application Ser. No. 17/202,501 filed Mar. 16, 2021 (now allowed), which was a continuation of U.S. patent application Ser. No. 17/266,142 filed Feb. 5, 2021 (now U.S. Pat. No. 11,606,515), which was a 371 application from international patent application No. PCT/IB2020/060011 filed Oct. 24, 2020, and is related to and claims priority from U.S. patent application Ser. No. 16/662,665 filed Oct. 24, 2019, No. 63/075,426 filed Sep. 8, 2020, No. 63/093,945 filed Oct. 20, 2020 and No. 63/094,913 filed Oct. 22, 2020, all of which are incorporated herein by reference in their entirety.

FIELD

The disclosure relates to photonic systems, methods, and computer program products. More specifically, the disclosure relates to electro-optics and lasers used in infrared (IR) photonics.

BACKGROUND

Photodetecting devices such as photodetector arrays (also referred to as "photosensor arrays") include a multitude of photosites, each including one or more photodiodes for detecting impinging light and capacitance for storing charge provided by the photodiode. The capacitance may be implemented as a dedicated capacitor and/or using parasitic capacitance of the photodiode, transistors, and/or other components of the PS. Henceforth in this description and for simplicity, the term "photodetecting device" is often replaced with the acronym "PDD", the term "photodetector array" is often replaced with the acronym "PDA", and the term "photodiode" is often replaced with the acronym "PD".

The term "photosite" pertains to a single sensor element of an array of sensors (also referred to as "sensel", as in a portmanteau of the words "sensor" and "cell" or "sensor" and "element"), and is also referred to as "sensor element", "photosensor element", "photodetector element", and so on. Hereinbelow, "photosite" is often replaced with the acronym "PS". Each PS may include one or more PDs (e.g., if color filter array is implemented, PDs which detect light of different parts of the spectrum may optionally be collectively referred to as single PS). The PS may also include some circuitry or additional components in addition to the PD.

Dark current is a well-known phenomenon, and when referring to PDs it pertains to an electric current that flows through the PD even when no photons are entering the device. Dark current in PDs may result from random generation of electrons and holes within a depletion region of the PD.

In some cases, there is a need to provide photosites with photodiodes characterized by a relatively high dark current, while implementing capacitors of limited size. In some cases, there is a need to provide PSs with PDs characterized by a relatively high dark current while reducing effects of the dark current on an output detection signal. In PSs characterized by high dark current accumulation, there is a need for, and it would be advantageous to overcome detrimental effects of dark current on electrooptical systems. Henceforth and for simplicity, the term "electrooptical" may be replaced with the acronym "EO".

Short-wave infrared (SWIR) imaging enables a range of applications that are difficult to perform using imaging of visible light. Applications include electronic board inspection, solar cell inspection, produce inspection, gated imaging, identifying and sorting, surveillance, anti-counterfeiting, process quality control, and much more. Many existing InGaAs-based SWIR imaging systems are expensive to fabricate, and currently suffer from limited manufacturing capacity.

It would therefore be advantageous to be able to provide SWIR imaging systems using more cost-effective photoreceivers based on PDs that are more easily integrated into the surrounding electronics.

SUMMARY

According to an aspect of the disclosure, there is provided an active SWIR imaging system that includes: a pulsed illumination source operative to emit SWIR radiation pulses towards a target, the radiation pulses impinging on the target resulting in reflected SWIR radiation pulses reflected from the target; an imaging receiver comprising a plurality of Germanium (Ge) PDs operative to detect the reflected SWIR radiation, wherein the imaging receiver produces for each Ge PD a respective detection signal representative of the reflected SWIR radiation impinging on the respective Ge PD, a dark current that is larger than 50 $\mu A/cm^2$, time dependent dark current noise and time independent readout noise; and a controller, operative to control activation of the imaging receiver for an integration time during which an accumulated dark current noise does not exceed the time independent readout noise.

According to an aspect of the disclosure, there is disclosed a method for generating SWIR images of objects in a field of view (FOV) of an EO system, the method including: emitting at least one illumination pulse toward the FOV, resulting in SWIR radiation reflecting from at least one target; triggering initiation of continuous signal acquisition by an imaging receiver that includes a plurality of Ge PDs operative to detect the reflected SWIR radiation; collecting for each of the plurality of Ge PDs, as a result of the triggering, charge resulting from at least the impinging of the SWIR reflection radiation on the respective Ge PD, dark current that is larger than 50 $\mu A/cm^2$, integration-time dependent dark current noise, and integration-time independent readout noise; triggering ceasing of the collection of the charge when the amount of charge collected as a result of dark current noise is still lower than the amount of charge collected as a result of the integration-time independent readout noise; and generating an image of the FOV based on the levels of charge collected by each of the plurality of Ge PDs.

According to an aspect of the disclosure, there is disclosed a SWIR optical system, the SWIR system that includes a passively Q-switched laser (also referred to herein as "P-QS laser") that includes: a gain medium including a gain medium crystalline (GMC) material that is ceramic neodymium-doped yttrium aluminum garnet (Nd:YAG); a saturable absorber (SA) rigidly connected to the gain medium, the SA including a ceramic SA crystalline material selected from a group of doped ceramic materials consisting of: $V^{3+}$:YAG and two-valence Cobalt-doped crystalline materials; and an optical cavity within which the gain medium and the SA are positioned, the optical cavity including a high reflectivity mirror and an output coupler.

Henceforth in this description and for simplicity, the term "saturable absorber" is often replaced with the acronym "SA".

According to an aspect of the disclosure, there is disclosed a SWIR optical system, the SWIR system including a P-QS laser that includes: a gain medium including a GMC material that is ceramic Nd:YAG, a SA rigidly connected to the gain medium, the SA including a ceramic SA crystalline material selected from a group of doped ceramic materials consisting of: $V^{3+}$:YAG and two-valence Cobalt-doped crystalline materials; and an optical cavity within which the gain medium and the SA are positioned, the optical cavity including a high reflectivity mirror and an output coupler.

According to an aspect of the disclosure, there is disclosed a SWIR optical system, that includes a P-QS laser that includes: a gain medium including a ceramic GMC material that is ceramic neodymium-doped rare-earth element crystal; a SA rigidly connected to the gain medium, the SA including a ceramic SA crystalline material selected from a group of doped crystalline materials consisting of: $V^{3+}$:YAG and Cobalt-doped crystalline materials; and an optical cavity within which the gain medium and the SA are positioned, the optical cavity including a high reflectivity mirror and an output coupler.

According to an aspect of the disclosure, there is disclosed a method for manufacturing parts for a P-QS laser, the method including: inserting into a first mold at least one first powder; compacting the at least one first powder in the first mold to yield a first green body; inserting into a second mold at least one second powder different than the at least one first powder; compacting the at least one second powder in the second mold, thereby yielding a second green body; heating the first green body to yield a first crystalline material; heating the second green body to yield a second crystalline material; and connecting the second crystalline material to the first crystalline material. In such a case, one crystalline material out of the first crystalline material and the second crystalline material is a neodymium-doped crystalline material and is a gain medium for the P-QS laser, and wherein the other crystalline material out of the first crystalline material and the second crystalline material is a SA for the P-QS laser and is selected from a group of crystalline materials consisting of a neodymium-doped crystalline material, and a doped crystalline material, the latter selected from the group of doped crystalline materials consisting of: $V^{3+}$:YAG and cobalt-doped crystalline materials. Also, in such a case, at least one of the gain medium and the SA is a ceramic crystalline material.

According to an aspect of the disclosure, there is disclosed a PDD that includes: an active PS including an active PD; a reference PS including a reference PD; a first voltage controlled current circuit consisting of a voltage-controlled current source or a voltage-controlled current sink, the first voltage controlled current circuit connected to the active PD; and control-voltage generating circuitry connected to the active voltage controlled current circuit and to the reference PS and used to provide to the voltage controlled current circuit a control voltage having a voltage level that is responsive to dark current of the reference PD, to reduce an effect of dark current of the active PD on an output of the active PS.

According to an aspect of the disclosure, there is disclosed a method for reducing effects of dark current in a PDD, the method including: when the PDD operates in a first temperature, determining a first control voltage based on dark current of at least one reference PD of the PDD; providing the first control voltage to a first voltage controlled current circuit that is connected to at least one active PD of an active PS of the PDD, thereby causing the first voltage controlled current circuit to impose a first dark-current countering current in the active PS; generating by the active PD a first detection current in response to light impinging of the active PD originating in an object in a field of view of the PDD, and to dark current generated by the active PD; and outputting by the active PS a first detection signal whose magnitude is smaller than the first detection current in response to the first detection current and to the first dark-current countering current, thereby compensating effect of dark current on the first detection signal; and when the PDD operates in a second temperature that is higher than the first temperature by at least 10° C., determining a second control voltage based on dark current of at least one reference PD of the PDD; providing the second control voltage to the first voltage controlled current circuit, thereby causing the first voltage controlled current circuit to impose a second dark-current countering current in the active PS; generating by the active PD a second detection current in response to light impinging of the active PD originating in the object, and to dark current generated by the active PD; and outputting by the active PS a second detection signal whose magnitude is smaller than the second detection current in response to the second detection current and to the second dark-current countering current, thereby compensating effect of dark current on the second detection signal. A magnitude of the second dark-current countering current in such a case larger than a magnitude of the first dark-current countering current by a factor of at least two.

According to an aspect of the disclosure, there is disclosed a method for testing a PDD, comprising: providing a first voltage to a first input of an amplifier of a control-voltage generating circuitry, wherein the second input of the amplifier is connected to a reference PD and to a second current circuit which supplies current in a level governed in response to an output voltage of the amplifier, thereby causing the amplifier to generate a first control voltage for a first current circuit of a PS of the PDD; reading a first output signal of the PS generated by the PS in response to current generated by the first current circuit and to a PD of the PS; providing to the first input of the amplifier a second voltage that is different than the first input voltage, thereby causing the amplifier to generate a second control voltage for the first current circuit; reading a second output signal of the PS generated by the PS in response to current generated by the first current circuit and to a PD of the PS; and based on the first output signal and on the second output signal, determining a defectivity state of a detection path of the PDD, the detection path including the PS and readout circuitry associated with the PS.

According to an aspect of the disclosure, there is disclosed a system for generating images, comprising a processor configured to: receive from a PDA multiple detection results of an object including a high reflectivity surface surrounded by low reflectivity surfaces on all sides, the multiple detection results including first frame information of the object detected by the PDA during a first frame exposure time and second frame information of the object detected by the PDA during a second frame exposure time that is longer than the first frame exposure time; process the first frame information based on the first frame exposure time to provide a first image that includes a bright region representing the high reflectivity surface, surrounded by a dark background representing the low reflectivity surfaces; and process the second frame information based on the second frame exposure time to provide a second image that includes a dark background without a bright region.

According to an aspect of the disclosure, there is disclosed a system for generating images comprising a processor configured to: receive from a PDA multiple detection results of an object including a high reflectivity surface surrounded by low reflectivity surfaces on all sides, the multiple detection results including first frame information of the object detected by the PDA during a first frame exposure time and second frame information of the object detected by the PDA during a second frame exposure time that is longer than the first frame exposure time; process the first frame information based on the first frame exposure time to provide a first image that includes a bright region representing the high reflectivity surface, surrounded by a dark background representing the low reflectivity surfaces; and process the second frame information based on the second frame exposure time to provide a second image that includes a dark background without a bright region.

According to an aspect of the disclosure, there is disclosed a method for generating image information based on data of a PDA comprising: receiving from a PDA first frame information of a low reflectivity target that includes a high reflectivity area, indicative of light intensities of different parts of the target detected by the PDA during a first frame exposure time; processing the first frame information based on the first frame exposure time to provide a first image that includes a bright region surrounded by a dark background; receiving from the PDA second frame information of the low reflectivity target that includes the high reflectivity area, indicative of light intensities of the different parts of the target detected by the PDA during a second frame exposure time that is longer than the first frame exposure time; and processing the second frame information based on the second frame exposure time to provide a second image that includes a dark background without a bright region.

According to an aspect of the disclosure, there is disclosed a non-transitory computer-readable medium for generating image information based on data of a PDA, including instructions stored thereon, that when executed on a processor, perform the steps of: receiving from a PDA first frame information of a black target that includes a white area, indicative of light intensities of different parts of the target detected by the PDA during a first frame exposure time; processing the first frame information based on the first frame exposure time to provide a first image that includes a bright region surrounded by a dark background; receiving from the PDA second frame information of the black target that includes the white area, indicative light intensities of the different parts of the target detected by the PDA during a second frame exposure time that is longer than the first frame exposure time; and processing the second frame information based on the second frame exposure time to provide a second image that includes a dark background without a bright region.

According to an aspect of the disclosure, there is disclosed an EO system with dynamic PS usability assessment, the system comprising: a PDA including a plurality of photosites (PS), each PS operative to output detection signals at different frames, the detection signal output for a frame by the respective PS being indicative of amount of light impinging on the respective PS during a respective frame; a usability filtering module, operative to determine for each PS that the PS is unusable based on a first frame exposure time, and to later determine that the PS is usable based on a second frame exposure time that is shorter than the first frame exposure time; and a processor operative to generate images based on frame detection levels of the plurality of PSs. The processor is configured to: (i) exclude, when generating a first image based on first frame detection levels, a first detection signal of a filtered PS that was determined by the usability filtering module as unusable for the first image, and (ii) include, when generating a second image based on second frame detection levels captured by the PDA after the capturing of the first frame detection levels, a second detection signal of the filtered PS that was determined by the usability filtering module as usable for the second image.

According to an aspect of the disclosure, there is disclosed a method for generating image information based on data of a PDA, comprising: receiving first frame information including for each out of a plurality of PSs of the PDA a first frame detection level indicative of an intensity of light detected by the respective PS during a first frame exposure time; based on the first frame exposure time, identifying out of the plurality of PSs of the PDD: a first group of usable PSs including a first PS, a second PS, and a third PS, and a first group of unusable PSs including a fourth PS; generating a first image based on the first frame detection levels of the first group of usable PSs, disregarding first frame detection levels of the first group of unusable PSs; determining, after receiving the first frame information, a second frame exposure time that is longer than the first frame exposure time; receiving second frame information including for each of the plurality of PSs of the PDA a second frame detection level indicative of an intensity of light detected by the respective PS during a second frame exposure time; based on the second frame exposure time, identifying out of the plurality of PSs of the PDD: a second group of usable PSs including the first PS, and a second group of unusable PSs including the second PS, and the third PS, and the fourth PS; (g) generating a second image based on the second frame detection levels of the second group of usable PSs, disregarding second frame detection levels of the second group of unusable PSs; determining, after receiving the second frame information, a third frame exposure time that is longer than the first frame exposure time and shorter than the second frame exposure time; receiving third frame information including for each of the plurality of PSs of the PDA a third frame detection level indicative of an intensity of light detected by the respective PS during a third frame exposure time; based on the third frame exposure time, identifying out of the plurality of PSs of the PDD: a third group of usable PSs including the first PS and the second PS, and a third group of unusable PSs including the third PS and the fourth PS; and (k) generating a third image based on the third frame detection levels of the third group of usable PSs, disregarding third frame detection levels of the third group of unusable PSs.

According to an aspect of the disclosure, there is disclosed a non-transitory computer-readable medium for generating image information based on data of a PDA, including instructions stored thereon, that when executed on a processor, perform the steps of: receiving first frame information including for each out of a plurality of PSs of the PDA a first frame detection level indicative of an intensity of light detected by the respective PS during a first frame exposure time; based on the first frame exposure time, identifying out of the plurality of PSs of the PDD: a first group of usable PSs including a first PS, a second PS, and a third PS, and a first group of unusable PSs including a fourth PS; generating a first image based on the first frame detection levels of the first group of usable PSs, disregarding first frame detection levels of the first group of unusable PSs; determining, after receiving the first frame information, a second frame exposure time that is longer than the first frame exposure time; receiving second frame information including for each of the plurality of PSs of the PDA a second frame detection level indicative of an intensity of light detected by the respective PS during a second frame exposure time; based on the second frame exposure time, identifying out of the plurality of PSs of the PDD: a second group of usable PSs including the first PS, and a second group of unusable PSs including the second PS, and the third PS, and the fourth PS; generating a second image based on the second frame detection levels of the second group of usable PSs, disregarding second frame detection levels of the second group of unusable PSs; determining, after receiving the second frame information, a third frame exposure time that is longer than the first frame exposure time and shorter than the second frame exposure time; receiving third frame information including for each of the plurality of PSs of the PDA a third frame detection level indicative of an intensity of light detected by the respective PS during a third frame exposure time; based on the third frame exposure time, identifying out of the plurality of PSs of the PDD: a third group of usable PSs including the first PS and the second PS, and a third group of unusable PSs including the third PS and the fourth PS; and generating a third image based on the third frame detection levels of the third group of usable PSs, disregarding third frame detection levels of the third group of unusable PSs.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure may be labeled with a same numeral in all the figures in which they appear. The drawings and descriptions are meant to illuminate and clarify embodiments disclosed herein, and should not be considered limiting in any way. All the drawings show devices or flow charts in accordance with examples of the presently disclosed subject matter. In the drawings:

FIG. 5 is a flowchart illustrating a method for generating SWIR images of objects in a FOV of an EO system;

FIG. 20 is a flow chart illustrating a method for compensating for dark current in a photodetector;

FIG. 21 is a flow chart illustrating a method for compensating for dark current in a photodetector;

FIG. 22 is a flow chart illustrating a method for testing a photodetector;

FIG. 24 illustrates an example of a method for generating image information based on data of a PDA;

FIG. 27 is a flow chart illustrating an example of a method for generating images based on different subsets of PSs in different operational conditions;

FIGS. 28A and 28B illustrate an EO system and exemplary target objects;

FIG. 29 is a flow chart illustrating a method for generating image information based on data of a PDA;

Figure 1A:
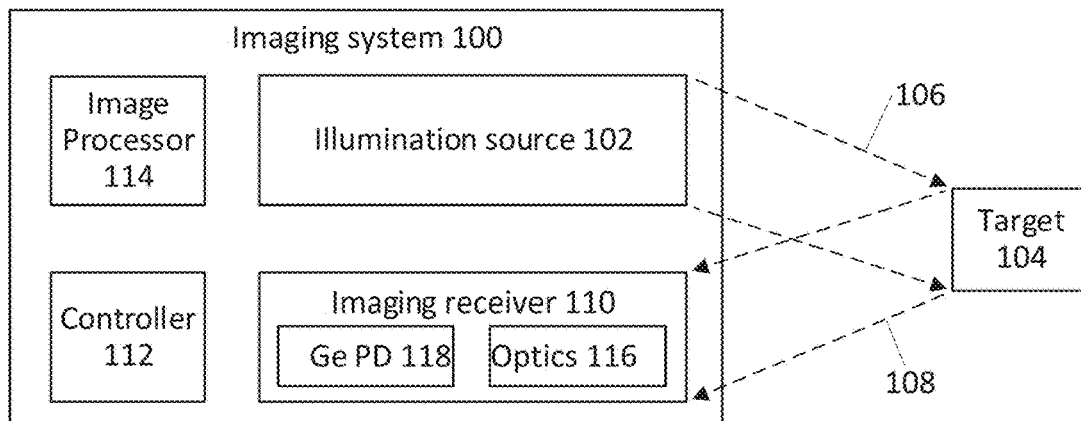
FIGS. 1A, 1B and 1C are schematic block diagrams illustrating active SWIR imaging systems.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS

In the following detailed description, numerous specific details are set forth to provide a thorough understanding of the disclosure. However, it will be understood by those skilled in the art that the present disclosure may be practiced without these specific details. In other instances, well-known methods, procedures, and components have not been described in detail so as not to obscure the present disclosure.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "processing", "calculating", "computing", "determining", "generating", "setting", "configuring", "selecting", "defining", or the like, include action and/or processes of a computer that manipulate and/or transform data into other data, said data represented as physical quantities, e.g. such as electronic quantities, and/or said data representing the physical objects.

The terms "computer", "processor", and "controller" should be expansively construed to cover any kind of electronic device with data processing capabilities, including, by way of non-limiting example, a personal computer, a server, a computing system, a communication device, a processor (e.g. digital signal processor (DSP), a microcontroller, a field programmable gate array (FPGA), an application specific integrated circuit, etc.), any other electronic computing device, and or any combination thereof.

The operations in accordance with the teachings herein may be performed by a computer specially constructed for the desired purposes or by a general purpose computer specially configured for the desired purpose by a computer program stored in a computer readable storage medium.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable subcombination.

In embodiments of the presently disclosed subject matter one or more stages or steps illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium or similar terms should be applied mutatis mutandis to a system capable of executing the instructions stored in the non-transitory computer readable medium and should be applied mutatis mutandis to method that may be executed by a computer that reads the instructions stored in the non-transitory computer readable medium.

Unless otherwise defined, all technical and scientific terms used herein have the same meaning as commonly understood by one of ordinary skill in the art to which this disclosure belongs. The materials, methods, and examples provided herein are illustrative only and not intended to be limiting.

Implementation of the method and system of the present disclosure involves performing or completing certain selected tasks or steps manually, automatically, or a combination thereof. Moreover, according to actual instrumentation and equipment of preferred embodiments of the method and system of the present disclosure, several selected steps could be implemented by hardware or by software on any operating system of any firmware or a combination thereof. For example, as hardware, selected steps of the disclosure could be implemented as a chip or a circuit. As software, selected steps of the disclosure could be implemented as a plurality of software instructions being executed by a computer using any suitable operating system. In any case, selected steps of the method and system of the disclosure could be described as being performed by a data processor, such as a computing platform for executing a plurality of instructions.

Figure 1B:
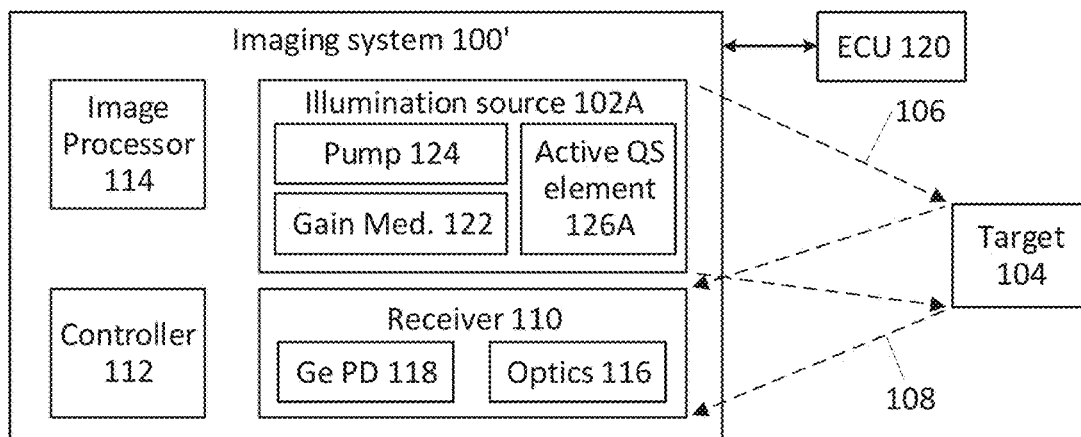
Figure 1C:
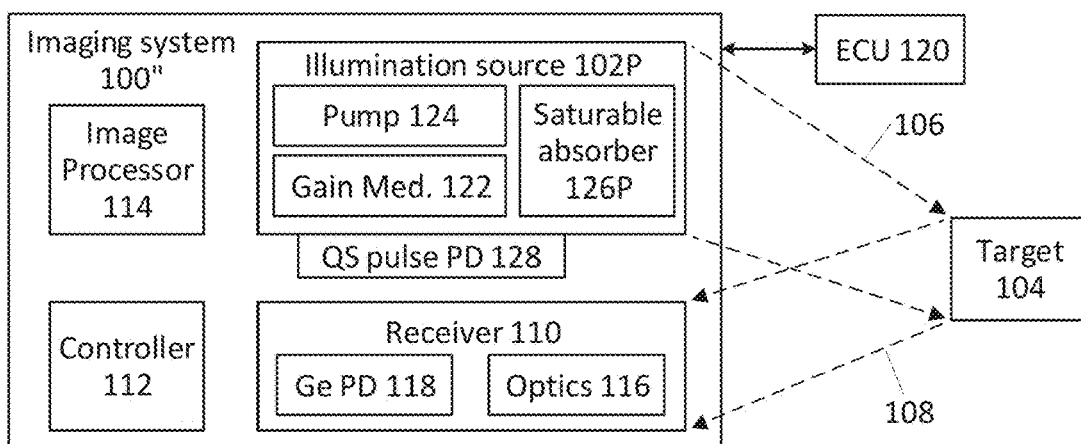

FIGS. 1A, 1B, and 1C are schematic block diagrams illustrating respectively active SWIR imaging systems 100, 100' and 100", in accordance with examples of the presently disclosed subject matter.

As used herein, an "active" imaging system is operative to detect light reaching the system from its field-of-view (FOV), detect it by an imaging receiver that includes a plurality of PDs, and process the detection signals to provide one or more images of the field of view or part thereof. The term "image" refers to a digital representation of a scene detected by the imaging system, which stores a color value for each picture element (pixel) in the image, each pixel color representing light arriving to the imaging system from a different part of the field-of-view (e.g., a 0.020 by 0.02° part of the FOV, depending on receiver optics). It is noted that optionally, the imaging system may be further operative to generate other representations of objects or light in the FOV (e.g., a depths map, 3D model, polygon mesh), but the term "image" refers to two-dimensional (2D) image with no depth data.

System 100 comprises an illumination source (IS) 102 operative to emit radiation pulses in the SWIR band towards one or more targets 104, resulting in reflected radiation from the target reflected back in the direction of system 100. In FIG. 1A, outgoing illumination is denoted 106 and illumination reflected toward system 100 is denoted 108. Parts of the emitted radiation may also be reflected in other directions, deflected, or absorbed by the target. The term "target" refers to any object in the FOV of the imaging sensor, such as solids, liquid, flexible, and rigid objects. Some non-limiting examples of such objects include vehicles, roads, people, animals, plants, buildings, electronics, clouds, microscopic samples, items during manufacturing, and so on. Any suitable type of illumination source 102 may be used, such as one or more lasers, one or more light emitting diodes (LEDs), one or more incidence flashlights, any combination of the above, and so on. As discussed below in greater detail, illumination source 102 may optionally include one or more active lasers, or one or more P-QS lasers.

System 100 also includes at least one imaging receiver (or simply "receiver") 110 that includes a plurality of Germanium (Ge) PDs operative to detect the reflected SWIR radiation. The receiver produces for each of the plurality of Ge PDs an electrical signal that is representative of the amount of impinging SWIR light within its detectable spectral range. That amount includes the amount of reflected SWIR radiation pulse light from the target, and may also include additional SWIR light (e.g., arriving from the sun or from external light sources).

The term "Ge PD" pertains to any PD in which light induced excitation of electrons (later detectable as a photocurrent) occurs within the Ge, within a Ge alloy (e.g., SiGe), or at the interface between Ge (or Ge alloy) and another material (e.g., silicon, SiGe). Specifically, the term "Ge PD" pertains both to pure Ge PDs and to Ge-silicon PDs. When Ge PDs which include both Ge and silicon are used, different concentration of geranium may be used. For example, the relative portion of Ge in the Ge PDs (whether alloyed with silicon or adjacent to it) may range from 5% to 99%. For example, the relative portion of Ge in the Ge PDs may be between 15% and 40%. It is noted that materials other than silicon may also be part of the Ge PD, such as aluminum, nickel, silicide, or any other suitable material. In some implementation of the disclosure, the Ge PDs may be pure Ge PDs (including more than 99.0% Ge).

It is noted that the receiver may be implemented as a PDA manufactured on a single chip. Any of the PD arrays discussed throughout the present disclosure may be used as receiver 110. The Ge PDs may be arranged in any suitable arrangement, such as a rectangular matrix (straight rows and straight columns of Ge PD), honeycomb tiling, and even irregular configurations. Preferably, the number of Ge PDs in the receiver allows generation of high-resolution image. For example, the number of PDs may be in the order of scale of 1 Megapixel, 10 Megapixel, or more.

In some embodiments, receiver 110 has the following specifications:
 a. HFOV (horizontal field of view) [m]: 60
 b. WD (working distance) [m]: 150
 c. Pixel Size [um]: 10
 d. Resolution (on Obj.) [mm]: 58
 e. Pixels #[H]: 1,050
 f. Pixels #[V]: 1112
 g. Aspect Ratio: 3:1
 h. View Angle [rad]: 0.4
 i. Reflectivity of the target [%]: 10%
 j. Collection (the ratio of collected photons to emitted photons assuming target reflectivity of 100% and assuming Lambertian reflectance): $3e^{-9}$.

In addition to the impinging SWIR light as discussed above, the electrical signal produced by each of the Ge PDs is also representative of:
 a. Readout noise, which is random, and its magnitude is independent (or substantially independent) on the integration time. Example of such noise includes Nyquist Johnson noise (also referred to as thermal noise or kTC noise). The readout process may also introduce a DC component to the signal, in addition to the statistical component, but the term "readout noise" pertains to the random component of the signal introduced by the readout process.
 b. Dark current noise, which is random and accumulating over the integration time (i.e., it is integration-time dependent). The dark current also introduces in addition to the statistical component a DC component to the signal (which may or may not be eliminated, e.g., as discussed with respect to FIGS. 12A through 22), but the term "dark current noise" pertains to the random component of the signal accumulated over the integration time resulting from the dark current.

Some Ge PDs, and especially some PDs that combine Ge with another material (such as silicon, for example) are characterized by a relatively high level of dark current. For example, the dark current of Ge PDs may be larger than 50 $\mu A/cm^2$ (pertaining to a surface area of the PD) and even larger (e.g., larger than 100 $\mu A/cm^2$, larger than 200 $\mu A/cm^2$, or larger than 500 $\mu A/cm^2$). Depending on the surface area of the PD, such levels of dark current may be translated to 50 picoampere (pA) per Ge PD or more (e.g., more than 100 pA per Ge PD, more than 200 pA per Ge PD, more than 500 pA per Ge PD, or more than 2 nA per Ge PD). It is noted that different sizes of PDs may be used, such as about 10 $mm^2$, about 50 $mm^2$, about 100 $mm^2$, about 500 $mm^2$). It is noted that different magnitudes of dark current may be generated by the Ge PDs when the Ge PDs are subject to different levels of nonzero bias (which induce on each of the plurality of Ge PDs a dark current that is, for example, larger than 50 picoampere).

System 100 further comprises a controller 112, which controls operation of receiver 110 (and optionally also of illumination source (IS) 102 and/or other components) and an image processor 114. Controller 112 is therefore configured to control activation of receiver 110 for a relatively short integration time, such that to limit the effect of accumulation of dark current noise on the quality of the signal. For example, controller 112 may be operative to control activation of receiver 110 for an integration time during which the accumulated dark current noise does not exceed the integration-time independent readout noise.

Figure 2:
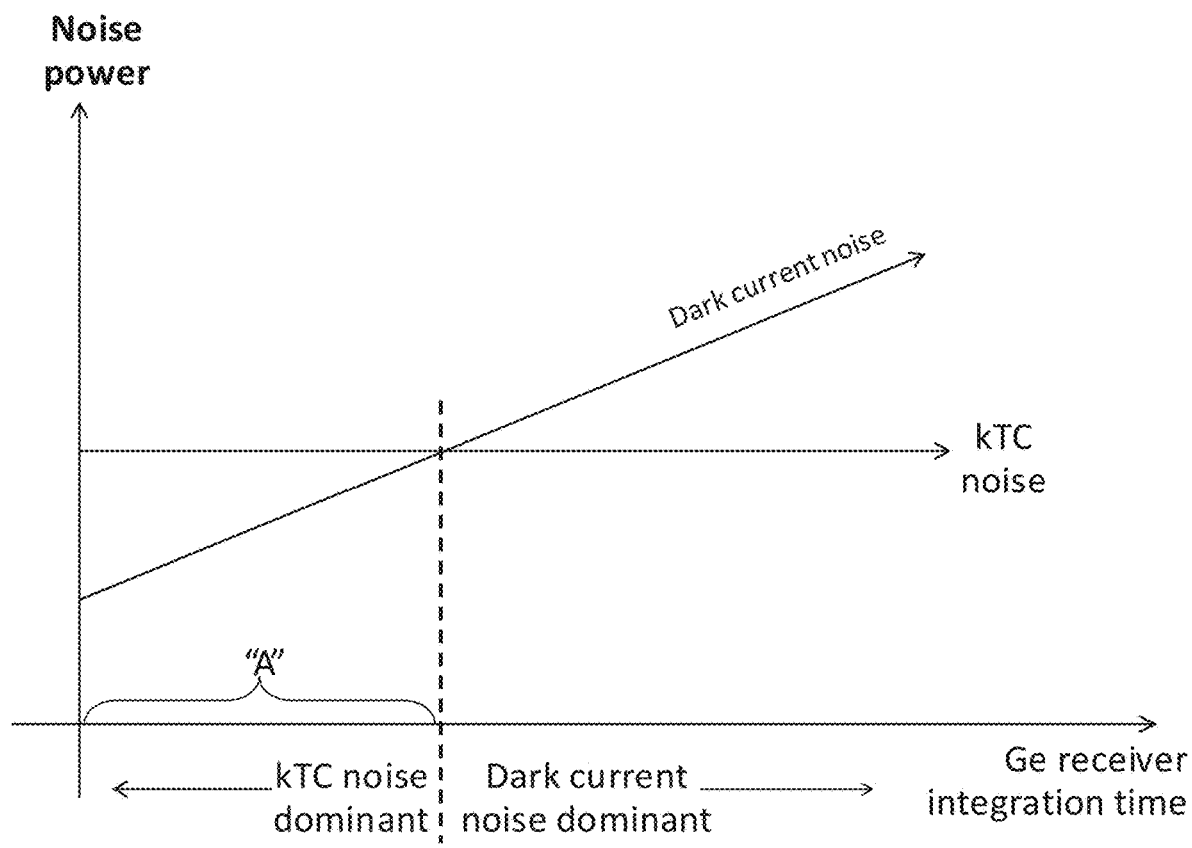
FIG. 2 is an exemplary graph illustrating relative magnitudes of noise power after different durations of integration times in a SWIR imaging system.

Refer now to FIG. 2, which is an exemplary graph illustrating relative magnitudes of noise power after different durations of integration times, in accordance with examples of the presently disclosed subject matter. For a given laser pulse energy, the signal to noise ratio (SNR) is mostly dictated by the noise level that includes the dark current noise (noise of the dark photocurrent) and thermal noise (also referred to as kTC noise). As shown in the exemplary graph of FIG. 2, either of the dark current noise or the thermal noise are dominant in effecting the SNR of the electric signal of the PD, depending on the integration time of Ge-based receiver 110. Since controller 112 limits the activation time of the Ge photodetector for a relatively short time (within the range designated as "A" in FIG. 2), not many electrons originating from dark current noise are collected and the SNR is therefore improved and is thus affected mainly by the thermal noise. For a longer receiver integration time, the noise originating from the dark current of the Ge photodetector becomes dominant over the thermal noise in affecting the receiver SNR, resulting in degraded receiver performance. It is noted that the graph of FIG. 2 is merely illustrative, and that accumulation of dark current noise over time is usually increasing with the square root of the time $E_{noise} \propto \sqrt{T_{integration}}$. (alternatively, consider the y-axis as drawn on a matching non-linear polynomial scale). Also, the axes do not cross each other at zero integration time (in which case the accumulated dark current noise is zero).

Reverting to system 100, it is noted that controller 112 may control activation of receiver 110 for even shorter integration times (e.g., integration times during which the accumulated dark current noise does not exceed half of the readout noise, or a quarter of the readout noise). It is noted that unless specifically desired, limiting the integration time to very low levels limits the amount of light induced signals which may be detected, and worsens the SNR with respect to the thermal noise. It is noted that the level of thermal noise in readout circuitries suitable for reading of noisy signals (which require collection of relatively high signal level) introduces non-negligible readout noise, which may significantly deteriorate the SNR.

In some implementations, somewhat longer integration times may be applied by controller 112 (e.g., integration times during which the accumulated dark current noise does not exceed twice the readout noise, or ×1.5 of the readout noise).

Exemplary embodiments disclosed herein relate to systems and methods for high SNR active SWIR imaging using receivers including Ge based PDs. The major advantage of Ge receiver technology vs. InGaAs technology is the compatibility with CMOS processes, allowing manufacture of the receiver as part of a CMOS production line. For example, Ge PDs can be integrated into CMOS processes by growing Ge epilayers on a silicon (Si) substrate, such as in Si photonics. Ge PDs are also therefore more cost effective than equivalent InGaAs PDs.

To utilize Ge PDs, an exemplary system disclosed herein is adapted to overcome the limitation of the relatively high dark current of Ge diodes, typically in the ~50 uA/cm^2 range. The dark-current issue is overcome by use of active imaging having a combination of short capture time and high-power laser pulses.

The utilization of Ge PDs—especially but not limited to ones which are fabricated using CMOS processes—is a much cheaper solution for uncooled SWIR imaging than InGaAs technology. Unlike many prior art imaging systems, active imaging system 100 includes a pulsed illumination source with a short illumination duration (for example, below 1 μS, e.g., 1-1000 μS) and high peak power. This despite the drawbacks of such pulsed light sources (e.g. illumination non-uniformity, more complex readout circuitry which may introduce higher levels of readout noise) and the drawbacks of shorter integration time (e.g., the inability to capture a wide range of distances at a single acquisition cycle). In the following description, several ways are discussed for overcoming such drawbacks to provide effective imaging systems.

Reference is now made to FIGS. 1B and 1C that illustrate schematically other SWIR imaging systems according to some embodiments and numbered 100' and 100". Like system 100, system 100' comprises an active illumination source 102A and receiver 110. In some embodiments, imaging systems 100, 100' and 100" further comprise controller 112 and image processor 114. In some embodiments, processing of the output of receiver 110 may be performed by image processor 114 and additionally or alternatively by an external image processor (not shown). Imaging systems 100' and 100" may be variations of imaging system 100. Any component or functionality discussed with respect to system 100 may be implemented in any of systems 100' and 100", and vice versa.

Controller 112 is a computing device. In some embodiments, the functions of controller 112 are provided within illumination source 102 and receiver 110, and controller 112 is not required as a separate component. In some embodiments, the control of imaging systems 100' and 100" is performed by controller 112, illumination source 102 and receiver 110 acting together. Additionally or alternatively, in some embodiments, control of imaging systems 100' and 100" may be performed (or performed supplementally) by an external controller such as a vehicle Electronic Control Unit (ECU) 120 (which may belong to a vehicle in which the imaging system is installed).

Illumination source 102 is configured to emit a light pulse 106 in the infrared (IR) region of the electromagnetic spectrum. More particularly, light pulse 106 is in the SWIR spectral band including wavelengths in a range from approximately 1.3 μm to 3.0 μm.

In some embodiments, such as shown in FIG. 1B, the illumination source (now marked 102A) is an active Q-switch laser (or "actively Q-switched" laser) that includes a gain medium 122, a pump 124, mirrors (not shown) and an active QS element 126A. In some embodiments, QS element 126A is a modulator. Following electronic or optical pumping of the gain medium 122 by pump 124, a light pulse is released by active triggering of QS element 126A.

In some embodiments, such as shown in FIG. 1C, illumination source 102P is a P-QS laser including gain medium 122, pump 124, mirrors (not shown) and a SA 126P. SA 126P allows the laser cavity to store light energy (from pumping of gain medium 122 by pump 124) until a saturated level is reached in SA 126P, after which a "passive QS" light pulse is released. To detect the release of the passive QS pulse, a QS pulse photodetector 128 is coupled to illumination source 102P. In some embodiments, QS pulse photodetector 128 is a Ge PD. The signal from QS pulse photodetector 128 is used to trigger the receive process in receiver 110 such that receiver 110 will be activated after a time period suitable for target 104 distance to be imaged. The time period is derived as described further below with reference to FIGS. 3B, 3C, 4B and 4C.

In some embodiments, the laser pulse duration from illumination source 102 is in the range from 100 ps to 1 microsecond. In some embodiments, laser pulse energy is in the range from 10 microjoules to 100 millijoule. In some embodiments, the laser pulse period is of the order of 100 microseconds. In some embodiments, the laser pulse period is in a range from 1 microsecond to 100 milliseconds.

Gain medium 122 is provided in the form of a crystal or alternatively in a ceramic form. Non-limiting examples of materials that can be used for gain medium 122 include: Nd:YAG, Nd:YVO4, Nd:YLF, Nd:Glass, Nd:GdVO4, Nd:GGG, Nd:KGW, Nd:KYW, Nd:YALO, Nd:YAP, Nd:LSB, Nd:S-FAP, Nd:Cr:GSGG, Nd:Cr:YSGG, Nd:YSAG, Nd:Y2O3, Nd:Sc2O3, Er:Glass, Er:YAG, and so forth. In some embodiments, doping levels of the gain medium can be varied based on the need for a specific gain. Non-limiting examples of SAs 126P include: Co2+:MgAl2O4, Co2+:Spinel, Co2+:ZnSe and other cobalt-doped crystals, V3+:YAG, doped glasses, quantum dots, semiconductor SA mirror (SESAM), Cr4+YAG SA and so forth. Additional ways in which P-QS laser 102P may be implemented are discussed below with respect to FIG. 6 through 11, and any variations discussed with respect to a laser 600 may be implemented also for illumination source 102P, mutatis mutandis.

Referring to illumination source 102, it is noted that pulsed lasers with sufficient power and sufficiently short pulses are more difficult to attain and more expensive than non-pulsed illumination, especially when eye-safe SWIR radiation in solar absorption based is required.

Receiver 110 may include one or more Ge PDs 118 and receiver optics 116. In some embodiments, receiver 110 includes a 2D array of Ge PDs 118. Receiver 110 is selected to be sensitive to infrared radiation, including at least the wavelengths transmitted by illumination source 102, such that the receiver may form imagery of the illuminated target 104 from reflected radiation 108.

Receiver optics 116 may include one or more optical elements, such as mirrors or lenses that are arranged to collect, concentrate and optionally filter the reflected electromagnetic radiation 228, and focus the electromagnetic radiation onto a focal plane of receiver 110.

Receiver 110 produces electrical signals in response to electromagnetic radiation detected by one or more of Ge PD 118 representative of imagery of the illuminated scene. Signals detected by receiver 110 can be transferred to internal image processor 114 or to an external image processor (not shown) for processing into a SWIR image of the target 104. In some embodiments, receiver 110 is activated multiple times to create "time slices" each covering a specific distance range. In some embodiments, image processor 114 combines these slices to create a single image with greater visual depth such as proposed by Gruber, Tobias, et al. "Gated2depth: Real-time dense LIDAR from gated images." arXiv preprint arXiv:1902.04997 (2019), which is incorporated herein by reference in its entirety.

In the automotive field, the image of target 104 within the field of view (FOV) of receiver 110 generated by imaging systems 100' or 100" may be processed to provide various driver assistance and safety features, such as: forward collision warning (FCW), lane departure warning (LDW), traffic sign recognition (TSR), and the detection of relevant entities such as pedestrians or oncoming vehicles. The generated image may also be displayed to the driver, for example projected on a head-up display (HUD) on the vehicle windshield. Additionally or alternatively imaging systems 100' or 100" may interface to a vehicle ECU 120 for providing images or video to enable autonomous driving at low light levels or in poor visibility conditions.

In active imaging scenarios, a light source, e.g. laser, is used in combination with an array of photoreceivers. Since the Ge PD operates in the SWIR band, high power light pulses are feasible without exceeding eye safety regulations. For implementations in automotive scenarios, a typical pulse length is ~100 ns, although, in some embodiments, longer pulse durations of up to about 1 microsecond are also anticipated. Considering eye safety, a peak pulse power of ~300 KW is allowable, but this level cannot practically be achieved by current laser diodes. In the present system the high-power pulses are therefore generated by a QS laser. In some embodiments, the laser is a P-QS laser to further reduce costs. In some embodiments, the laser is actively QS.

As used herein the term "target" refers to any of an imaged entity, object, area, or scene. Non-limiting examples of targets in automotive applications include vehicles, pedestrians, physical barriers or other objects.

According to some embodiments, an active imaging system includes: an illumination source for emitting a radiation pulse towards a target resulting in reflected radiation from the target, wherein the illumination source includes a QS laser; and a receiver including one or more Ge PDs for receiving the reflected radiation. In some embodiments, the illumination source operates in the SWIR spectral band.

In some embodiments, the QS laser is an active QS laser. In some embodiments, the QS laser is a P-QS laser. In some embodiments, the P-QS laser includes a SA. In some embodiments, the SA is selected from the group consisting of: Co2+:MgAl2O4, Co2+:Spinel, Co2+:ZnSe and other cobalt-doped crystals, V3+:YAG, doped glasses, quantum dots, semiconductor SA mirror (SESAM), and Cr4+YAG SA.

In some embodiments, the system further includes a QS pulse photodetector for detecting of a radiation pulse emitted by the P-QS laser. In some embodiments, the receiver is configured to be activated at a time sufficient for the radiation pulse to travel to a target and return to the receiver. In some embodiments, the receiver is activated for an integration time during which the dark current power of the Ge PD does not exceed the kTC noise power of the Ge PD.

In some embodiments, the receiver produces electrical signals in response to the reflected radiation received by the Ge PDs, wherein the electrical signals are representative of imagery of the target illuminated by the radiation pulse. In some embodiments, the electrical signals are processed by one of an internal image processor or an external image processor into an image of the target. In some embodiments, the image of the target is processed to provide one or more of forward collision warning, lane departure warning, traffic sign recognition, and detection of pedestrians or oncoming vehicles.

According to further embodiments, a method for performing active imaging comprises: releasing a light pulse by an illumination source comprising an active QS laser; and after a time sufficient for the light pulse to travel to a target and return to the QS laser, activating a receiver comprising one or more Ge PDs for a limited time period for receiving a reflected light pulse reflected from the target. In some embodiments, the illumination source operates in the shortwave infrared (SWIR) spectral band. In some embodiments, the limited time period is equivalent to an integration time during which a dark current power of the Ge PD does not exceed a kTC noise power of the Ge PD.

In some embodiments, the receiver produces electrical signals in response to the reflected light pulse received by the Ge PDs wherein the electrical signals are representative of imagery of the target illuminated by the light pulse. In some embodiments, the electrical signals are processed by one of an internal image processor or an external image processor into an image of the target. In some embodiments, the image of the target is processed to provide one or more of forward collision warning, lane departure warning, traffic sign recognition, and detection of pedestrians or oncoming vehicles.

According to further embodiments, a method for performing active imaging comprises: pumping a P-QS laser comprising a SA to cause release of a light pulse when the SA is saturated; detecting the release of the light pulse by a QS pulse photodetector; and after a time sufficient for the light pulse to travel to a target and return to the QS laser based on the detected light pulse release, activating a receiver comprising one or more Ge PDs for a limited time period for receiving the reflected light pulse. In some embodiments, the QS laser operates in the shortwave infrared (SWIR) spectral band.

In some embodiments, the SA is selected from the group consisting of Co2+:MgAl2O4, Co2+:Spinel, Co2+:ZnSe, other cobalt-doped crystals, V3+:YAG, doped glasses, quantum dots, semiconductor SA mirror (SESAM) and Cr4+ YAG SA. In some embodiments, the limited time period is equivalent to an integration time during which the dark current power of the Ge PD does not exceed the kTC noise power of the Ge PD.

In some embodiments, the receiver produces electrical signals in response to the reflected light pulse received by the Ge PDs wherein the electrical signals are representative of imagery of the target illuminated by the light pulse. In some embodiments, the electrical signals are processed by one of an internal image processor or an external image processor into an image of the target. In some embodiments, the image of the target is processed to provide one or more of forward collision warning, lane departure warning, traffic sign recognition, and detection of pedestrians or oncoming vehicles.

Exemplary embodiments relate to a system and method for high SNR active SWIR imaging using Ge based PDs. In some embodiments, the imaging system is a gated imaging system. In some embodiments, the pulsed illumination source is an active or P-QS laser.

Figure 3A:
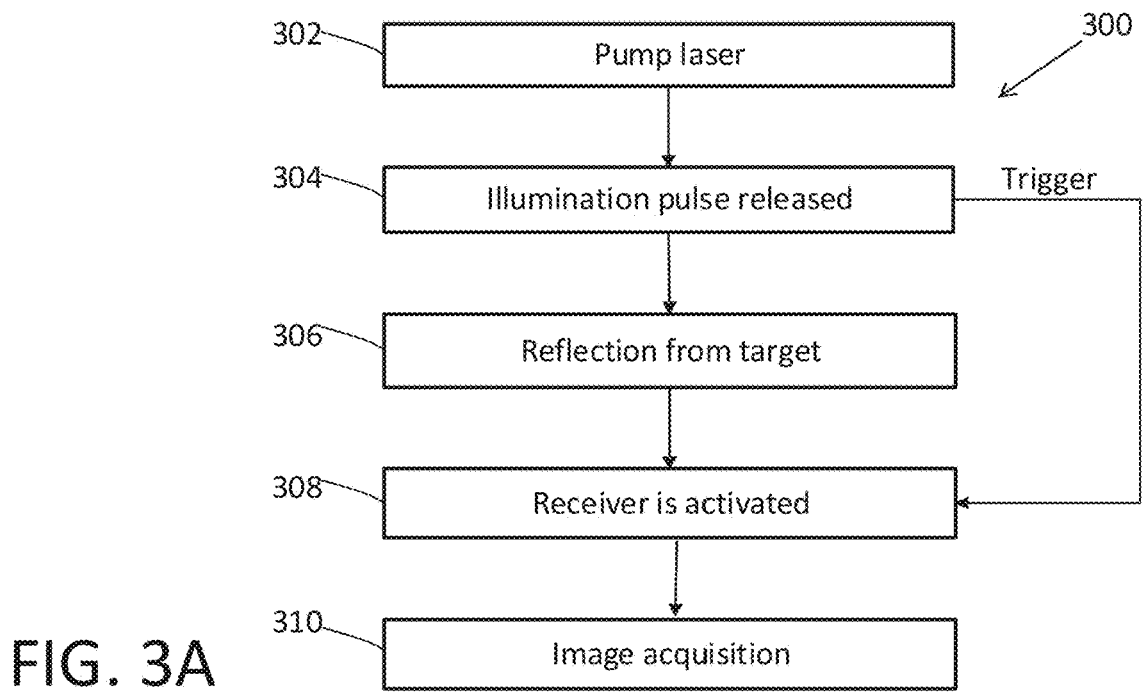
FIGS. 3A, 3B and 3C show respectively a flowchart and schematic drawings of a method of operation of an active SWIR imaging system according to some embodiments.
Figure 3B:
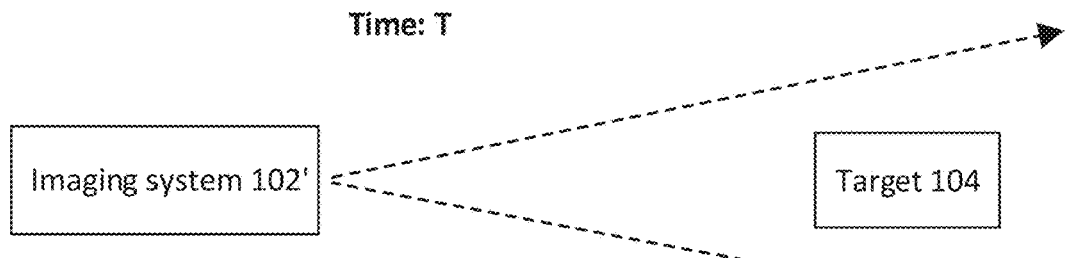
Figure 3C:
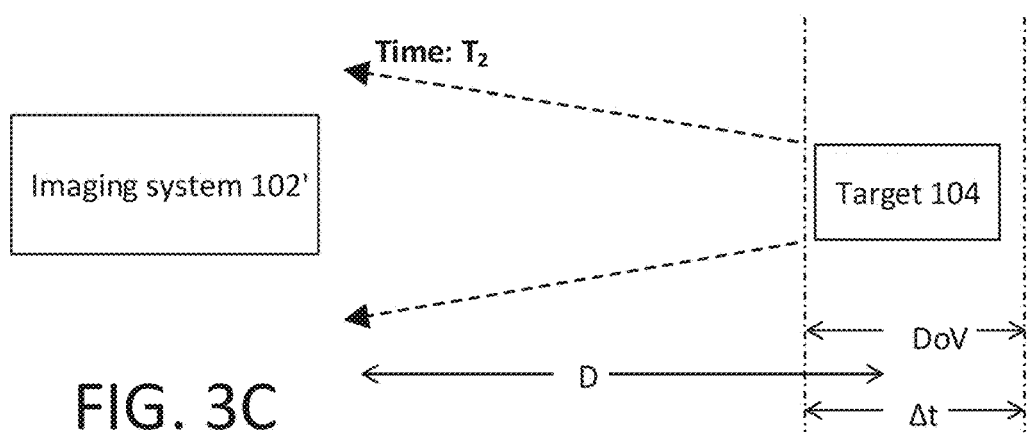

Reference is now made to FIGS. 3A, 3B and 3C that show, respectively, a flowchart and schematic drawings of a method of operation of an active SWIR imaging system according to some embodiments. Process 300 shown in FIG. 3A is based on system 100' as described with reference to FIG. 1B. In step 302, pump 124 of illumination source 102A is activated to pump gain medium 122. In step 304, active QS element 126A releases a light pulse in the direction of a target 104 that is at a distance of D. In step 306, at Time=T, the light pulse strikes target 104 and generates reflected radiation back towards system 100' and receiver 110. In step 308, after waiting a time=T2, receiver 110 is activated to receive the reflected radiation. The return propagation delay T2 consists of the flight time of the pulse from illumination source 102A to target 104 plus the flight time of the optical signal reflected from target 104. T2 is therefore known for a target 104 at a distance "D" from the illumination source 102A and receiver 110. The activation period of receiver 110 $\Delta t$ is determined based on the required depth of view (DoV). The DoV is given by $2DoV=c*\Delta t$ where c is the speed of light. A typical $\Delta t$ of 100 ns provides a depth of view of 15 meters. In step 310, the reflected radiation is received by receiver 110 for a period of $\Delta t$. The received data from receiver 110 is processed by image processor 114 (or an external image processor) to generate a received image. Process 300 can be repeated N times in each frame, where a frame is defined as the data set transferred from receiver 110 to image processor 114 (or to an external image processor). In some embodiments, N is between 1 and 10,000.

Figure 4A:
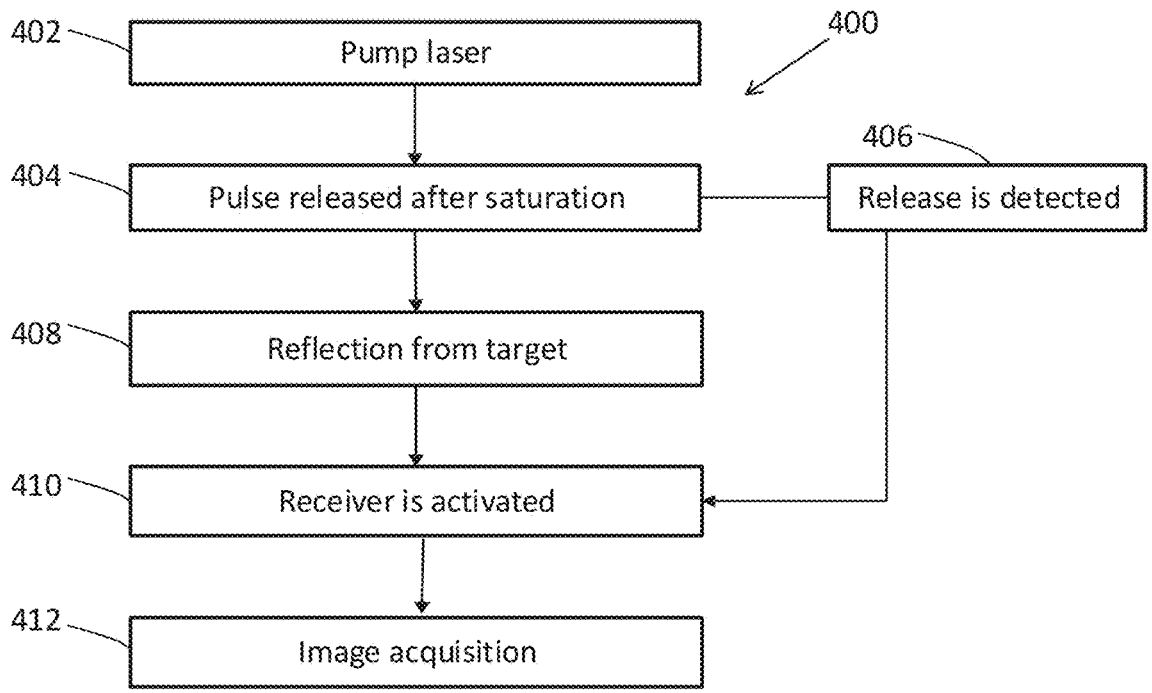
FIGS. 4A, 4B and 4C show respectively a flowchart and schematic drawings of an exemplary method of operation of an active SWIR imaging system.
Figure 4B:
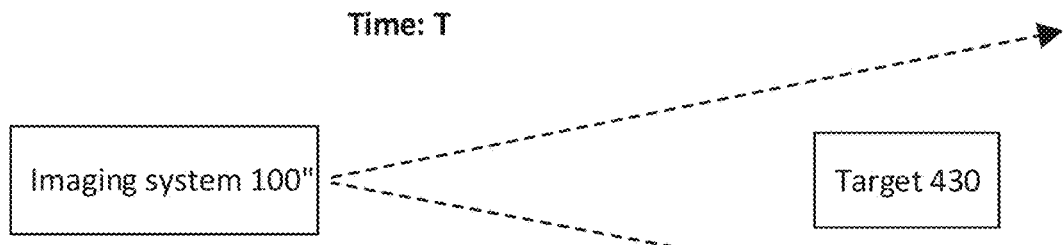
Figure 4C:
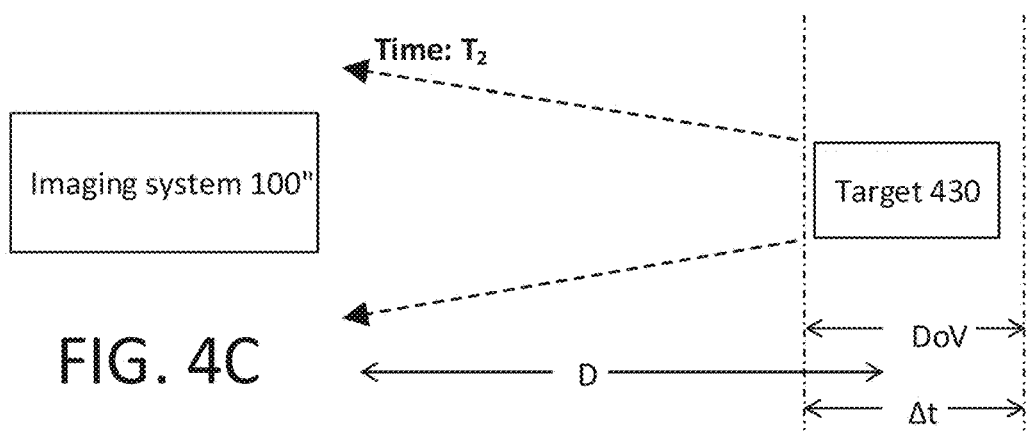
Figure 6:
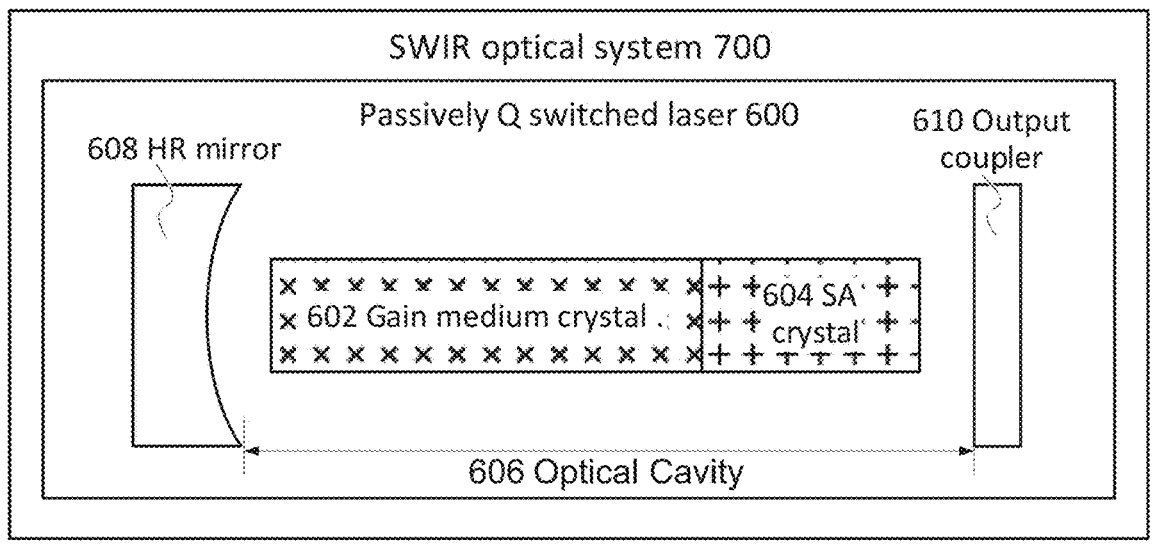
FIG. 6 is a schematic functional block diagram illustrating an example of a SWIR optical system.

Reference is now made to FIGS. 4A, 4B and 4C that show, respectively, a flowchart and schematic drawings of an exemplary method of operation of an active SWIR imaging system according to some embodiments. A process 400 shown in FIG. 4A is based on system 100" as described with reference to FIG. 1C. In step 402, pump 124 of illumination source 102P is activated to pump gain medium 122 and to saturate SA 126P. In step 404, after reaching a saturation level, SA 126P releases a light pulse in the direction of a target 430 at a distance of D. In step 406, QS pulse photodetector 128 detects the released light pulse. In step 408, at Time=T, the light pulse strikes target 430 and generates reflected radiation back towards system 100" and receiver 110. In step 410, after waiting a time=T2 following the detection of a released light pulse by QS pulse photodetector 128, receiver 110 is activated to receive the reflected radiation. The return propagation delay T2 comprises the flight time of the pulse from illumination source 102P to target 430 plus the flight time of the optical signal reflected from target 430. T2 is therefore known for a target 430 at a distance "D" from the illumination source 102P and receiver 110. The activation period of $\Delta t$ is determined based on the required depth of view (DoV). In step 412, the reflected radiation is received by receiver 110 for a period of $\Delta t$. The received data from receiver 110 is processed by image processor 114 (or by an external image processor) to generate a received image. Process 400 can be repeated N times in each frame. In some embodiments, N is between 1 and 10,000.

Referring to all of imaging systems 100, 100' and 100", it is noted that any one of those imaging systems may include readout circuitry for reading out, after the integration time, an accumulation of charge collected by each of the Ge PDs, to provide the detection signal for the respective PD. That it, unlike LIDARs or other depth sensors, the reading out process may be executed after the concussion of the integration time and therefore after the signal from a wide range of distances as irreversibly summed.

Referring to all of imaging systems 100, 100' and 100", optionally receiver 110 outputs a set of detection signals representative of the charge accumulated by each of the plurality of Ge PDs over the integration time, wherein the set of detection signals is representative of imagery of the target as illuminated by at least one SWIR radiation pulse.

Referring to all of imaging systems 100, 100' and 100", the imaging system may optionally at least one diffractive optics element (DOE) operative to improve illumination uniformity of light of the pulsed illumination source before the emission of light towards the target. As aforementioned, a high peak power pulsed light source 102 may issue an insufficiently uniform illumination distribution over different parts of the FOV. The DOE (not illustrated) may improve uniformity of the illumination to generate high quality images of the FOV. It is noted that equivalent illumination uniformity is usually not required in LIDAR systems and other depth sensors, which may therefore not include DOE elements for reasons of cost, system complexity, system volume, and so on. In LIDAR systems, for example, as long as the entire FOV receive sufficient illumination (above a threshold which allows detection of target at a minimal required distance), it does not matter if some areas in the FOV receive substantially more illumination density than other parts of the FOV. The DOE of system 100, if implemented, may be used for example for reducing speckle effects. It is noted that imaging systems 100, 100' and 100" may also include other types of optics for directing light from light source 102 to the FOV, such as lenses, mirrors, prisms, waveguides, etc.

Referring to all of imaging systems 100, 100' and 100", controller 112 may optionally be operative to activate receiver 110 to sequentially acquire a series of gated images, each representative of the detection signals of the different Ge PDs at a different distance range, and an image processor operative to combine the series of image into a single two dimensional image. For example, a first image may acquire light between 0-50 m, a second image may acquire light between 50-100 m and a third image may acquire light between 100-125 m from the imaging sensor, and image processor 114 may combine the plurality of 2D images to a single 2D images. This way, each distance range is captured with accumulated dark current noise that is still lesser than the readout noise introduced by the readout circuitry, in the expense of using more light pulses and more computation. The color value for each pixel of the final image (e.g., grayscale value) may be determined as a function of the respective pixels in the gated images (e.g., a maximum of all values, or a weighted average).

Referring to all of imaging systems 100, 100' and 100", the imaging system may be an uncooled Ge-based SWIR imaging system, operative to detect a 1 m×1 m target with a SWIR reflectivity (at the relevant spectral range) of 20% at a distance of more than 50 m.

Referring to all of imaging systems 100, 100' and 100", pulsed illumination source 102 may be a QS laser operative to emit eye safe laser pulses having pulse energy between 10 millijoule and 100 millijoule. While not necessarily so, the illumination wavelength may be selected to match a solar absorption band (e.g., the illumination wavelength may be between 1.3 µm and 1.4 µm.

Referring to all of imaging systems 100, 100' and 100", the output signal by each Ge PD used for image generation may be representative of a single scalar for each PD. Referring to all of imaging systems 100, 100' and 100", each PD may output an accumulated signal that is representative of a wide range of distances. For example, some, most, or all of the Ge PDs of receiver 110 may output detection signals which are representative each of light reflected to the respective PD from 20 m, from 40 m and from 60 m.

Further distinguishing feature of imaging systems 100, 100' and 100" over many known art systems is that the pulsed illumination is not used to freeze fast motion of objects in the field (unlike photography flash illumination, for example) and is used the same for static scenes. Yet another distinguishing feature of imaging systems 100, 100' and 100" over many known art systems is that the gating of the image is not used primarily to avoid internal noise in the system, in comparison to external noise, which is a nuisance for some known art (e.g., sunlight).

It is noted that any one of the components, features, modes of operation, system architectures and internal relationships discussed above with respect to systems 100, 100' and 100" may be implemented, mutatis mutandis, in any of the EO systems discussed below, such as systems 700, 1300, 1300', 1600, 1600', 1700, 1800, 1900, 2300 and 3600.

FIG. 5 is a flowchart illustrating a method 500 for generating SWIR images of objects in a FOV of an EO system, in accordance with examples of the presently disclosed subject matter. Referring to the examples set forth with respect to the previous drawings, method 500 may be executed by any one of imaging systems 100, 100' and 100". It is noted that method 500 may also be implemented by any active imaging system described below (such as systems 700, 1300, 1300', 1600, 1600', 1700, 1800, 1900, 2300 and 3600).

Method 500 starts with a step (or "stage") 510 of emitting at least one illumination pulse toward the FOV, resulting in SWIR radiation reflecting from at least one target. Hereinafter, "step" and "stage" are used interchangeably. Optionally, the one or more pulses may be high peak power pulse. Utilization of multiple illumination pulses may be required, for example, to achieve an overall higher level of illumination when compared to a single pulse. Referring to the examples of the accompanying drawings, step 510 may optionally be carried out by controller 112.

A step 520 includes triggering initiation of continuous signal acquisition by an imaging receiver that includes a plurality of Ge PDs (in the sense discussed above with respect to receiver 110) which is operative to detect the reflected SWIR radiation. The continuous signal acquisition of step 520 means that the charge is collected continuously and irreversibly (i.e., it is impossible to learn what level of charge was collected in any intermediate time), and not in small increments. The triggering of step 520 may be executed before step 510 (for example, if the detection array requires a ramp up time), concurrently with step 510, or after step 510 concluded (e.g., to start detecting at a nonzero distance from the system). Referring to the examples of the accompanying drawings, step 520 may optionally be carried out by controller 112.

A step 530 starts after the triggering of step 520 and includes collecting for each of the plurality of Ge PDs, as a result of the triggering, charge resulting from at least the impinging of the SWIR reflection radiation on the respective Ge PD, dark current that is larger than 50 µA/cm$^2$, integration-time dependent dark current noise, and integration-time independent readout noise. Referring to the examples of the accompanying drawings, step 530 may optionally be carried out by receiver 110.

A step 540 includes triggering ceasing of the collection of the charge when the amount of charge collected as a result of dark current noise is still lower than the amount of charge collected as a result of the integration-time independent readout noise. The integration time is the duration of step 530 until the ceasing of step 540. Referring to the examples of the accompanying drawings, step 540 may optionally be carried out by controller 112.

A step 560 is executed after step 540 is concluded, and it includes generating an image of the FOV based on the levels of charge collected by each of the plurality of Ge PDs. As aforementioned with respect to imaging systems 100, 100' and 100", the image generated in step 560 is a 2D image with no depth information. Referring to the examples of the accompanying drawings, step 560 may optionally be carried out by imaging processor 114.

Optionally, the ceasing of the collection as a result of step 540 may be followed by optional step 550 reading by readout circuitry a signal correlated to the amount of charge collected by each of the Ge PDs, amplifying the read signal, and providing the amplified signals (optionally after further processing) to an image processor that carries out the generation of the image as step 560. Referring to the examples of the accompanying drawings, step 550 may optionally be carried out by the readout circuitry (not illustrated above, but may be equivalent to any of the readout circuitries discussed below, such as readout circuitry 1610, 2318 and 3630). It is noted that step 550 is optional because other suitable methods of reading out the detection results from the Ge PSs may be implemented.

Optionally, the signal output by each out of multiple Ge PDs is a scalar indicative of amount of light reflected from 20 m, light reflected from 40 m and light reflected from 60 m.

Optionally, the generating of step 560 may include generating the image based on a scalar value read for each of the plurality of Ge PDs. Optionally, the emitting of step 510 may include increasing illumination uniformity of pulsed laser illumination by passing the pulsed laser illumination (by one or more lasers) through at least one diffractive optics element (DOE), and emitting the detracted light to the FOV. Optionally, the dark current is greater than 50 picoampere per Ge PD. Optionally, the Ge PDs are Si—Ge PDs, each including both Silicon and Ge. Optionally, the emitting is carried out by at least one active QS laser. Optionally, the emitting is carried out by at least one P-QS laser. Optionally, the collecting is executed when the receiver is operating at a temperature higher than 30° C., and processing the image of the FOV to detect a plurality of vehicles and a plurality of pedestrians at a plurality of ranges between 50 m and 150 m. optionally, the emitting includes emitting a plurality of the illumination pulses having pulse energy between 10 millijoule and 100 millijoule into an unprotected eye of a person at a distance of less than 1 m without damaging the eye.

As aforementioned with respect to active imaging systems 100, 100' and 100", several gated images may be combined to a single image. Optionally, method 500 may include repeating multiple times the sequence of emitting, triggering, collecting and ceasing; triggering the acquisition at a different time from the emitting of light at every sequence. At each sequence method 500 may include reading from the receiver a detection value for each of the Ge PDs corresponding to a different distance range that is wider than 2 m (e.g., 2.1 m, 5 m, 10 m, 25 m, 50 m, 100 m). The generating of the image in step 560 in such a case includes generating a single two-dimensional image based on the detection values read from the different Ge PDs at the different sequences. It is noted that since only several images are taken, the gated images are not sparse (i.e. in all or most of them, there are detection values for many of the pixels). It is also noted that the gated images may have overlapping distance ranges. For example, a first image may represent the distances range 0-60 m, a second image may represent the distances range 50-100 m, and a third image may represent the distances range 90-120 m.

FIGS. 6 through 11C demonstrate SWIR electro-optical (EO) systems and P-QS lasers which may be used in such systems, as well as methods for operation and manufacturing of such lasers.

Figure 10:
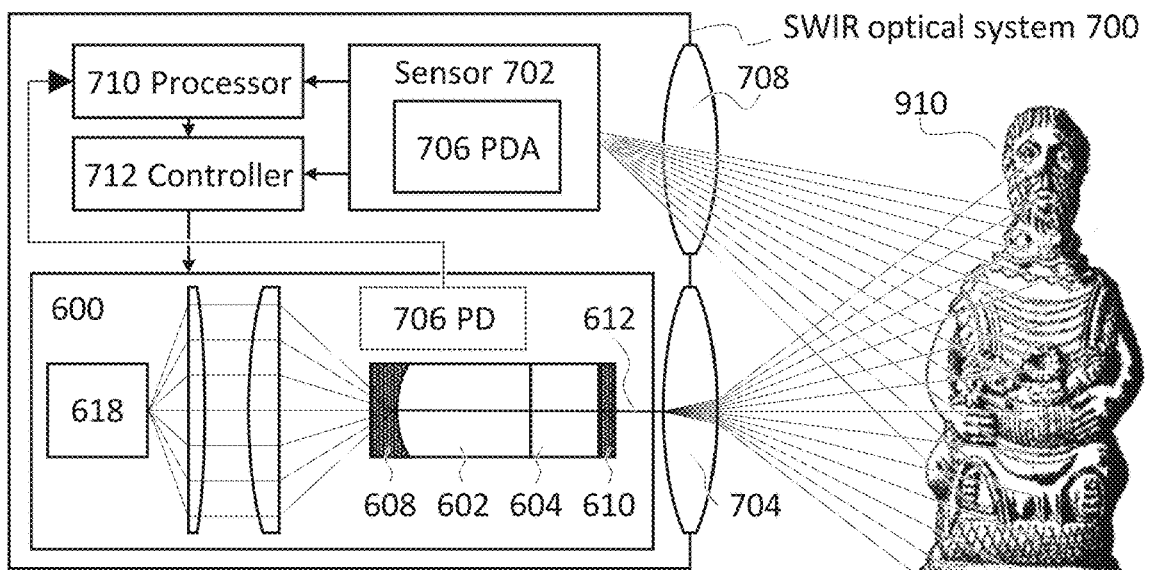
FIG. 10 is a schematic functional block diagram illustrating an example of a SWIR optical system.

FIG. 10 is a schematic functional block diagram illustrating an example of SWIR optical system 700, in accordance with examples of the presently disclosed subject matter. System 700 comprises at least P-QS laser 600, but may also comprise, as shown in FIG. 10, additional components such as:

a. a sensor 702 operative to sense reflected light from the FOV of system 700, and especially reflected illumination of laser 600 reflected from external objects 910. Referring to the other examples, sensor 702 may be implemented as imaging receiver, PDA or photodetecting devices discussed in the present disclosure, such as components 110, 1300, 1300', 1600, 1600', 1700, 1800, 1900, 2302 and 3610.

b. a processor 710, operative to process the sensing results of sensor 702. The output of the processing may be an image of the FOV, a depth model of the FOV, spectroscopy analysis of one or more parts of the FOV, information of identified objects in the FOV, light statistics on the FOV, or any other type of output. Referring to the other examples, processor 710 may be implemented as any one of the processors discussed in the present disclosure, such as processors 114, 1908, 2304 and 3620.

c. a controller 712, operative to control activity of laser 600 and/or processor 710. For example, controller 712 may include controlling timing, synching, and other operational parameters of processor 710 and/or laser 600. Referring to the other examples, controller 712 may be implemented as any one of the other controllers discussed in the present disclosure, such as controller 112, 1338, 2314 and 3640.

Optionally, system 700 may include a SWIR PDA 706 sensitive to the wavelength of the laser. This way SWIR optical system may serve as an active SWIR camera, SWIR time-of-flight (ToF) sensor, SWIR light detection and ranging (LIDAR) sensor, and so on. The ToF sensor may be sensitive to the wavelength of the laser. Optionally, the PDA may be a CMOS based PDA which is sensitive to SWIR frequencies emitted by laser 600, such is a CMOS based PDAs designed and manufactured by TriEye LTD. of Tel Aviv, Israel.

Optionally, system 700 may include a processor 710 for processing detection data from the SWIR PDA (or any other light sensitive sensor of system 700). For example, the processor may process the detection information to provide a SWIR image of a field-of-view (FOV) of system 700, to detect objects in the FOV, and so on. Optionally, the SWIR optical system may include a time of flight (ToF) SWIR sensor sensitive to the wavelength of the laser, and a controller operative to synchronize operation of the ToF SWIR sensor and the P-QS SWIR laser for detecting a distance to at least one object in the field of view of the SWIR optical system. Optionally, system 700 may include controller 712 operative to control one or more aspects of an operation of laser 600 or other components of the system such as the photodetector array (e.g., focal plane array, FPA). For example, some of the parameters of the laser which may be controlled by the controller include timing, duration, intensity, focusing, and so on. While not necessarily so, the controller may control operation of the laser based on detection results of the PDA (directly, or based on processing by the processor). Optionally, the controller may be operative to control the laser pump or other type of light source to affect activation parameters of the laser. Optionally, the controller may be operative to dynamically change the pulse repetition rate. Optionally, the controller may be operative to control dynamic modification of the light shaping optics, e.g., for improving a Signal to Noise Ratio (SNR) in specific regions of the field of view. Optionally, the controller may be operative to control the illumination module for dynamically changing pulse energy and/or duration, (e.g., in the same ways possible for other P-QS lasers, such as changing focusing of pumping laser, etc.)

Further and optionally, system 700 may include temperature control (e.g., passive temperature control, active temperature control) for controlling a temperature of the laser generally, or of one or more of its components (e.g., of the pump diode). Such temperature control may include, for example, a thermoelectric cooler (TEC), a fan, a heat sink, resistance heater under pump diode, and so forth.

Further and optionally, system 700 may include another laser which used to bleach at least one of GM 602 and SA 604. Optionally, system 700 may include an internal photosensitive detector (e.g., one or more PDs like PDA 706) which is operative to measure a time in which a pulse is generated by laser 600 (e.g., as PD 226 as discussed above). In such case, controller 740 may be operative to issue, based on the timing information obtained from internal photosensitive detector 706, a triggering signal to PDA 706 (or other type of camera or sensor 702) which detects reflection of laser light from objects in the field of view of system 700.

The main industry that has required high volumes of lasers in the aforementioned spectral range (1.3-1.5 m) is the electronics industry for optical data storage, which drove the diode laser cost down to dollars, or less, per device, per Watt. However, those lasers are not suitable for other industries such as the automotive industry, which requires lasers with considerably greater peak power and beam brightness, and which will be utilized in harsh environmental conditions.

It is noted that there is no scientific consensus about the range of wavelengths which are considered part of the SWIR spectrum. Nevertheless, for the purposes of the present disclosure, the SWIR spectrum includes electromagnetic radiation in wavelengths which are longer than that of the visible spectrum, and which include at the very least the spectral range between 1,300 and 1,500 nm.

While not restricted to such uses, one or more P-QS lasers 600 may be used as illumination source 102 of any one of imaging systems 100, 100' and 100". Laser 600 may be used in any other EO system operating in the SWIR range which requires pulsed illumination such as lidars, spectrographs, communication systems, and so on. It is noted that the proposed lasers 600 and methods for manufacturing of such lasers allows for high volume manufacturing of lasers operating in the SWIR spectral range in relatively low production costs.

P-QS laser 600 includes at least a crystalline gain medium 602 (hereinbelow gain medium is also referred to as "GM"), a crystalline SA 604, and an optical cavity 606 in which the aforementioned crystalline materials are confined, to allow light propagating within gain medium 602 to intensify towards producing a laser light beam 612 (illustrated for example in FIG. 8). The optical cavity is also known by the terms "optical resonator" and "resonating cavity", and it includes a high reflectivity mirror 608 (also referred to as "high reflector") and an output coupler 610. Discussed below are several unique and novel combinations of crystalline materials of different types, and using varied manufacturing techniques for manufacturing the lasers, which allow for high volume manufacturing of reasonably priced lasers for the SWIR spectral range. General details which are generally known in the art with respect to P-QS lasers are not provided here for reasons of conciseness of the disclosure, but are readily available from a wide variety of resources. The saturable absorber of the laser serves as the Q-switch for the laser, as is known in the art. The term "crystalline material" broadly includes any material which is in either monocrystalline form or polycrystalline form.

The dimensions of the connected crystalline gain medium and crystalline SA may depend on the purpose for which a specific P-QS laser 600 is designed. In a non-limiting example, a combined length of the SA and the GM is between 5 and 15 millimeters. In a non-limiting example, the combined length of the SA and the GM is between 2 and 40 millimeters. In a non-limiting example, a diameter of the combination of SA and GM (e.g., if a round cylinder, or confined within an imaginary such cylinder) is between 2 and 5 millimeters. In a non-limiting example, a diameter of the combination of SA and GM is between 0.5 and 10 millimeters.

P-QS laser 600 includes a gain medium crystalline material (GMC) which is rigidly connected to a SA crystalline material (SAC). The rigid coupling may be implemented in any one of the ways known in the art such as using adhesive, diffusion bonding, composite crystal bonding, growing one on top of the other, and so on. However, as discussed below, rigidly connecting crystalline materials which are in a ceramic form may be achieved using simple and cheap means. It is noted that the GMC and the SAC material may be rigidly connected directly to one another, but may optionally be rigidly connected to one another via an intermediate object (e.g., another crystal). In some implementation, both the gain medium and the SA may be implemented on single piece of crystalline material, by doping different parts of the single piece of crystalline material with different dopants (such as the ones discussed below with respect to SAC materials and to GMC materials), or by co-doping a single piece of crystalline material, doping the same volume of the crystalline material with the two dopants (e.g., a ceramic YAG co-doped with $N^{3+}$ and $V^{3+}$). Optionally, the gain medium may be grown on a single crystal saturable absorbing substrate (e.g., using Liquid Phase Epitaxy, LPE). It is noted that separate GMC materials and SA crystalline materials are discussed extensively in the disclosure below, a single piece of ceramic crystalline material doped with two dopants may also be used in any of the following implementations, mutatis mutandis.

Figure 7A:
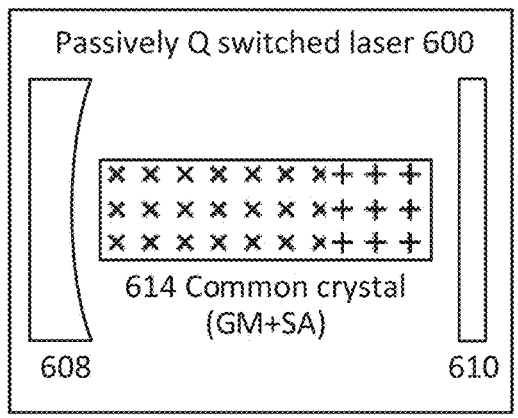
FIGS. 7A, 7B and 7C are schematic functional block diagrams illustrating examples of P-QS laser.
Figure 7B:
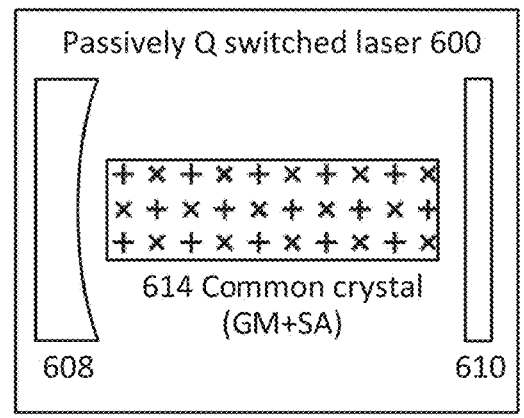
Figure 7C:
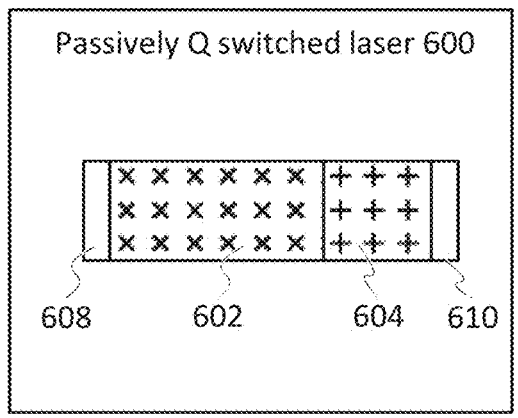

FIGS. 7A, 7B and 7C are schematic functional block diagrams illustrating examples of P-QS laser 600, in accordance with the presently disclosed subject matter. In FIG. 7A the two dopants are implemented on two parts of the common crystalline material 614 (acting both as GM and as SA), while in FIG. 7B the two dopants are implemented interchangeably on common volume of the common crystalline material 614 (in the illustrated case the entirety of the common crystal). Optionally, the GM and the SA may be implemented on a single piece of crystalline material doped with neodymium and at least one other material. Optionally (e.g., as exemplified in FIG. 7C), any one or both of output coupler 610 and high reflectivity mirror 608 may be glued directly to one of the crystalline materials (e.g., the GM or the SA, or a crystal combining both).

At least one of SAC and the GMC is a ceramic crystalline material, which is the relevant crystalline material (e.g., doped yttrium aluminum garnet, YAG, doped vanadium) in a ceramic form (e.g., a polycrystalline form). Having one—and especially both-crystalline material in ceramic form allows for production in higher numbers and in lower costs. For example, instead of growing separate monocrystalline materials in a slow and limited process, polycrystalline materials may be manufactured by sintering of powders (i.e., compacting and possibly heating a powder to form a solid mass), low temperature sintering, vacuum sintering, and so on. One of the crystalline materials (SAC or GMC) may be sintered on top of the other, obviating the need for complex and costly processes such as polishing, diffusion bonding, or surface activated bonding. Optionally, at least one of the GMC and SAC is polycrystalline. Optionally, both the GMC and the SAC is polycrystalline.

Referring to the combinations of crystalline materials from which the GMC and the SAC may be made, such combinations may include:

a. The GMC is ceramic neodymium-doped yttrium aluminum garnet (Nd:YAG) and the SAC is either (a) ceramic three-valence vanadium-doped yttrium aluminum garnet ($V^{3+}$:YAG), or (b) a ceramic Cobalt-doped crystalline material. Optionally, the ceramic Cobalt-doped crystalline material may be two-valence ceramic Cobalt-doped crystalline material. In those alternatives, both the Nd:YAG and the SAC selected from the aforementioned group are in ceramic form. A cobalt-doped crystalline material is a crystalline material which is doped with cobalt. Examples include Cobalt-doped Spinel (Co:Spinel, or $Co^{2+}$:$MgAl_2O_4$) cobalt-doped Zinc selenide ($Co^{2+}$:ZnSe), cobalt-doped YAG ($Co^{2+}$:YAG). While not necessarily so, the high reflectivity mirror and the SA in this option may optionally be rigidly connected to the gain medium and the SA, such that the P-QS laser is a monolithic microchip P-QS laser (e.g., as exemplified in FIGS. 8 and 10).

b. The GMC is a ceramic neodymium-doped yttrium aluminum garnet (Nd:YAG), and the SAC is a non-ceramic SAC selected from a group of doped ceramic materials consisting of: (a) three-valence vanadium-doped yttrium aluminum garnet ($V^{3+}$:YAG) and (b) Cobalt-doped crystalline materials. Optionally, the Cobalt-doped crystalline material may be two-valence Cobalt-doped crystalline material. In such case, high reflectivity mirror 608 and output coupler 610 are rigidly connected to the gain medium and the SA, such that P-QS laser 600 is a monolithic microchip P-QS laser.

c. The GMC which is ceramic neodymium-doped rare-earth element crystalline material, and the SAC is a ceramic crystalline material selected from a group of doped crystalline materials consisting of: (a) three-valence vanadium-doped yttrium aluminum garnet ($V^{3+}$:YAG) and (b) Cobalt-doped crystalline materials. Optionally, the Cobalt-doped crystalline material may be two-valence Cobalt-doped crystalline material. While not necessarily so, high reflectivity mirror 608 and output coupler 610 in this option may optionally be rigidly connected to the gain medium and the SA, such that P-QS laser 600 is a monolithic microchip P-QS laser.

It is noted that in any one of the implementations, a doped crystalline material may be doped with more than one dopant. For example, the SAC may be doped with the main dopant disclosed above, and with at least one other doping material (e.g., in significantly lower quantities). A neodymium-doped rare-earth element crystalline material is a crystalline material whose unit cell comprises a rare-earth element (one of a well-defined group of 15 chemical elements, including the fifteen lanthanide elements, as well as scandium and yttrium) and which is doped with neodymium (e.g., triply ionized neodymium) which replaces the rear-earth element in a fraction of the unit cells. Few non-limiting examples of neodymium-doped rare-earth element crystalline material which may be used in the disclosure are:

a. Nd:YAG (as mentioned above), neodymium-doped tungstic acid yttrium potassium (Nd:KYW), neodymium-doped yttrium lithium fluoride (Nd:YLF), neodymium-doped yttrium orthovanadate ($YVO_4$), in all of which the rear-earth element is Neodymium, Nd;

b. Neodymium-doped gadolinium orthovanadate (Nd:$GdVO_4$), neodymium-doped Gadolinium Gallium Garnet (Nd:GGG), neodymium-doped potassium-gadolinium tungstate (Nd:KGW), in all of which the rear-earth element is gadolinium, Gd;

c. Neodymium-doped lanthanum scandium borate (Nd:LSB) in which the rare-earth element is scandium);

d. Other neodymium-doped rare-earth element crystalline materials may be used, in which the rare-earth element may be yttrium, gadolinium, scandium, or any other rare-earth element.

The following discussion applies to any of the optional combinations of GMCs and SACs.

Optionally, the GMC is rigidly connected directly to the SAC. Alternatively, the GMC and the SAC may be connected indirectly (e.g., each of the SAC and GMC being connected via a group of one or more intermediate crystalline materials and/or via one or more other solid materials transparent to the relevant wavelengths). Optionally one or both of the SAC and the GMC are transparent to the relevant wavelengths.

Optionally, the SAC may be cobalt-doped Spinel (Co $Co^{2+}$:MgAl2O4). Optionally, the SAC may be cobalt-doped YAG (Co:YAG). Optionally, this may enable co-doping of cobalt and neodymium Nd on the same YAG. Optionally, the SAC may be cobalt-doped Zinc selenide ($Co^{2+}$:ZnSe). Optionally, the GMC may be a ceramic cobalt-doped crystalline material.

Optionally, an initial transmission (To) of the SA is between 75% and 90%. Optionally, the initial transmission of the SA is between 78% and 82%.

The wavelengths emitted by the laser depend on the material used in its construction, and especially on the materials and dopants of the GMC and the SAC. Some examples of output wavelengths include wavelengths in the range of 1,300 nm and 1,500 nm. Some more specific examples include 1.32 μm or about 1.32 μm (e.g., 1.32 μm±3 nm), 1.34 μm or about 1.34 μm (e.g., 1.34 μm±3 nm), 1.44 μm or about 1.44 μm (e.g., 1.44 μm±3 nm). A corresponding imager sensitive to one or more of these light frequency ranges may be included in SWIR optical system 700 (e.g., as exemplified in FIG. 10).

Figure 8:
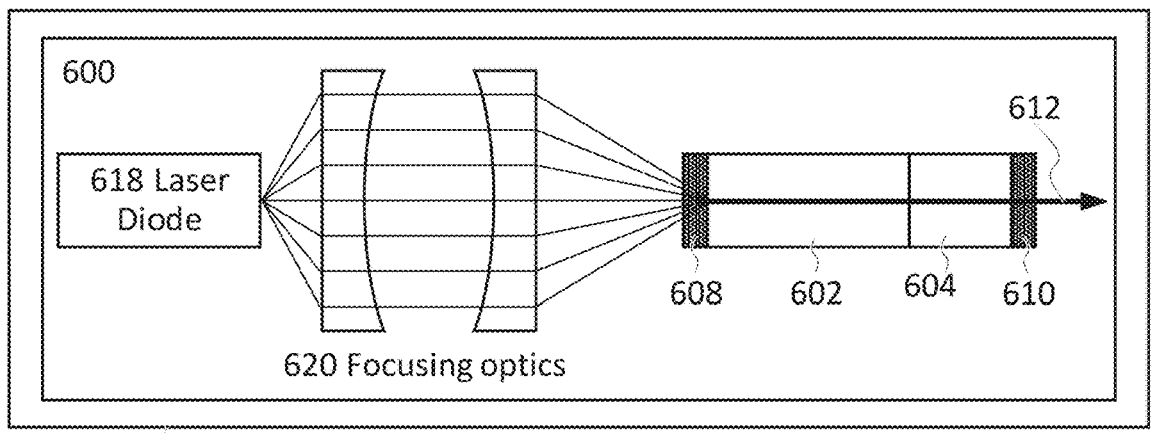
FIGS. 8 and 9 are schematic functional diagrams illustrating a SWIR optical system.
Figure 9:
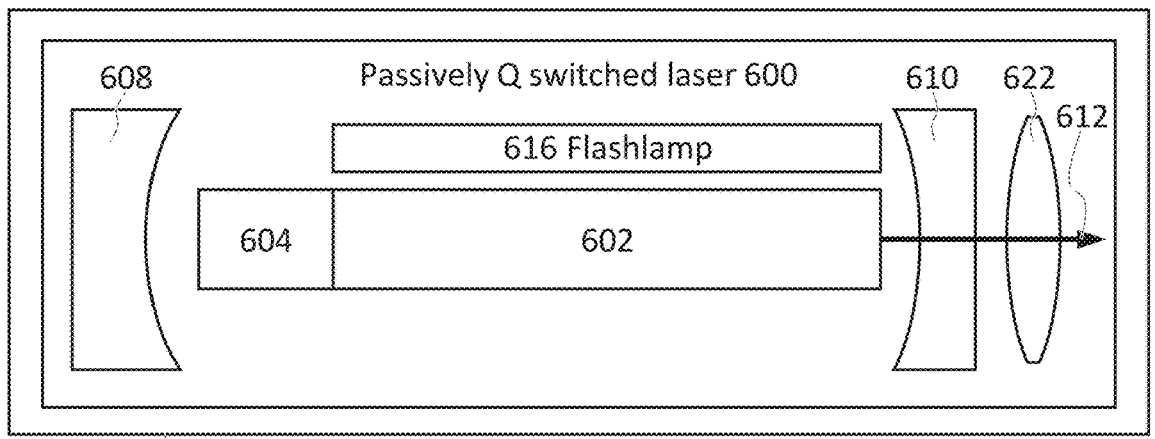

FIGS. 8 and 9 are schematic functional diagrams illustrating SWIR optical system 700, in accordance with examples of the presently disclosed subject matter. As exemplified in these illustrations, laser 600 may include additional components in addition to those discussed above, such as (but not limited to):

a. A light source such as a flashlamp 616 or a laser diode 618 which serves as a pump for the laser. Referring to the previous examples, the light source may serve as pump 124.

b. Focusing optics 620 (e.g., lenses) for focusing light from the light source (e.g. 618) onto the optical axis of laser 600.

c. A diffuser or other optics 622 for manipulating laser beam 612 after it exits optical cavity 606.

Optionally, SWIR optical system 700 may include optics 708 to spread the laser over a wider FOV, to improve eye safety issues in the FOV. Optionally, SWIR optical system 700 may include optics 704 to collect reflected laser light from the FOV and directing it onto the sensor 702, e.g., onto a photodetector array (PDA) 706, see FIG. 10. Optionally the P-QS laser 600 is a diode pumped solid state laser (DPSSL).

Optionally, P-QS laser 600 includes at least one diode pump light source 872 and optics 620 for focusing light of the diode pump light source into the optical resonator (optical cavity). Optionally, the light source is positioned on the optical axis (as an end pump). Optionally, the light source may be rigidly connected to high reflectivity mirror 608 or to SA 604, such that the light source is a part of a monolithic microchip P-QS laser. Optionally, the light source of the laser may include one or more vertical-cavity surface-emitting laser (VCSEL) array. Optionally, P-QS laser 600 includes at least one VCSEL array and optics for focusing light of the VCSEL array into the optical resonator. The wavelengths emitted by the light source (e.g., the laser pump) may depend on the crystalline materials and/or dopants used in the laser. Some example pumping wavelengths which may be emitted by the pump include: 808 nm or about 808 nm, 869 nm or about 869 nm, about nine hundred and some nm.

The power of the laser may depend on the utilization for which it is designed. For example, the laser output power may be between 1 W and 5 W. For example, the laser output power may be between 5 W and 15 W. For example, the laser output power may be between 15 W and 50 W. For example, the laser output power may be between 50 W and 200 W. For example, the laser output power may be higher than 200 W.

QS laser 600 is a pulsed laser, and may have different frequency (repetition rate), different pulse energy, and different pulse duration, which may depend on the utilization for which it is designed. For example, a repetition rate of the laser may be between 10 Hz and 50 Hz. For example, a repetition rate of the laser may be between 50 Hz and 150 Hz. For example, a pulse energy of the laser may be between 0.1 mJ and 1 mJ. For example, a pulse energy of the laser may be between 1 mJ and 2 mJ. For example, a pulse energy of the laser may be between 2 mJ and 5 mJ. For example, a pulse energy of the laser may be higher than 5 mJ. For example, a pulse duration of the laser may be between 10 ns and 100 ns. For example, a pulse duration of the laser may be between 0.1 μs and 100 s. For example, a pulse duration of the laser may be between 100 s and 1 ms. The size of the laser may also change, depending for example on the size of its components. For example, the laser dimensions may be $X_1$ by $X_2$ by $X_3$, wherein each of the dimensions ($X_1$, $X_2$, and $X_3$) is between 10 mm and 100 mm, between 20 and 200 mm, and so on. The output coupling mirror may be flat, curved, or slightly curved.

Optionally, laser 600 may further include undoped YAG in addition to the gain medium and to the SA, for preventing heat from accumulating in an absorptive region of the gain medium. The undoped YAG may optionally be shaped as a cylinder (e.g., a concentric cylinder) encircling the gain medium and the SA.

Figure 11A:
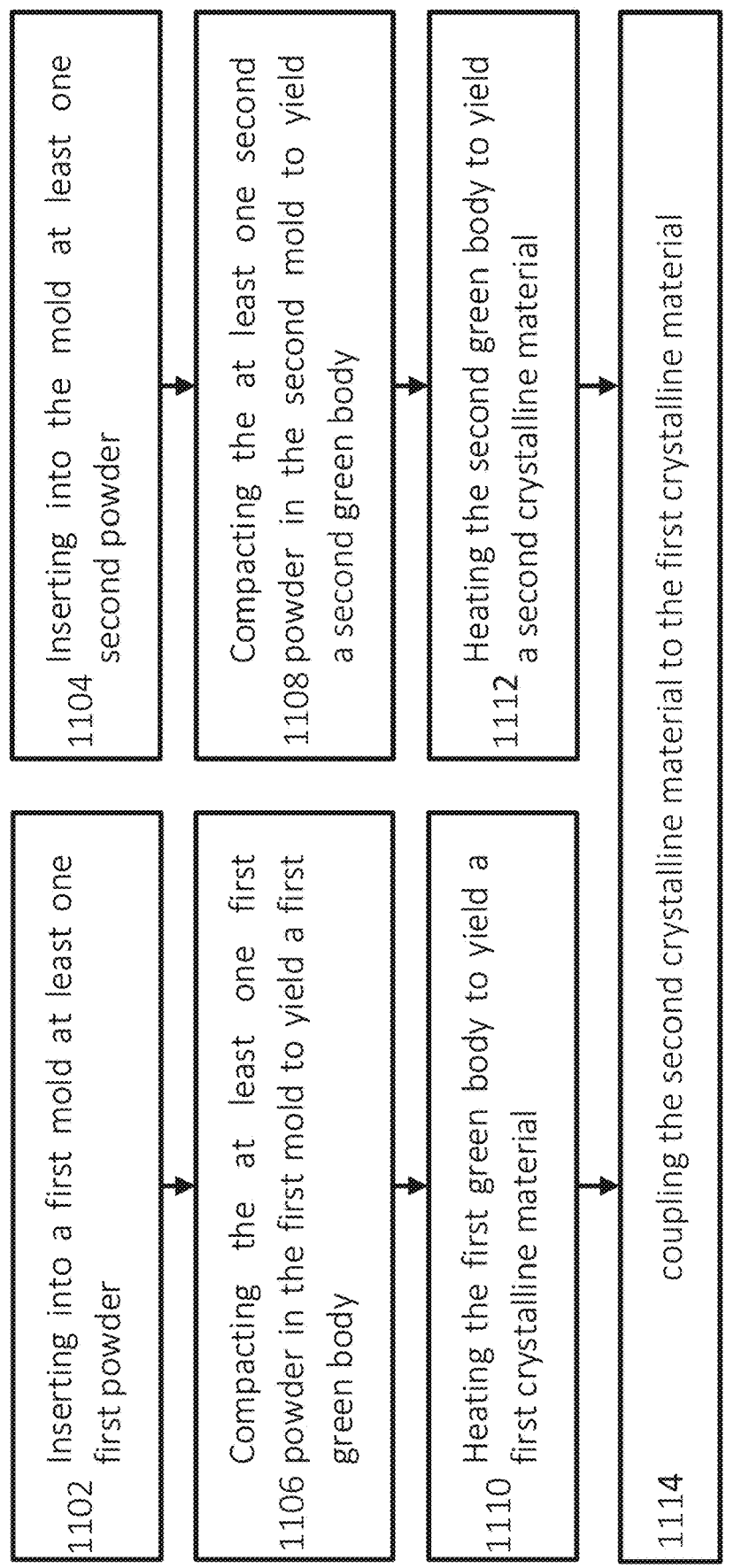
FIGS. 11A, 11B and 11C show respectively a flow chart illustrating an example of a method for manufacturing parts for a P-QS laser, and conceptual timelines for the execution of the method.

FIG. 11A is a flow chart illustrating an example of method 1100, in accordance with the presently disclosed subject matter. Method 1100 is a method for manufacturing parts for a P-QS laser such as but not limited to P-QS laser 600 discussed above. Referring to the examples set forth with respect to the previous drawings, the P-QS laser may be laser 600. It is noted that any variation discussed with respect to laser 600 or to a component thereof may also be implemented for the P-QS laser whose parts are manufactured in method 1100 or to a corresponding component thereof, and vice versa.

Method 1100 starts with step 1102 of inserting into a first mold at least one first powder, which is processed later in method 1100 to yield a first crystalline material. The first crystalline material serves as either the GM or the SA of the P-QS laser. In some implementations the gain medium of the laser is made first (e.g., by way of sintering), and the SA is made later on top of the previously made GM (e.g., by way of sintering). On other implementations, the SA of the laser is made first, and the GM is made later on top of the previously made SA. In yet other implementations, the SA and the GM are made independently of one another, and are coupled to form a single rigid body. The coupling may be done as part of the heating, sintering, or later.

Step 1104 of method 1100 includes inserting into a second mold at least one second powder different than the at least one first powder. The at least one second powder is processed later in method 1100 to yield a second crystalline material. The second crystalline material serves as either the GM or the SA of the P-QS laser (so that one of the SA and the GM is made from the first crystalline material and the other functionality is made from the second crystalline material).

The second mold may be different from the first mold. Alternatively, the second mold may be the same as the first mold. In such case the at least one second powder may be inserted, for example, on top of the at least one first powder (or on top of the first green body, if already made), beside it, around it, and so on. The inserting of the at least one second powder into the same mold of the at least one first powder (if implemented) may be executed before processing of the at least one first powder into a first green body, after processing of the at least one first powder into the first green body, or sometime during the processing of the at least one first powder into the first green body.

The first powder and/or the second powder may include crushed YAG (or any of the other aforementioned materials such as Spinel, $MgAl_2O_4$, ZnSe) and doping materials (e.g., $N^{3+}$, $V^{3+}$, Co). The first powder and/or the second powder may include materials from which YAG (or any of the other aforementioned materials such as Spinel, $MgAl_2O_4$, ZnSe) is made and doping material (e.g., $N^{3+}$, $V^{3+}$, Co).

Step 1106 is executed after step 1102, and includes compacting the at least one first powder in the first mold to yield a first green body. Step 1104 is executed after step 1108, that includes compacting the at least one second powder in the second mold, thereby yielding a second green body. If the at least one first powder and the at least one second powder are inserted into the same mold in steps 1102 and 1104, the compacting of the powders in step 1106 and 1108 may be done concurrently (e.g., pressing on the at least one second powder, which in turn compresses the at least one first powder against the mold), but this is not necessarily so. For example, step 1104 (and therefore also step 1108) may optionally be executed after the compressing of step 1106.

Step 1110 includes heating the first green body to yield a first crystalline material. Step 1112 includes heating the second green body to yield a second crystalline material. In different embodiments, the heating of the first crystalline may be executed before, concurrently, partly concurrently, or after each one of steps 1106 and 1110.

Optionally, the heating of the first green body at step 1110 precedes the compacting (and possibly also precedes the inserting) of the at least one second powder in step 1108 (and possibly step 1104). The first green body and the second green body may be heated separately (e.g., in different times, in different temperatures, for different durations). The first green body and the second green body may be heated together (e.g., in the same oven), either connected to each other during the heating or not. The first green body and the second green body may be subject to different heating regimes, which may share partial co-heating, while being heated separately in other parts of the heating regimes. For example, one or both of the first green body and the second green body may be heated separately from the other green body, and then the two green bodies may be heated together (e.g., after coupling, but not necessarily so). Optionally, the heating of first green body and the heating of the second green body comprise concurrent heating of the first green body and the second green body in a single oven. It is noted that optionally, the coupling of step 1114 is a result of the concurrent heating of both of the green bodies in the single oven. It is noted that optionally, the coupling of step 1114 is done by co-sintering both of the green bodies after being physically connected to one another.

Step 1116 includes coupling the second crystalline material to the first crystalline material. The coupling may be executed in any way of coupling known in the art, several non-limiting examples of which were discussed above with respect to P-QS laser 600. It is noted that the coupling may have several sub-steps, some of which may intertwine with different steps out of steps 1106, 1108, 1110, and 1112 in different manners in different embodiments. The coupling results in a single rigid crystalline body that includes both the GM and the SA.

It is noted that method 1100 may include additional steps which are used in the making of crystals (and especially in the making of ceramic or non-ceramic polycrystalline crystal compounds of polycrystalline materials which are bounded to each other). Few non-limiting examples include powder preparation, binder burn-out, densification, annealing, polishing (if required, as discussed below), and so on.

The GM of the P-QS laser in method 1100 (which, as aforementioned, can be either the first crystalline material or the second crystalline material), is a neodymium-doped crystalline material. The SA of the P-QS laser in method 1100 (which, as aforementioned, can be either the first crystalline material or the second crystalline material), is selected from a group of crystalline materials consisting of: (a) a neodymium-doped crystalline material, and (b) a doped crystalline material selected from a group of doped crystalline materials consisting of: three-valence vanadium-doped yttrium aluminum garnet ($V^{3+}$:YAG) and cobalt-doped crystalline materials. At least one of the GM and the SA is a ceramic crystalline material. Optionally, both of the GM and the SA are ceramic crystalline materials. Optionally, at least one of the GM and the SA is a polycrystalline material. Optionally, both the GM and the SA are polycrystalline materials.

While additional steps of the manufacturing process may take place between the different stages of method 1100, notably polishing of the first material before bonding of the second material in the process of sintering is not required in at least some of the implementations.

Referring to the combinations of crystalline materials from which the GMC and the SAC may be made in method 1100, such combinations may include:

a. The GMC is ceramic neodymium-doped yttrium aluminum garnet (Nd:YAG), and the SAC is either (a) ceramic three-valence vanadium-doped yttrium aluminum garnet ($V^{3+}$:YAG), or (b) a ceramic Cobalt-doped crystalline material. In this alternatives, both the Nd:YAG and the SAC selected from the aforementioned group are in ceramic form. A cobalt-doped crystalline material is a crystalline material which is doped with cobalt. Examples include Cobalt-doped Spinel (Co:Spinel, or $Co^{2+}$:$MgAl_2O_4$) cobalt-doped Zinc selenide ($Co^{2+}$:ZnSe). While not necessarily so, the high reflectivity mirror and the output coupler in this option may optionally be rigidly connected to the GM and the SA, such that the P-QS laser is a monolithic microchip P-QS laser.

b. The GMC is a ceramic neodymium-doped yttrium aluminum garnet (Nd:YAG), and the SAC is a nonceramic SAC selected from a group of doped ceramic materials consisting of: (a) three-valence vanadium-doped yttrium aluminum garnet ($V^{3+}$:YAG) and (b) Cobalt-doped crystalline materials. In such case, the high reflectivity mirror and the output coupler are rigidly connected to the GM and the SA, such that the P-QS laser is a monolithic microchip P-QS laser.

c. The GMC which is ceramic neodymium-doped rare-earth element crystalline material, and the SAC is a ceramic crystalline material selected from a group of doped crystalline materials consisting of: (a) three-valence vanadium-doped yttrium aluminum garnet ($V^{3+}$:YAG) and (b) Cobalt-doped crystalline materials. While not necessarily so, the high reflectivity mirror and the output coupler in this option may optionally be rigidly connected to the GM and the SA, such that the P-QS laser is a monolithic microchip P-QS laser.

Referring to method 1100 as a whole, it is noted that optionally one or both of the SAC and the GMC (and optionally one or more intermediate connecting crystalline materials, if any) are transparent to the relevant wavelengths (e.g., SWIR radiation).

Figure 11B:
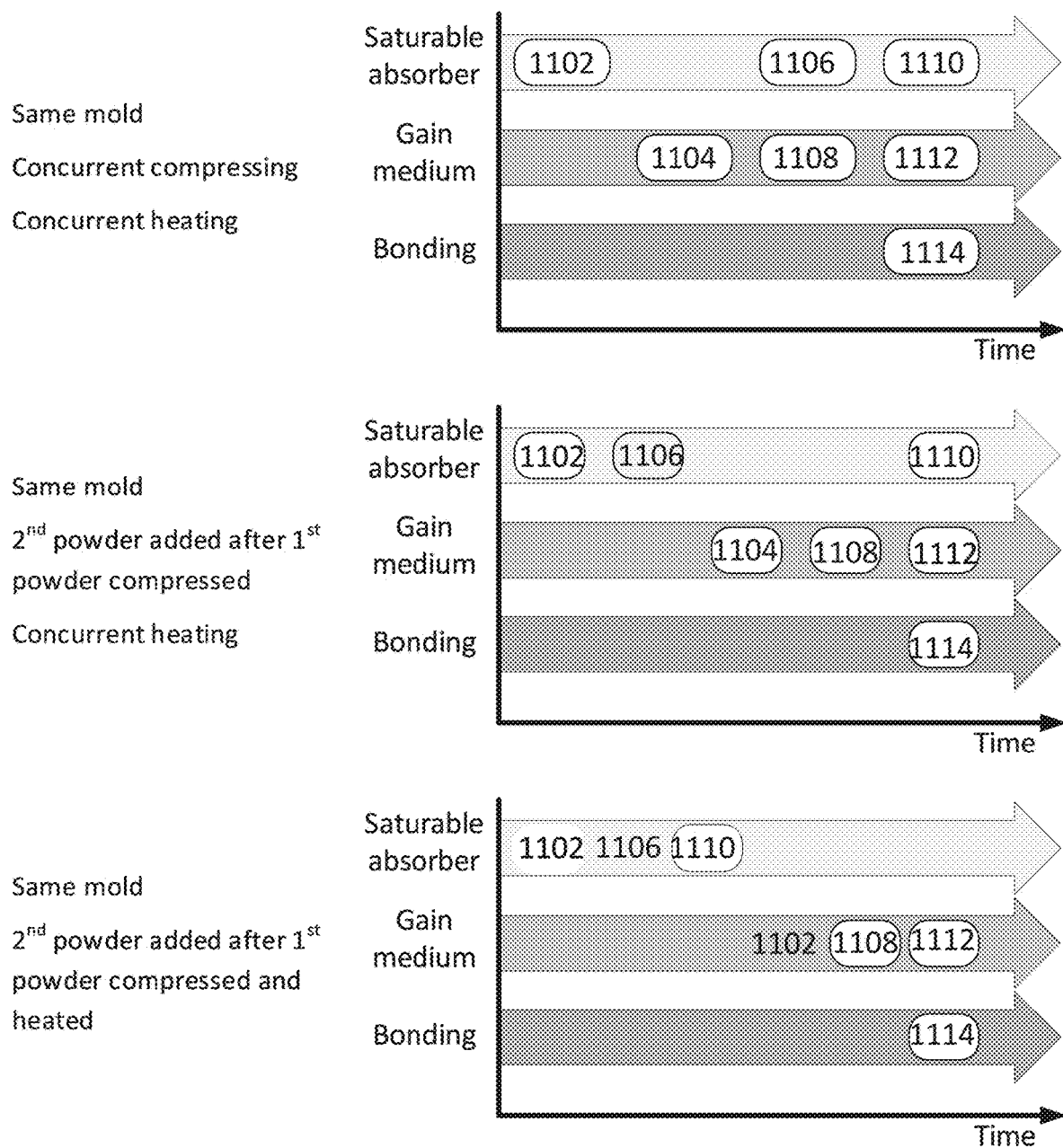
Figure 11C:
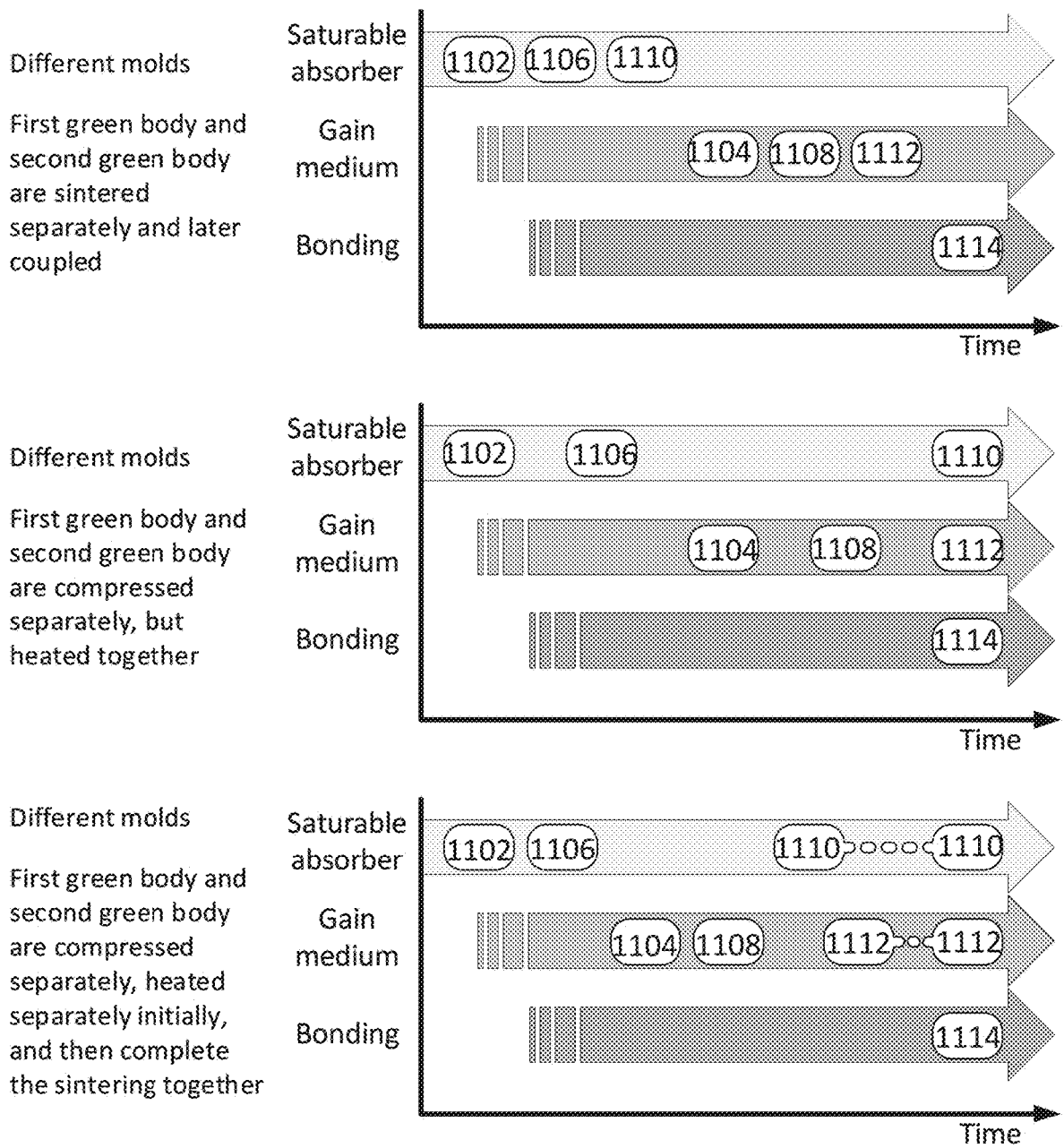

FIGS. 11B and 11C include several conceptual timelines for the execution of method 1100, in accordance with examples of the presently disclosed subject matter. To simplify the drawing, it is assumed that the SA is a result of the processing of the at least one first powder, and that the gain medium is a result of the processing of the at least one second powder. As mentioned above, the roles may be reversed.

Figure 12A:
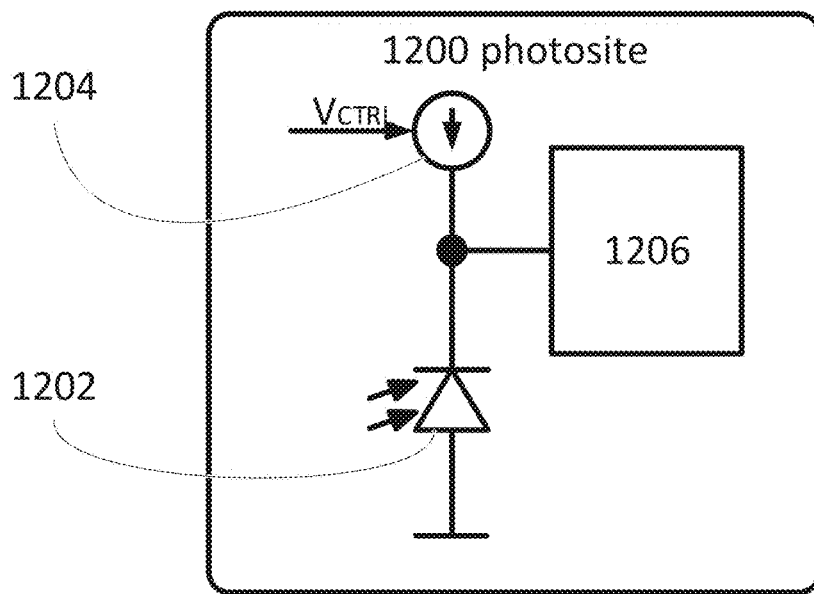
FIG. 12A shows schematically a PS that includes a PD controlled by a voltage-controlled current source.
Figure 12B:
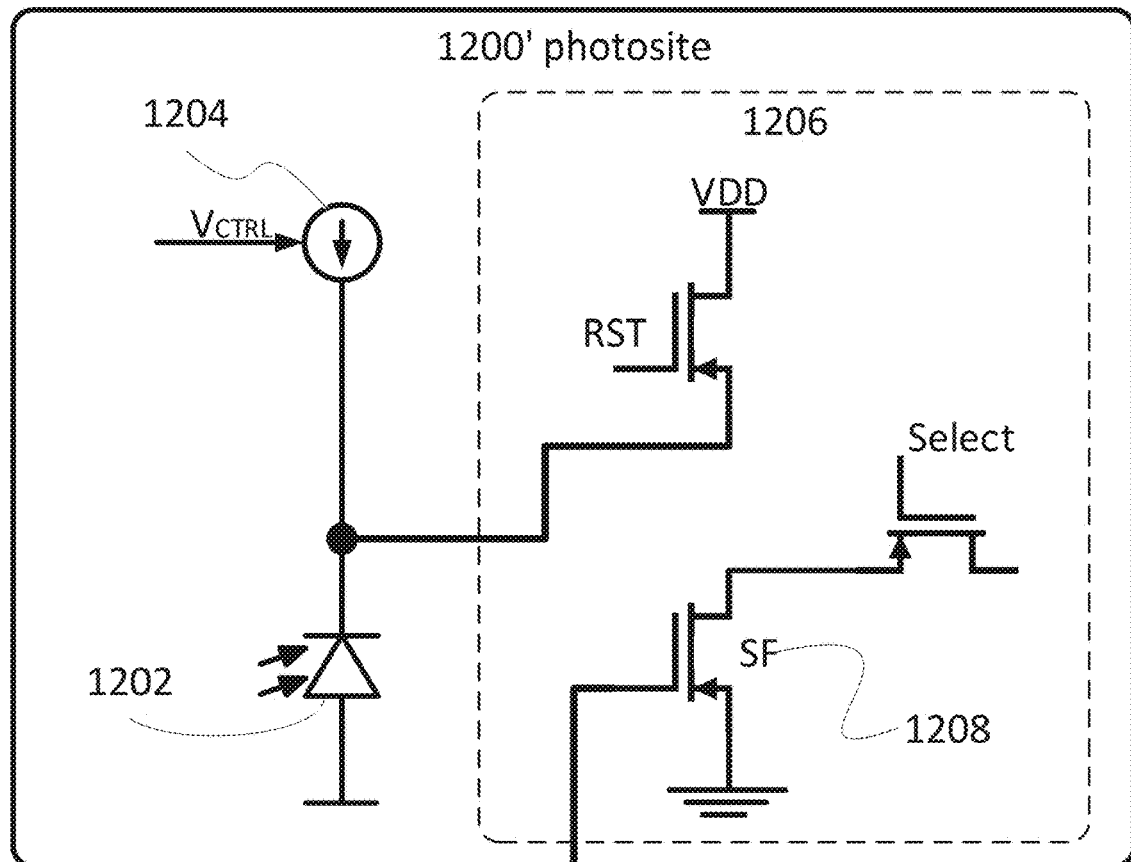
FIG. 12B shows schematically a PS that includes a PD controlled by a voltage-controlled current source in a "3T" structure.

FIG. 12B shows schematically another example of a PS numbered 1200', which is an example of PS 1200. In PS 1200', other components 1206 are in the form of a "3T" (three-transistor) structure. Any other suitable circuitry may serve as additional components 1206.

Current source 1204 may be used to provide a current of the same magnitude but of opposite direction to the dark current generated by PD 1202, thereby cancelling the dark current (or at least reducing it). This is especially useful if PD 1202 is characterized by high dark current. This way, the charge which flows from the PD to a capacitance (which, as aforementioned, may be provided by one or more capacitors, by parasitic capacitance of the PS, or by a combination thereof) and the charge that results from the dark current can be canceled out. Notably, providing by current source 1204 of a current which is substantially equal in magnitude to the dark current means that the provided current does not cancel out the actual electric signal generated by PD 1202 as a result of detected light impinging on PD 1202.

Figure 13A:
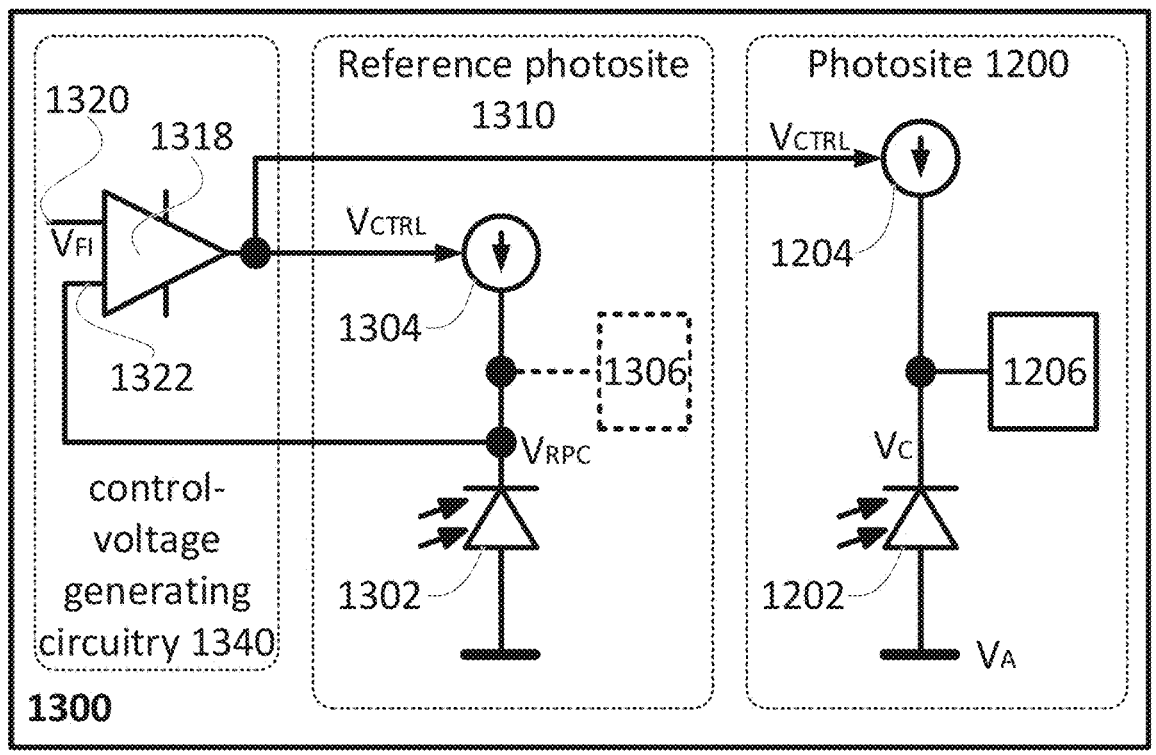
FIGS. 13A and 13B show a PDD including a PS and circuitry operative to reduce effects of dark current.
Figure 13B:
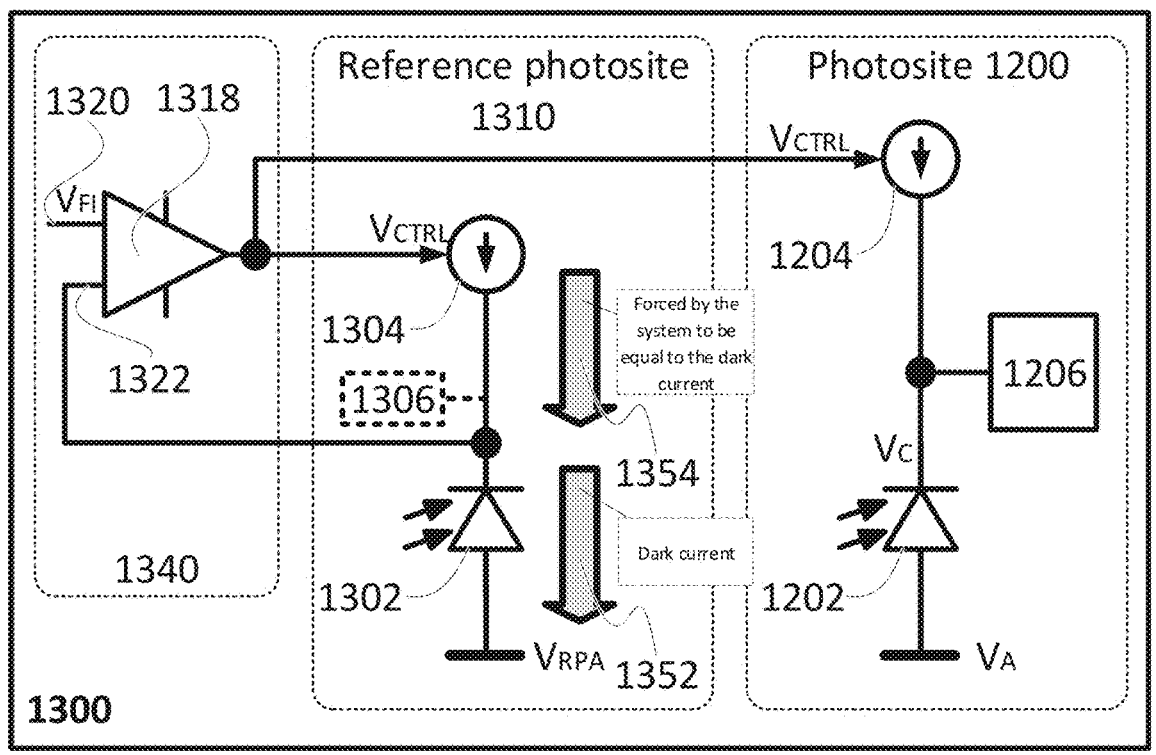

FIG. 13A shows a PDD 1300 in accordance with examples of the presently disclosed subject matter. PDD 1300 includes circuitry that can controllably match the current issued by current source 1204 to the dark current generated by PD 1202, even in cases in which the generated dark current is not constant (changes with time). It is noted that the level of dark current generated by PD 1202 may depend on different parameters such as operational temperature and the bias applied to the PD (which may also change from time to time).

The reducing of the effects of dark current within PS 1200 as done by PDD 1300 (and not in later stages of signal processing, either analog or digital), enable utilization of a relatively small capacitance, without saturating the capacitance or reducing the linearity of its response to the collected charge.

PDD 1300 comprises a PS 1200 for detecting impinging light, and a reference PS 1310 whose outputs are used by additional circuitry (discussed below) for reducing or eliminating effects of dark current in PS 1200. Like PS 1200 (and 1200'), reference PS 1310 includes a PD 1302, a VCCS 1304 and, optionally, additional circuitry ("other components", collectively denoted 1306). In some examples, reference PS 1310 of PDD 1300 may be identical to PS 1200 of PDD 1300. Optionally, any one or more components of PS 1310 may be identical to a corresponding component of PS 1200. For example, PD 1302 may be substantially identical to PD 1202. For example, VCCS 1304 may be identical to VCCS 1204. Optionally, any one or more components of PS 1310 may differ from those of PSs 1200 (e.g., PDs, current source, additional circuitry). It is noted that substantially identical components of PS 1200 and of PS 1310 (e.g., PDs, current source, additional circuitry) may be operated in different operational conditions. For example, different biases may be applied to PDs 1202 and 1302. For example, different components of additional components 1206 and 1306 may be operated using different parameters, or selectively connected/disconnected, even when their structure is substantially identical. For the sake of simplicity and clarity, components of PS 1310 are numbered with numerals 1302 (for the PD), 1304 (for the VCCS) and 1306 (for the additional circuitry), without implying that this indicates such components are different from components 1202, 1204 and 1206.

In some examples, reference additional circuitry 1306 may be omitted or disconnected, so as to not affect the determination of the dark current. PD 1202 may operate at one of: reverse bias, forward bias, zero bias, or selectively between any two or three of the above biases (e.g., controlled by a controller such as controller 1338 discussed below). PD 1302 may operate at one of: reverse bias, forward bias, zero bias, or selectively between any two or three of the above biases (e.g., controlled by a controller such as controller 1338 discussed below). PDs 1202 and 1302 may operate under substantially the same bias (e.g., about −5V, about 0V, about +0.7V), bus this is not necessarily so (e.g., when testing PDD 1300, as discussed below in greater detail). Optionally, a single PS of PDD 1300 may operate at some times as PS 1200 (detecting light from a field of view (FOV) of PDD 1300) while in other time as PS 1310 (whose detection signal outputs are used for determining a control voltage for a VCCS of another PS 1200 of the PDD). Optionally, the roles of the "active" PS used for detecting impinging light and of the reference PS may be exchanged. PDD 1300 further comprises a control-voltage generating circuitry 1340 that includes at least amplifier 1318 and electrical connections to multiple PSs of PDD 1300. Amplifier 1318 has at least two inputs: first input 1320 and second input 1322. First input 1320 of amplifier 1318 is supplied with a first-input voltage ($V_{FI}$) which may be directly controlled by controller (implemented on PDD 1300, on an external system, or in combination thereof), or derived from other voltages in the system (which may, in turn, be controlled by the controller). Second input 1322 of amplifier 1318 is connected to the cathode of PD 1302 (of reference PS 1310).

In a first use case example, PD 1202 is maintained at a working bias, between a first voltage (also referred to as "anode voltage", denoted $V_A$) and a second voltage (also referred to as "cathode voltage", denoted $V_C$). The anode voltage may be directly controlled by the controller (implemented on PDD 1300, on an external system, or in combination thereof), or derived from other voltages in the system (which may, in turn, be controlled by the controller). The cathode voltage may be directly controlled by the controller (implemented on PDD 1300, on an external system, or in combination thereof), or derived from other voltages in the system (which may, in turn, be controlled by the controller). Each of the anode voltage $V_A$ and the cathode voltage $V_C$ may or may not be kept constant in time. For example, the anode voltage $V_A$ may be provided by a constant source (e.g., via a pad, from an external controller). The cathode voltage $V_C$ may be substantially constant or changing with time, depending on the implementation. For example, when using a 3T structure for PS 1200, $V_C$ changes with time, e.g., due to operation of additional components 1206 and/or to current from PD 1202. $V_C$ may optionally be determined/controlled/affected by additional components 1206 (and not by the reference circuit).

VCCS 1204 is used to provide (feed) a current to the cathode end of PD 1202 to counter dark current generated by PD 1202. It is noted that at other times, VCCS 1204 may feed other current to achieve other ends (e.g., for calibrating or testing PDD 1300). The level of the current generated by VCCS 1204 is controlled in response to an output voltage of amplifier 1318. The control voltage for controlling VCCS 1204, denoted $V_{CTRL}$, may be identical to an output voltage of amplifier 1318 (as illustrated). Alternatively, $V_{CTRL}$ may be derived from the output voltage of amplifier 1318 (e.g., due to resistance or impedance between the output of amplifier 1318 and VCCS 1204.

To cancel out (or at least reduce) the effect of the dark current of PD 1202 on the output signal of PS 1200, PDD 1300 may subject PD 1302 to substantially the same bias to which PD 1202 is subjected. For example, subjecting PD 1302 and PD 1202 to the same bias may be used when PD 1302 is substantially identical to PD 1202. One way to apply the same bias to both PDs (1202 and 1302) is to apply voltage $V_A$ to the anode of PD 1302 (where the voltage applied is denoted $V_{RPA}$, RPA standing for "reference PD anode"), and to apply voltage $V_C$ to the cathode of PD 1302 (where the voltage applied is denoted $V_{RPC}$, RPC standing for "reference PD cathode"). Another way of applying the same bias is apply $V_{RPA}=V_A+\Delta V$ to the anode of PD 1302 and $V_{RPC}=V_C+\Delta V$ to the cathode of PD 1302. Optionally, anode voltage $V_A$, reference anode voltage $V_{RPA}$, or both may be provided by an external source (e.g., via a printed circuit board (PCB) to which PDD 1300 is connected).

As mentioned, first input 1320 of amplifier 1318 is supplied with first-input voltage $V_{FI}$. Second input 1322 of amplifier 1318 is connected to the cathode of PD 1302. Operation of amplifier 1318 reduces differences in voltage between its two inputs (1320 and 1322), thereby bringing the voltage on second input 1322 towards the same controlled voltage which is applied to the first-input ($V_{FI}$). Refer now to FIG. 3B, in which the dark current over PD 1302 (hereinbelow denoted $DC_{Reference}$) is represented by an arrow 1352 (the illustrated circuit is identical to that of FIG. 3A). The current over PD 1302 is equal to the dark current of PD 1202 in the case PD 1202 is kept in the dark during that time. PDD 1300 (or any system component connected or adjacent to it) may block light to PD 1302, so it is kept in the dark. The blocking may be by a physical barrier (e.g., opaque barrier), by optics (e.g., diverting lenses), by electronic shutter, and so on. In the explanation below it is assumed that all current on PD 1302 is dark current generated by PD 1302. Alternatively, if PD 1302 is subjected to light (e.g., low levels of known stray light in the system), a current source may be implemented to offset the known light-originating signal, or the first-input voltage $V_{FI}$ may be amended to compensate (at least partly) for the stray illumination. The barrier, optics, or other dedicated components intended to keep light away from PD 1302 may be implemented on the wafer level (on the same wafer from which PDD 1300 is made), may be connected to that wafer (e.g., using adhesive), may be rigidly connected to a casing in which the wafer is installed, and so on.

Assuming $V_{FI}$ is constant (or changes slowly), the output of VCCS 1304 (represented by arrow 1354) has to be substantially equal in magnitude to the dark current of PD 1302 ($DC_{Reference}$), which means VCCS 1304 provides the charge carriers for the dark current consumption of PD 1302, thus allowing the voltage to remain at $V_{FI}$. Since the output of VCCS 1304 is controlled by $V_{CTRL}$ which is responsive to the output of amplifier 1318, amplifier 1318 is operated to output the required output such that $V_{CTRL}$ would control the current output by VCCS 1304 which would be identical in magnitude to the dark current over PD 1302.

If PD 1202 is substantially identical to PD 1302 and VCCS 1204 is substantially identical to VCCS 1304, the output of amplifier 1318 would also cause VCCS 1204 to provide the same level of current ($DC_{Reference}$) to the cathode of PD 1202. In such a case, for the output of VCCS 1204 to cancel out the dark current generated by PD 1202 (hereinbelow denoted $DC_{ActivePD}$), it is required that both PD 1202 and PD 1302 would generate a similar level of dark current. To subject both PDs (1202 and 1302) to the same bias (which would cause both PDs to generate substantially the same level of dark current, as both PDs are maintained in substantially the same conditions, e.g., temperature), the voltage provided to the first input of amplifier 1318 is determined in response to the anode voltage and the cathode voltage of PD 1202, and to the anode voltage of PD 1302. For example, if $V_A$ is equal to $V_{RPA}$, then $V_{FI}$ which is equal to $V_C$ may be provided to first input 1320. It is noted that $V_C$ may change with time, and is not necessarily determined by a controller (for example, $V_C$ may be determined as result of additional components 1206). If PD 1202 differs from PD 1302 and/or if VCCS 1204 differs from VCCS 1304, the output of amplifier 1318 may be modified by matching electric components (not shown) between amplifier 1318 and VCCS 1204 to provide the relevant control voltage to VCCS 1204 (e.g., if it is known that the dark current over PD 1202 is linearly correlated to the dark current over PD 1302, the output of amplifier 1318 may be modified according to the linear correlation). Another way of applying the same bias is to apply $V_{RPA}=V_A+\Delta V$ to the anode of PD 1302 and $V_{RPC}=V_C+\Delta V$ to the cathode of PD 1302.

Figure 13C:
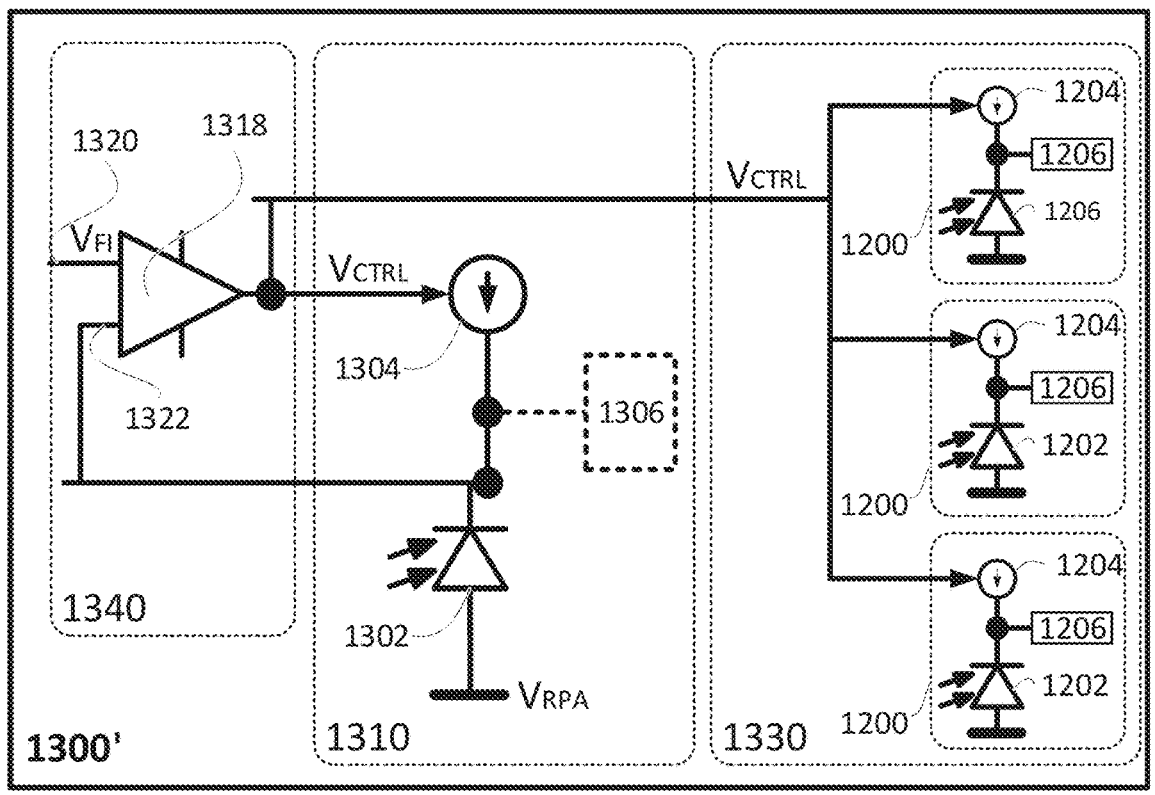
FIG. 13C shows a PDD comprising a plurality of PSs and circuitry operative to reduce effects of dark current.

FIG. 13C shows a photodetecting device 1300' that includes a plurality of PSs 1200, in accordance with examples of the presently disclosed subject matter. PDD 1300' includes all of the components of PDD 1300, as well as additional PSs 1200. The different PSs of PDD 1300' are substantially identical to one another (e.g., all are part of a two-dimensional PDA), and therefore the PDs 1302 of the different PSs 1200 generate similar dark current as one another. Therefore, the same control voltage $V_{CTRL}$ is supplied to all of the VCCSs 1204 of the different PSs 1200 of PDD 1300', causing these VCCSs 1204 to cancel out (or at least reduce) the effects of the dark current generated by the respective PDs 1202. Any option discussed above with respect to PDD 1300 may be applied, mutatis mutandis, to PDD 1300'.

In some cases (e.g., if $V_C$ is not constant and/or is not known), it is possible to provide a first-input voltage $V_{FI}$ (e.g., by a controller) which is selected to cause a similar dark current on PD 1302 as on PD 1202.

Figure 14:
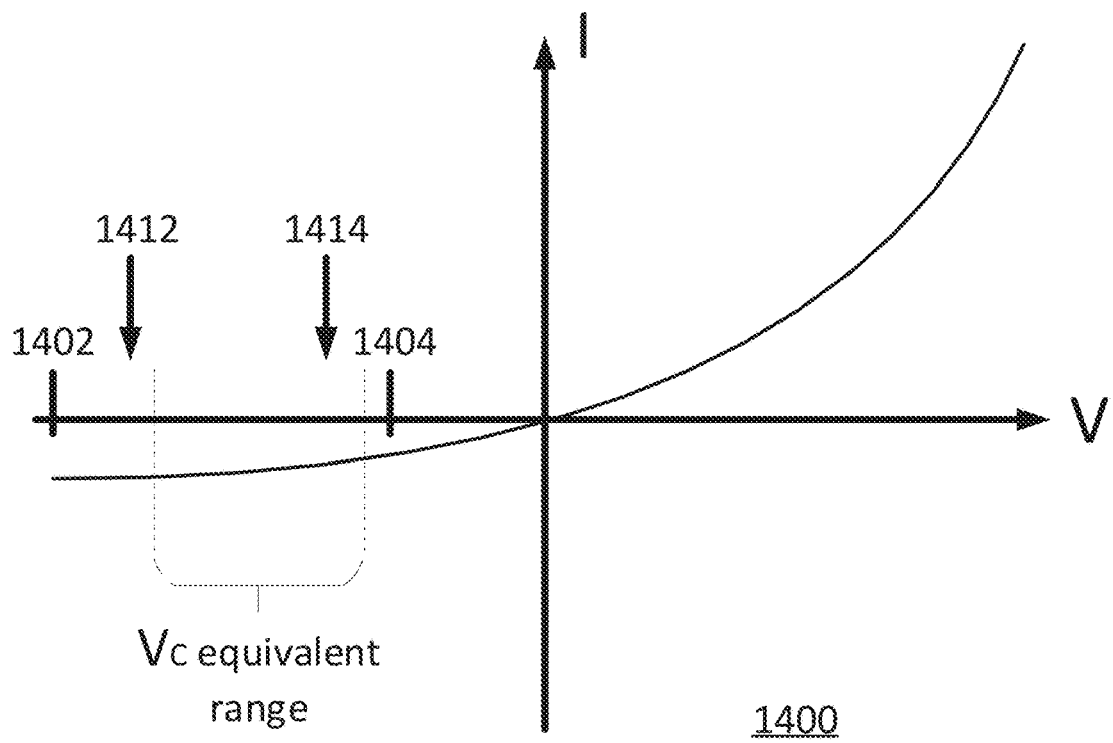
FIG. 14 shows an exemplary PD I-V curve and possible operational voltages for a PDD.

Refer now to FIG. 14, which shows an exemplary PD I-V curve 1400 in accordance with examples of the presently disclosed subject matter. For simplicity of explanation, curve 1400 represents the I-V curves of both PD 1302 and PD 1202, which are assumed to be substantially identical for the purpose of the present explanation, as well as subject to the same anode voltage (i.e., for this explanation, $V_A=V_{RPA}$). I-V curve 1400 is relatively flat between voltages 1402 and 1404, which means different biases between 1402 and 1404 which are applied to the relevant PD would yield similar levels of dark current. If $V_C$ is changing within a cathode voltage range which, given a known $V_A$, means the bias on PD 1202 is confined between voltages 1402 and 1404, then applying a $V_{RPC}$ which causes the bias on PD 1302 to also be between voltages 1402 and 1404 would cause VCCS 1204 to output a current which is sufficiently similar to $DC_{ActivePD}$, even though PD 1202 and PD 1302 are subject to different biases. The $V_{RPC}$ in such case may be within the cathode voltage range—as exemplified by equivalent voltage 1414, or outside it (but still maintaining the bias on PD 1302 between 1402 and 1404 as exemplified by equivalent voltage 1412. Modifications to other configurations, such as those discussed above, may be implemented, mutatis mutandis. It is noted that different biases may be applied to different PDs 1202 and 1302 for other reasons as well. For example, different biases may be applied as part of testing or calibrating of the PDA.

In real life, different PDs (or other components) of different PSs of a single PDD are not manufactured exactly identically, and the operation of this PSs is also not exactly identical to one another. In a PD array, PDs may be somewhat different from one another and may have somewhat different dark currents (e.g., because manufacturing differences, slight difference in temperatures, etc.).

Figure 15:
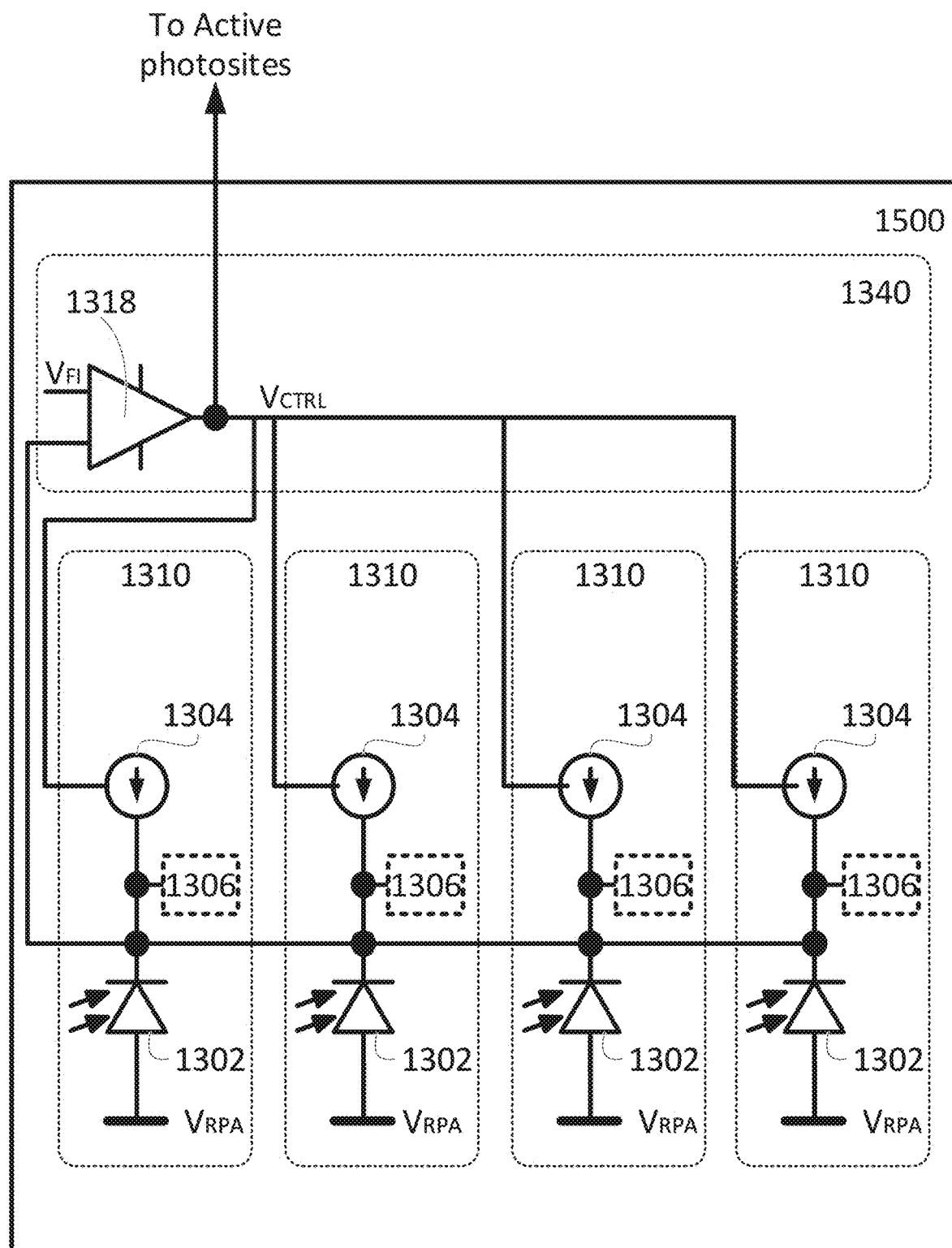
FIG. 15 shows a control-voltage generating circuitry that is connected to a plurality of reference photosites.

FIG. 15 shows a control-voltage generating circuitry 1340 connected to a plurality of reference photosites 1310 (collectively denoted 1500), in accordance with examples of the presently disclosed subject matter. The circuit of FIG. 15 (also referred to as reference circuit 1500) may be used for determining a control voltage (denoted $V_{CTRL}$) for one or more VCCSs 1204 of corresponding one or more PSs 1310 of PDDs 1300, 1300', and any of the PDD variations discussed in the present disclosure. Especially, reference circuit 1500 may be used for determining a control voltage for canceling out (or limiting) the effects of dark current in one or more PSs 1200 of a PDD based on data collected from a plurality of reference PSs 1310 which are varying to some extent (e.g., as a result of manufacturing inaccuracies, somewhat different operational conditions, etc.). As aforementioned, dark currents of PDs, even if similar, may be different from one another. It is noted that in some PD technologies, PDs intended to be identical may feature dark currents that are different by a factor of ×1.5, ×2, ×4, and even more. The averaging mechanism discussed herein allows to compensate for even such significant divergences (e.g., in manufacture). In cases amplifier 1318 is connected to a plurality of reference PSs 1310 for averaging dark current levels of several PSs 1310, such PSs 1310 are kept in the dark, e.g., using any of the mechanisms discussed above. The voltages applied to the different VCCSs 1304 of the various PSs 1310 are short-circuited such that all of the VCCSs 1304 receive substantially the same control voltage. The cathode voltages of the different reference PDs 1302 are short-circuited to different nets. This way, while the currents in the different reference PSs 1310 are somewhat different from one another (resulting from reference PSs 1310 being slightly different from one another), the average control voltage supplied to the one or more PSs 1200 of the respective PDD (which may also somewhat differ from one another and from reference PSs 1310) is sufficiently accurate for canceling out the effects of dark current on the different PSs 1200, and in a sufficiently uniform manner. Optionally, the output voltage of a single amplifier 1318 is supplied to all PSs 1200 and to all reference PSs 1310. Optionally, the selected PDs for the PDD have a flat I-V response (as discussed above, e.g., with respect to FIG. 14), such that the average control voltage discussed with respect to reference circuitry 1500 cancels out the dark current in the different PSs 1200 to a very good degree. Non-limiting examples of PDDs which include multiple reference PSs 1310 whose averaged output signals are used for modifying the output signals of multiple active PSs 1200 (e.g., to reduce effects of dark current of output signal) are provided in FIGS. 16A and 16B. Different configurations, geometries, and numerical ratios may be implemented between the reference PSs 1310 and the active PSs 1200 of a single PDD. For example, in a rectangular photodetecting array that includes a plurality of PSs arranged in rows and columns, an entire row of PSs (e.g., 1,000 PSs) or a few rows or columns of PSs may be used as the plurality of reference PSs 1310 (and optionally kept in the dark), while the rest of the array receives the control signal that is based on averaging the outputs of those reference PS rows. This way of generating control current greatly reduces the effects of dark current by removing the average dark current, leaving only PS-to-PS variations.

Figure 16A:
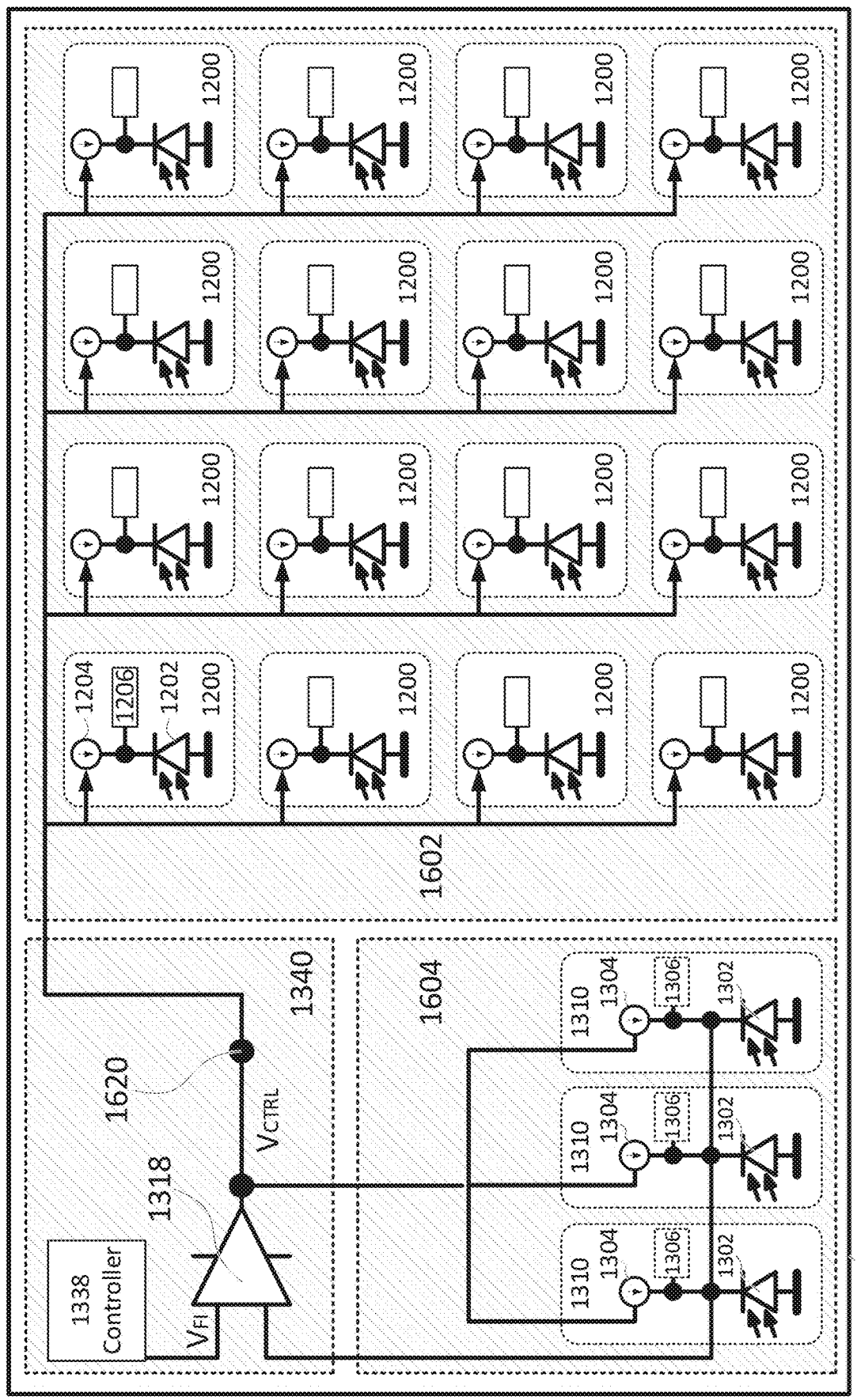
FIGS. 16A and 16B show PDDs which comprise an array of PSs and reference circuitry based on a plurality of PDs.
Figure 16B:
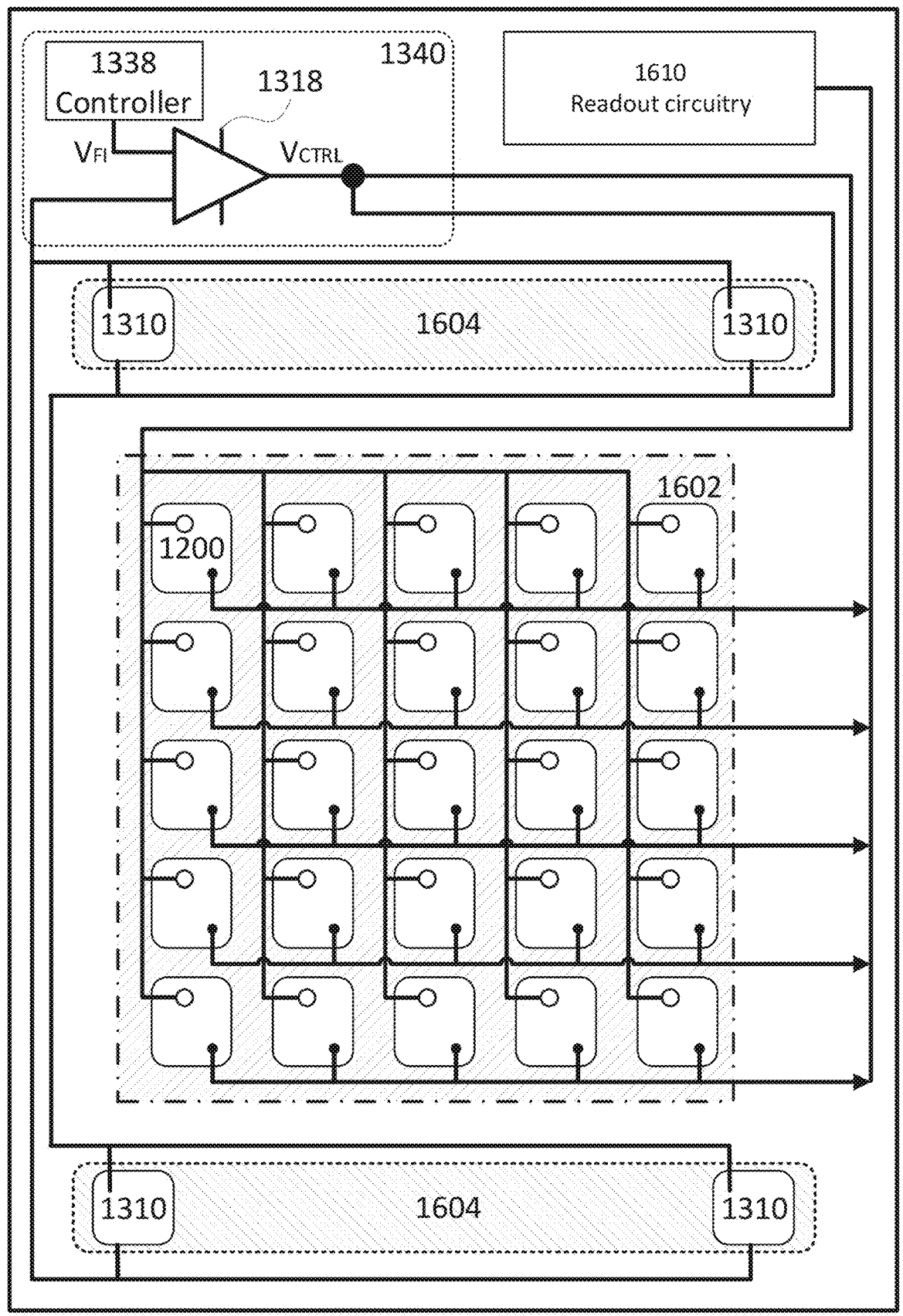

FIGS. 16A and 16B show photodetecting devices that comprise an array of PSs and reference circuitry which is based on a plurality of PDs, in accordance with examples of the presently disclosed subject matter. PDD 1600 (illustrated in FIG. 16A) and PDD 1600' (illustrated in FIG. 16B, which is a variation of PDD 1600) include all of the components of PDD 1300, as well as additional PSs 1200 and PSs 1310. Optionally, the different PSs of PDD 1600 (and, separately, of PDD 1600') are substantially identical to one another. Any option discussed above with respect to PDDs 1300 and 1300' as well as with respect to circuit 1500 may be applied, mutatis mutandis, to PDDs 1600 and 1600'.

FIG. 16A shows a photodetector device 1600 comprising a photosensitive area 1602 (which is exposed to external light during operation of photodetector device 1600) with a plurality (array) of PSs 1200, an area 1604 with a plurality of reference PSs 1310 that are kept in the dark (at least during reference current measurements, optionally at all times), and control-voltage generating circuitry 1340 which further includes controller 1338. Controller 1338 may control operation of amplifier 1318, voltages that are supplied to amplifier 1318, and/or operation of reference PSs 1310. Optionally, controller 1338 may also control operations of PSs 1200 and/or of other components of PDD 1600. Controller 1338 may control both active PSs 1200 and reference PSs 1310 to operate under the same operational conditions (e.g., bias, exposure time, managing readout regimes). It is noted that any functionality of controller 1338 may be implemented by an external controller (e.g., implemented on another processor of an EO system in which the PDD is installed, or by an auxiliary system such as a controller of an autonomous vehicle in which the PDD is installed). Optionally, controller 1338 may be implemented as one or more processors fabricated on the same wafer as other components of PDD 1600 (e.g., PSs 1200 and 1310, amplifier 1318). Optionally, controller 1338 may be implemented as one or more processors on a PCB connected to such a wafer. Other suitable controllers may also be implemented as controller 1338.

FIG. 16B shows a photodetector device 1600' in accordance with examples of the presently disclosed subject matter. Photodetector device 1600' is similar to device 1600, but with the components are arranged in a different geometry and without showing internal details of the different PSs. Also illustrated is readout circuitry 1610 which is used to read the detection signals from PSs 1200 and to provide them for further processing (e.g., to reduce noise, for image processing), for storage, or for any other use. For example, readout circuitry 1610 may temporally arrange the readout values of the different PSs 1200 sequentially (possibly after some processing by one or more processors of the PDD, not shown) before providing them for further processing, storage, or any other action. Optionally, readout circuitry 1610 may be implemented as one or more units fabricated on the same wafer as other components of PDD 1600 (e.g., PSs 1200 and 1310, amplifier 1318). Optionally, readout circuitry 1610 may be implemented as one or more units on a PCB connected to such a wafer. Other suitable readout circuitries may also be implemented as readout circuitry 1610. It is noted that a readout circuitry such as readout circuitry 1610 may be implemented in any of the photodetecting devices discussed in the present disclosure (e.g., PDDs 1300, 1700, 1800, and 1900). Examples for analog signal processing that may be executed in the PDD (e.g., by readout circuitry 1610 or by one or more processors of the respective PDD) prior to an optional digitization of the signal include: modifying gain (amplification), offset and binning (combining output signals from two or more PSs). Digitization of the readout data may be implemented on the PDD or external thereto.

Optionally, PDD 1600 (or any of the other PDDs disclosed in the present disclosure) may include a sampling circuitry for sampling the output voltage of amplifier 1318 and/or the control voltage $V_{CTRL}$ (if different), and for holding that voltage level for at least a specified minimum period of time. Such sampling circuitry may be positioned at any place between the output of amplifier 1318 and one or more of the at least one VCCSs 1204 (e.g., at location 1620). Any suitable sampling circuitry may be used; for example, in some cases, exemplary circuitry may include "sample and hold" switches. Optionally, the sampling circuitry may be used only some of the times, and direct real-time readout of the control voltage is executed in other times. Using a sampling circuitry may be useful, for example, when the magnitudes of dark currents in the system change slowly, when PSs 1310 are shielded from light only at parts of the times.

Figure 17:
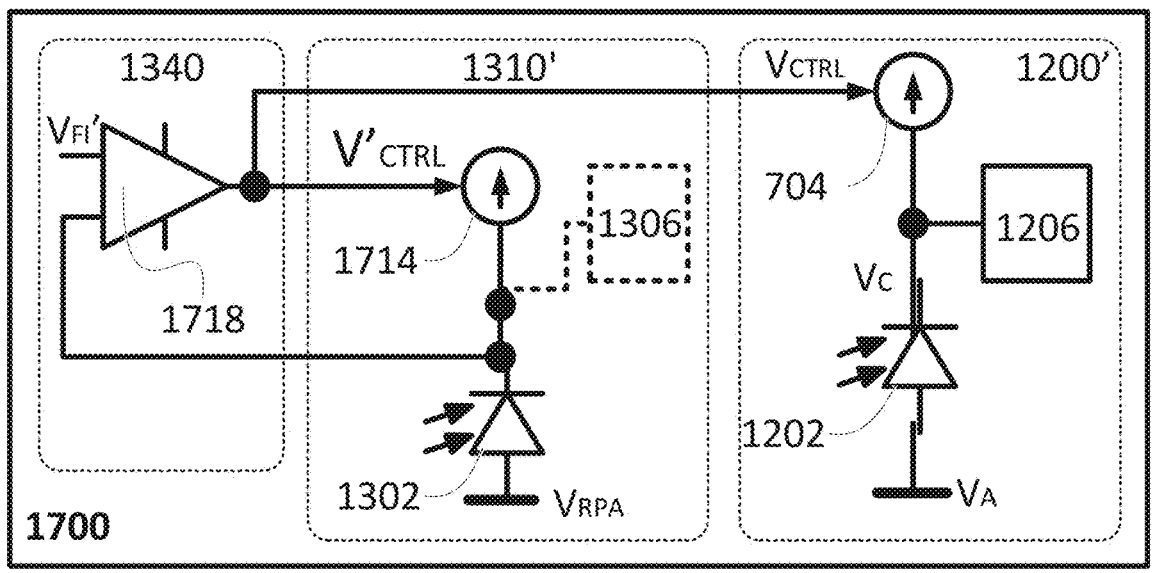
FIGS. 17 and 18 show PDDs, each comprising a PS and circuitry operative to reduce effects of dark current.
Figure 18:
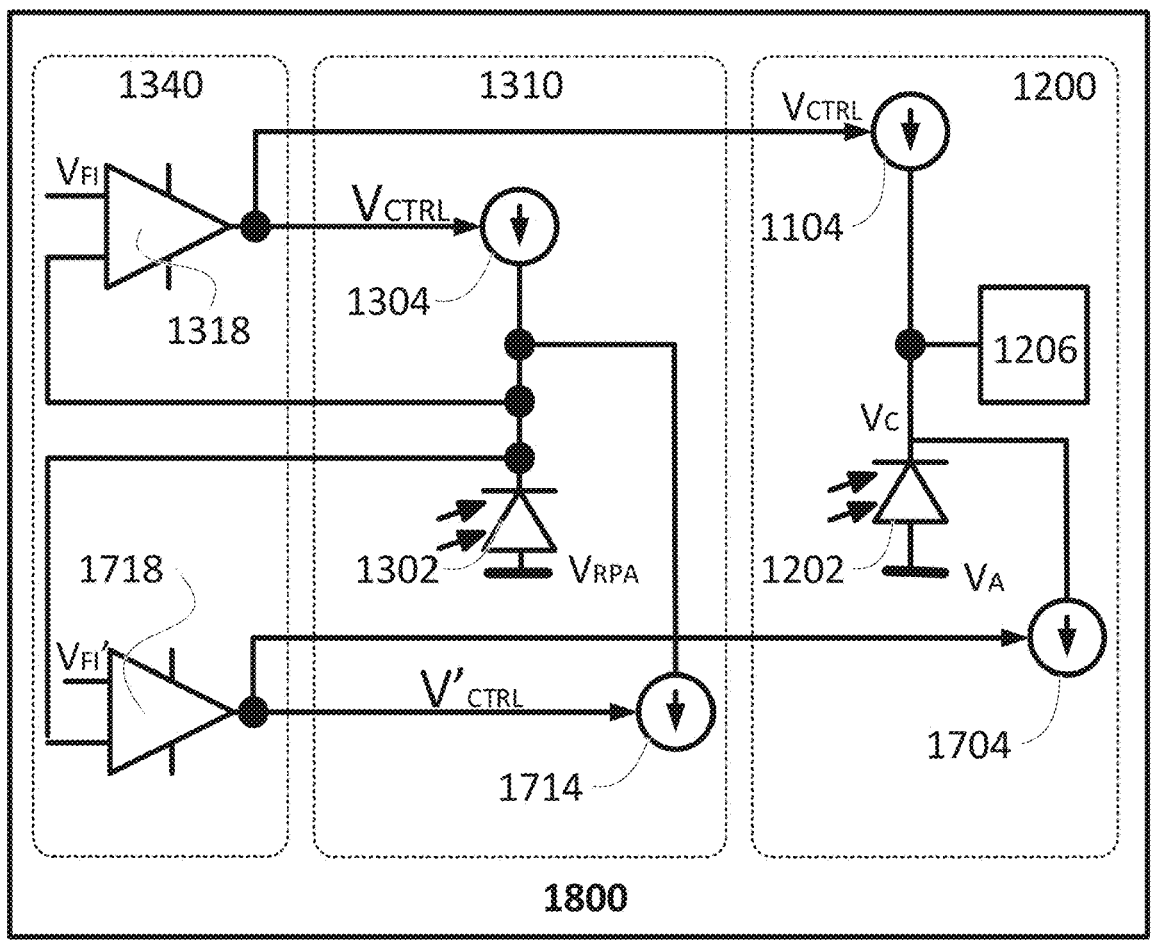

FIGS. 17 and 18 show more photodetecting devices in accordance with examples of the presently disclosed subject matter. In the photodetecting devices described above (e.g., 1300, 1300', 1600, 1600'), a voltage-controlled current source was used for both of the active PSs 1200 and the reference PSs 1310. A current source is one example of a voltage-controlled current-circuit which may be used in the disclosed PDD. Another type of voltage-controlled current-circuit which may be used is voltage-controlled current-sink, which absorbs current in magnitude which is controlled by the control voltage supplied to it. A current sink may be used, for example, in which the bias over the PDs (1202, 1302) is opposite in direction to the bias exemplified above. More generally, whenever a voltage-controlled current source is discussed above (1204, 1304), this component may be replaced by a voltage-controlled current sink (denoted, respectively, 1704 and 1714). It is noted that using a current sink instead of a current source may require using different types of components or circuits in other parts of the respective PDD. For example, an amplifier 1318 which is used together with VCCSs 1204 and 1304 is different in power, size, etc. than amplifier 1718 which is used together with voltage-controlled current sinks 1704 and 1714. To differentiate PSs which include voltage-controlled current sinks rather than VCCSs, the reference numbers 1200' and 1310' are used correspondingly to PSs 1200 and 1300 discussed above.

In FIG. 17, a PDD 1700 includes voltage-controlled current circuits that are voltage-controlled current sinks (in both PS 1200' and PS 1310'), and a suitable amplifier 1718 is used instead of amplifier 1318. All variations discussed above regarding current sources are equally applicable to current sinks.

In FIG. 18, a PDD 1800 includes both types of voltage-controlled current circuits-both voltage-controlled current sources 1204 and 1314 and voltage-controlled current sinks 1704 and 1714, with matching amplifiers 1318 and 1718. This may allow, for example, operating the PDs of PDD 1800 in either forward or reverse bias. At least one switch (or other selection mechanisms) may be used to choose which of the reference circuits is activated/deactivated—the one based on VCCSs or the one based on voltage-controlled current sinks. Such selection mechanism may be implemented, for example, to prevent the two feedback regulators working "against" one another (e.g., if working in near-zero biases over the PDs). Any option, explanation or variation discussed above with respect to any of the previously discussed PDDs (e.g., 1300, 1300', 1600, 1600') may be applied, mutatis mutandis, to PDDs 1700 and 1800. Especially, PDDs 1700 and 1800 may include a plurality of PSs 1200' and/or a plurality of reference PSs 1310', similar to the discussions above (e.g., with respect to FIGS. 15, 16A, and 16B).

It is noted that in any of the photodetecting devices discussed above, one or more of the PSs (e.g., of a photodetecting array) may optionally be controllable to be used selectively as a reference PS 1310 (e.g. at some times) or as a regular PS 1200 (e.g. at other times). Such PSs may include the required circuitry for operating in both roles. This may be used, for example, if the same PDD is used in different types of electro-optical systems. For example, one system may require the accuracy of averaging between 1,000 and 4,000 reference PSs 1310 while another system may require a lower accuracy which may be achieved by averaging between 1 and 1200 reference PSs 1310. In another example, averaging of control voltage based on some (or even all) of the PSs may be executed when the entire PDA is darkened and stored in a sample-and-hold circuitry as discussed above, and all of the PSs may be used for detection of FOV data using the determined control voltage in one or more following frames.

It is noted that in the discussion above, it was assumed for the sake of simplicity that the anode side of all PDs on the respective PDA are connected to a known (and possibly controlled) voltage, and the detection signals as well as connection of VCCSs and additional circuities is implemented on the cathode side. It is noted that optionally, the PDs 1202 and 1302 may be connected the opposite way (where the readout is on the anode side, and so on), mutatis mutandis.

Referring to all of the PDDs discussed above (e.g., 1300, 1600, 1700, 1800), it is noted that the PSs, the readout circuitry, the reference circuitry and the other aforementioned components (as well any additional components that may be required) may be implemented on a single wafer or on more than one wafer, on one or more PCBs or another suitable type of circuit connected to the PSs, and so on.

Figure 19:
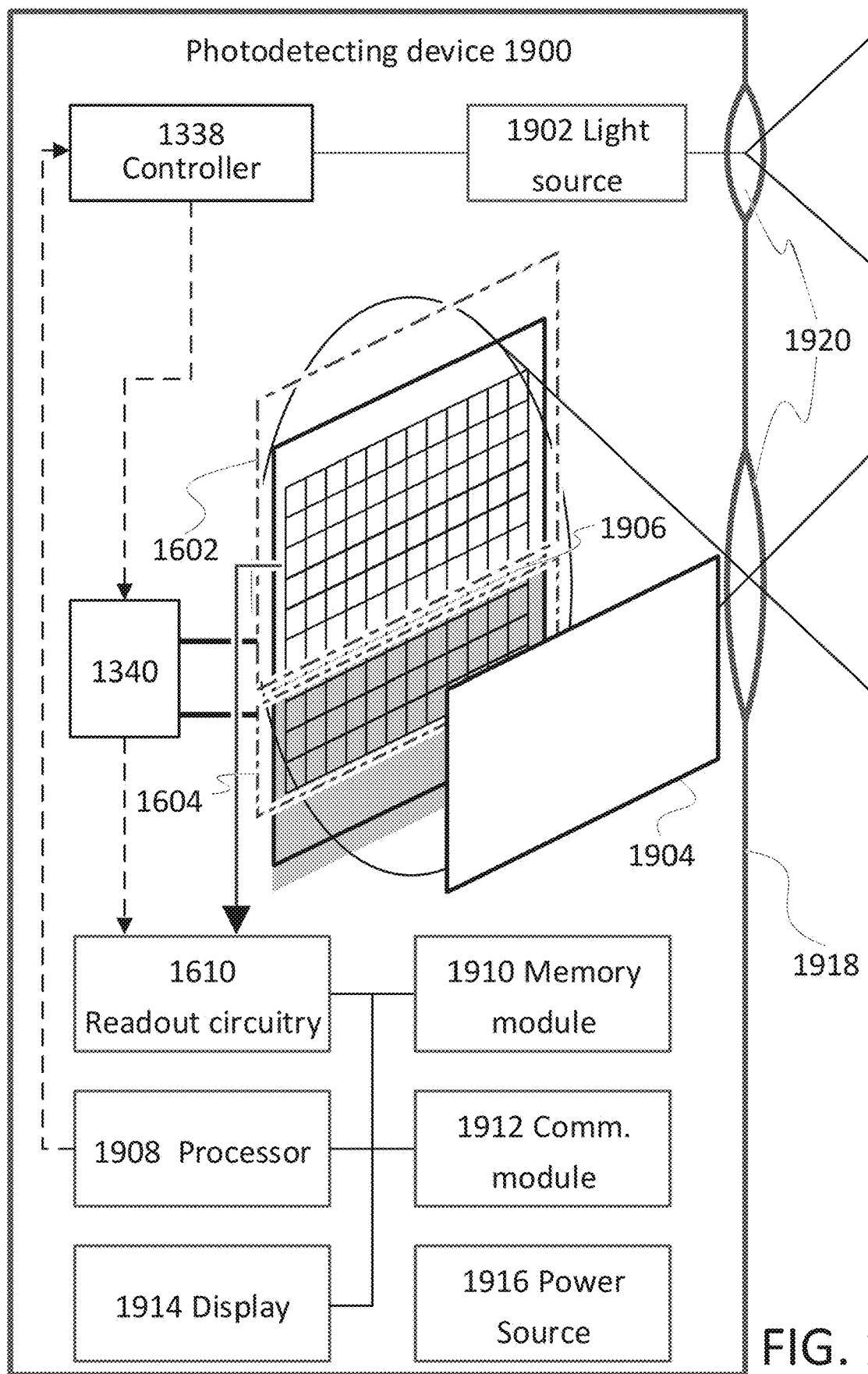
FIG. 19 illustrates a PDD that includes optics, a processor, and additional components.

FIG. 19 illustrates a PDD 1900, in accordance with examples of the presently disclosed subject matter. PDD 1900 may implement any combination of features from any one or more of the PDDs described above, and further include additional components. For example, PDD 1900 may include any one or more of the following components:

a. at least one light source 1902, operative to emit light onto the FOV of PDD 1900. Some of the light of light source 1902 is reflected from objects in the FOV and is captured by PS s 1200 in photosensitive area 1602 (which is exposed to external light during operation of photodetector device 1900) and is used to generated an image or another model of the objects. Any suitable type of light source may be used (e.g., pulsed, continuous, modulated, LED, laser). Optionally, operation of light source 1902 may be controlled by a controller (e.g., controller 1338).

b. a physical barrier 1904 for keeping area 1604 of the detector array in the dark. Physical barrier 1904 may be part of the detector array or external thereto. Physical barrier 1904 may be fixed or movable (e.g., a moving shutter). It is noted that other type of darkening mechanisms may also be used. Optionally, physical barrier 1904 (or other darkening mechanism) may darken different parts of the detection array in different times. Optionally, operation of barrier 1904, if changeable, may be controlled by a controller (e.g., controller 1338).

c. ignored photosites 1906. It is noted that not all PSs of the PDA are necessarily used for either detection (PSs 1200) or as reference (PSs 1310). For example, some PSs may reside in an area that is not entirely darkened and not entirely lit, and are therefore ignored in the generation of the image (or other type of output generated in response to the detection signals of PSs 1200). Optionally, different PSs may be ignored at different times by PDD 1900.

d. at least one processor 1908 for processing the detection signals output by PSs 1200. Such processing may include, for example, signal processing, image processing, spectroscopy analysis, and so on. Optionally, processing results by processor 1908 may be used for modifying operation of controller 1338 (or another controller). Optionally, controller 1338 and processor 1908 may be implemented as a single processing unit. Optionally, processing results by processor 1908 may be provided to any one or more of: a tangible memory module 1910 (for storage or later retrieval, see next), for external systems (e.g., a remote server, or a vehicle computer of a vehicle in which PDD 1900 is installed), e.g., via a communication module 1912, a display 1914 for displaying an image or other type of result (e.g., graph, textual results of spectrograph), another type of output interface (e.g. a speaker, not shown), and so on. It is noted that optionally, signals from PSs 1310 may also be processed by processor 1908, for example to assess a condition of PDD 1900 (e.g., operability, temperature).

e. a memory module 1910 for storing at least one of detection signals output by the active PSs or by readout circuitry 1610 (e.g., if different), and detection information generated by processor 1908 by processing the detection signals.

f. power source 1916 (e.g., battery, AC power adapter, DC power adapter). The power source may provide power to the PSs, to the amplifier, or to any other component of the PDD.

g. a hard casing 1918 (or any other type of structural support).

h. optics 1920 for directing light of light source 1902 (if implemented) to the FOV and/or for directing light from the FOV to the active PSs 1200. Such optics may include, for example, lenses, mirrors (fixed or movable), prisms, filters, and so on.

As aforementioned, the PDDs described above can be used for matching the control voltage determining the level of current provided by the at least one first voltage controlled current circuits (VCCCs) 1204 to account for differences in operation conditions of the PDD, which change the levels of dark current generated by the at least one PD 1202. For example, for a PDD that includes a plurality of PSs 1200 and a plurality of PSs 1320: when the PDD operates at a first temperature, control-voltage generating circuitry 1340 provides to the voltage controlled current circuit a control voltage for providing a current at a first level in response to dark currents of the plurality of reference PDs 1302, to reduce effect of dark currents of the active PDs 1202 on output of active PSs 1200; and when the PDD operates at a second temperature (higher than the first temperature), control-voltage generating circuitry 1340 provides to the voltage controlled current circuit a control voltage for providing a current at a second level in response to dark currents of the plurality of reference PDs 1302, to reduce effect of dark currents of the active PDs 1202 on output of active PSs 1200, such that the second level is larger in magnitude than the first level.

FIG. 20 is a flow chart of method 2000 for compensating for dark current in a photodetector, in accordance with examples of the presently disclosed subject matter. Method 2000 is executed in a PDD that includes at least: (a) a plurality of active PSs, each including at least one active PD;

(b) at least one reference PS that includes a reference PD; (c) at least one first VCCC connected to one or more active PDs; (d) at least one reference VCCC connected to one or more reference PDs; and (e) a control-voltage generating circuitry that is connected to the active VCCC and to the reference VCCC. For example, method 2000 may be executed in any of PDDs 1300', 1600, 1600', 1700, and 1800 (the latter two in implementations which include a plurality of active PSs). It is noted that method 2000 may include executing any action or function discussed above with respect to any component of the various aforementioned PDDs.

Method 2000 includes at least stages (stages) 2010 and 1020. Stage 2010 includes: based on a level (or levels) of dark current in the at least one reference PD, generating a control voltage that, when provided to the at least one reference VCCC causes the at least one reference VCCC to generate a current that reduces an effect of dark current of the reference PD on an output of the reference PS. Stage 2020 includes providing the control voltage to the at least one first VCCC, thereby causing the at least one first VCCC to generate a current that reduces an effect of dark current of the active PDs on outputs of the plurality of active PSs. VCCC stands for "Voltage Controlled Current Circuit", and it is implemented either as a voltage-controlled current source or as a voltage-controlled current sink.

Optionally, stage 2010 is implemented using an amplifier that is a part of the control-voltage generating circuitry. In such a case, stage 2010 includes supplying to a first input of the amplifier a first input voltage when a second input of the amplifier is electrically connected between the reference PD and the reference voltage controlled current circuit. The amplifier may be used to continuously reduce a difference between an output of the reference voltage-controlled circuit and the first input voltage, thereby generating the control voltage. Optionally, both the first VCCC(s) and the reference VCCC(s) are connected to an output of the amplifier.

In case the PDD includes a plurality of different reference PDs that generate different levels of dark current, stage 2010 may include generating a single control voltage based on averaging of the differing dark currents of the reference PDs.

Method 2000 may include preventing light from a field of view of the PDD from reaching the reference PDs (e.g., using a physical barrier or diverting optics).

Method 2000 may include sampling outputs of the active PSs after the reduction of the effects of dark current, and generating an image based on the sampled outputs.

FIG. 21 is a flow chart illustrating a method 1020 for compensating for dark current in a photodetecting device, in accordance with examples of the presently disclosed subject matter. Method 1020 have two phases which are executed in different temperature regimes; a first group of stages (1110-1116) is executed when the PDD operates in a first temperature ($T_1$), and a second group of stages (1120-1126) is executed when the PDD operates in a second temperature ($T_2$) which is higher than the first temperature. The degree by which the first temperature and the second temperature may be different in different implementations or in different instances of method 1200. For example, the temperature difference may be at least 5° C.; at least 10° C.; at least 20° C.; at least 40° C.; at least 100° C., and so on. Notably, method 1020 may be effective in even smaller temperature differences (e.g., less than 1° C.). It is noted that each of the first temperature and the second temperature may be implemented as a temperature range (e.g., spanning 0.1° C.; 1° C.; 5° C., or more). Any temperature in the second temperature range is higher than any temperature in the first temperature range (e.g., by the ranges mentioned before). Method 2000 may optionally be executed in any of the PDDs discussed above (1300, 1600, etc.). It is noted that method 1020 may include executing any action or function discussed above with respect to any component of the various aforementioned PDDs, and that the PDD of method 1020 may include any combination of one or more of the components discussed above with respect to any one or more of the aforementioned PDDs.

Referring to stages carried out when the PDD operates in the first temperature (which may be a first temperature range): Stage 2110 includes determining a first control voltage based on dark current of at least one reference PD of the PDD. Stage 2112 includes providing the first control voltage to a first VCCC which is coupled to at least one active PD of an active PS of the PDD, thereby causing the first VCCC to impose a first dark-current countering current in the active PS. Stage 2114 includes generating by the active PD a first detection current in response to: (a) light impinging of the active PD originating in an object in a field of view of the PDD, and (b) dark current generated by the active PD. Stage 2116 includes outputting by the active PS a first detection signal whose magnitude is smaller than the first detection current in response to the first detection current and to the first dark-current countering current, thereby compensating effect of dark current on the first detection signal. Method 1020 may also include optional stage 2118 of generating at least one first image of a FOV of the PDD based on a plurality of first detection signals from a plurality of PSs of the PDD (and optionally all of them). Stage 2118 may be executed when the PDD is at the first temperature, or at a later stage.

Referring to stages carried out when the PDD operates in the second temperature (which may be a second temperature range): Stage 2120 includes determining a second control voltage based on dark current of at least one reference PD of the PDD. Stage 2122 includes providing the second control voltage to the first VCCC, thereby causing the first VCCC to impose a second dark-current countering current in the active PS; Stage 2124 includes generating by the active PD a second detection current in response to: (a) light impinging of the active PD originating in the object, and (b) dark current generated by the active PD. Stage 2126 includes outputting by the active PS a second detection signal whose magnitude is smaller than the second detection current in response to the second detection current and to the second dark-current countering current, thereby compensating effect of dark current on the second detection signal. A magnitude of the second dark-current countering current is larger than a magnitude of the first dark-current countering current, and could be by any ratio larger than one. For example, the ration may be by a factor of at least two, or significantly higher (e.g., by one, two, three or more orders of magnitude). Method 1020 may also include optional stage 2128 of generating at least one second image of a FOV of the PDD based on a plurality of second detection signals from a plurality of PSs of the PDD (and optionally all of them). Stage 2128 may be executed when the PDD is at the second temperature, or at a later stage.

Optionally, a first level of radiation ($L_1$) from the object impinging on the active PD during a first time ($t_1$) at which the first dark-current countering current is generated is substantially equal to a second level of radiation ($L_2$) from the object impinging on the active PD during a second time ($t_2$) at which the second dark-current countering current is generated, wherein a magnitude of the second detection signal is substantially equal to a magnitude of the first detection signal. It should be noted that optionally, the PDD according to the present disclosure can be used to detect signal levels which are significantly lower than the levels of dark current generated its PDs at certain operational temperatures (e.g., by one, two or more orders of magnitude). Therefore, method 1020 may be used to issue similar levels of output signals in two different temperatures, in which the dark currents are two or more order of magnitudes larger than the detection signals, and significantly different than one another (e.g., by a factor ×2, ×10)

Optionally, the determining of the first control voltage and the determining of the second control voltage are executed by a control-voltage generating circuitry that includes at least one amplifier having an input electrically connected between the reference PD and a reference voltage controlled current circuit which is coupled to the reference PD.

Optionally, method 1020 may further include supplying to another input of the amplifier a first-input voltage whose level is determined corresponding to a bias on the active PD. Optionally, method 1020 may include supplying the first input voltage such that a bias on the reference PD is substantially the same as a bias on the active PD. Optionally, method 1020 may include determining the first control voltage and the second control voltage based on differing dark currents of a plurality of reference PDs of the PDD, wherein the providing of the first control voltage includes providing the same first control voltage to a plurality of first voltage controlled current circuits, each coupled to at least one active PD out of a plurality of active PDs of the PDD having differing dark currents, wherein the providing of the second control voltage includes providing the same second control voltage to the plurality of first voltage controlled current circuits, when the plurality of active PDs are having yet differing dark currents.

Optionally, different active PDs concurrently generate different levels of dark current, and concurrently different reference PDs generate different levels of dark current, and the control-voltage generating circuitry provides to the different active PDs a same control voltage based on averaging of the differing dark currents of the second PDs. Optionally, method 1020 may include directing light from the field of view to a plurality of active PSs of the PDD using dedicated optics, and preventing light from the field of view from reaching a plurality of reference PDs of the PDD.

FIG. 22 is a flow chart illustrating method 2200 for testing a photodetecting device, in accordance with examples of the presently disclosed subject matter. For example, the testing may be implemented by any of the aforementioned PDDs. That is, the same circuitries and architectures which were described above as being useful for reducing the effects of dark current may be put to additional use, to test the detection paths of the different PSs in real time. Optionally, the testing may be done while the PDD is in operational mode (i.e., not in testing mode). In some implementations, some PSs may be tested while exposed to ambient light from the FOV, and even when other PSs of the same PDD capture an actual image of the FOV (with or without compensation for dark current). It is nevertheless noted that method 2200 may also optionally be implemented in other types of PDDs. It is also noted that method 2200 may also optionally be implemented using circuitries or architectures similar to the ones discussed above with respect to the aforementioned PDDs, but when the PDs are not characterized by high dark current, and when no reduction of dark current is required or carried out. Method 2200 is described as applied to a single PS, but it may be applied to some or all PSs of a PDD.

Stage 2210 of method 2200 includes providing a first voltage to a first input of an amplifier of a control-voltage generating circuitry, wherein the second input of the amplifier is connected to a reference PD and to a second current circuit which supplies current in a level governed in response to an output voltage of the amplifier; thereby causing the amplifier to generate a first control voltage for a first current circuit of a PS of the PDD. Referring to the examples set forth with respect to the previous drawings, the amplifier may be amplifier 1318 or amplifier 1718, and the PS may be PS 1310 or PS 1310'. Examples of which first voltages may be provided to the first input are discussed below.

Stage 2220 of method 2200 includes reading a first output signal of the PS, generated by the PS in response to current generated by the first current circuit and to current generated by a PD of the PS.

Stage 2230 of method 2200 includes providing to the first input of the amplifier a second voltage which is different than the first input, thereby causing the amplifier to generate a second control voltage for the first current circuit. Examples of such second voltages may be provided are discussed below.

Stage 2240 of method 2200 includes reading a second output signal of the PS, generated by the PS in response to current generated by the first current circuit and to current generated by a PD of the PS.

Stage 2250 of method 2200 includes based on the first output signal and on the second output signal, determining a defectivity state of a detection path of the PDD, the detection path including the PS and readout circuitry associated with the PS. Examples of which types of defects may be detected while using different combinations of first voltage and second voltage are discussed below.

A first example includes using at least one voltage out of the first voltage and the second voltage to attempt to saturate the PS (e.g., by providing by the VCCS a very high current to the capacitance of the PS, regardless of the actual detection level). Failing to saturate the PS (e.g., receiving a detection signal which is not white-possibly completely black or halftoned) indicates on a problem in the relevant PS, or in further components in its readout path (e.g., PS amplifier, sampler, analog-to-digital converter). In such a case, the first voltage (for example) causes the amplifier to generate a control voltage which causes the first current circuit to saturate the PS. The determining of the defectivity state at stage 2250 in such a case may include determining that the detection path of that PS is malfunctioning in response to determining that the first output signal is not saturated. The second voltage in such a case may be one which does not cause saturation of the PS (e.g., which causes the VCCS to issue no current, to compensate for the dark current only, to prevent current from being collected by the capacitance). Testing whether a PS detection path can be saturated can be implemented in real time.

When attempting to saturate one or more of the PSs to test the PDD, method 2200 may include reading the first output signal while the PS is exposed to ambient light during a first detection frame of the PDD, where the determining of the malfunctioning status is executed after previously determining that the detection path is operative in response to reading a saturated output signal at a second detection frame which is earlier than the first frame. For example, during an ongoing operation of the PDD (e.g., while capturing a video), a PS may be determined as defective or unusable if saturation attempt failed, after it succeeded at a previous time during the same operation. The testing may be executed at a testing frame which is not part of the video, or for individual PSs whose saturated output is ignored (e.g., the pixel color corresponding to these PSs may be completed from neighboring pixels at the frame in which they are tested, treating these PSs as unusable for the span of this frame).

A second example includes using at least one voltage out of the first voltage and the second voltage to attempt to deplete the PS (e.g., by providing by the VCCS a very high opposite current to the capacitance of the PS, regardless of the actual detection level). Failing to deplete the PS (e.g., receiving a detection signal which is not black possibly completely white or halftoned) indicates on a problem in the relevant PS, or in further components in its readout path. In such a case, the second voltage (for example) causes the amplifier to generate a second control voltage which causes the first current circuit to deplete a detection signal resulting from field of view light impinging on the PS. The determining of the defectivity state at stage 2250 in such a case may include determining that the detection path is malfunctioning in response to determining that the second output signal is not depleted. The first voltage in such a case may be one which does not cause saturation of the PS (e.g., which causes the VCCS to issue no current, to compensate for the dark current only, to saturate the capacitance). Testing whether a PS detection path can be depleted can be implemented in real time (e.g., without darkening the respective PS).

When attempting to deplete one or more of the PSs to test the PDD, method 2200 may include reading of the second output signal while the PS is exposed to ambient light during a third detection frame of the PDD, wherein the determining of the malfunctioning status is executed after previously determining that the detection path is operative in response to reading a depleted output signal at a fourth detection frame which is earlier than the third frame.

Yet another example of using method 2200 to test a PS using applying of multiple control voltages includes applying more than two voltages. For example, three or more different voltages may be provided to the first input of the amplifier at different times (e.g., at different frames). In such a case, stage 2250 may include determining the defectivity state of the detection path of the PDD based on the first output signal, on the second output signal, and on at least one other output signal corresponding to the third or more voltages applied to the first input of the amplifier. For example, three, four, or more different voltages may be applied to the first input of the amplifier at different times (e.g., monotonously, where every voltage is greater than a previous voltage), and the output signals of the same PS corresponding to the different voltages may be tested to correspond to the applied voltages (e.g., the output signals are also monotonously increasing in magnitude).

An example of using method 2200 to test a portion of a PDD (or even all of it) includes reading from each out of a plurality of PSs of the PDD at least two output signals responsive to at least two different voltages provided to the amplifier of the respective PSs, determining for at least one first detection path an operative status based on the at least two output signals output by at least one PS associated with the respective first detection path, and determining for at least one second detection path an malfunctioning status based on the at least two output signals output by at least one other PS associated with the respective second detection path.

Optionally, method 2200 may be executed in combination with designated test targets (e.g., black target, white target), when the PDD is shielded from ambient light, and/or when using designated illumination (e.g., of a known magnitude, of a dedicated internal illumination, and so on), but not necessary so.

Optionally, stage 2250 may be replaced with determining an operational state of the detection path. This may be used, for example, to calibrate different PSs of the PDD to the same level. For example, when the PDD is darkened and without a dedicated target or dedicated illumination, the same voltage may be applied to VCCS of different PSs. the different output signals of the different PSs may be compared to one another (at one or more different voltages applied to the first input of the amplifier). Based on the comparison, correction values may be assigned to the different PSs detection paths, such they would provide a similar output signal for similar illumination level (which is simulated by the included current by the VCCSs of the different PSs). For example, it may be determined that the output of PS A should be multiplied by 1.1 to output a calibrated output signal to PS B. For example, it may be determined that a delta signal ΔS should be added to the output of PS C to output a calibrated output signal to PS D. nonlinear corrections may also be implemented.

Figure 23:
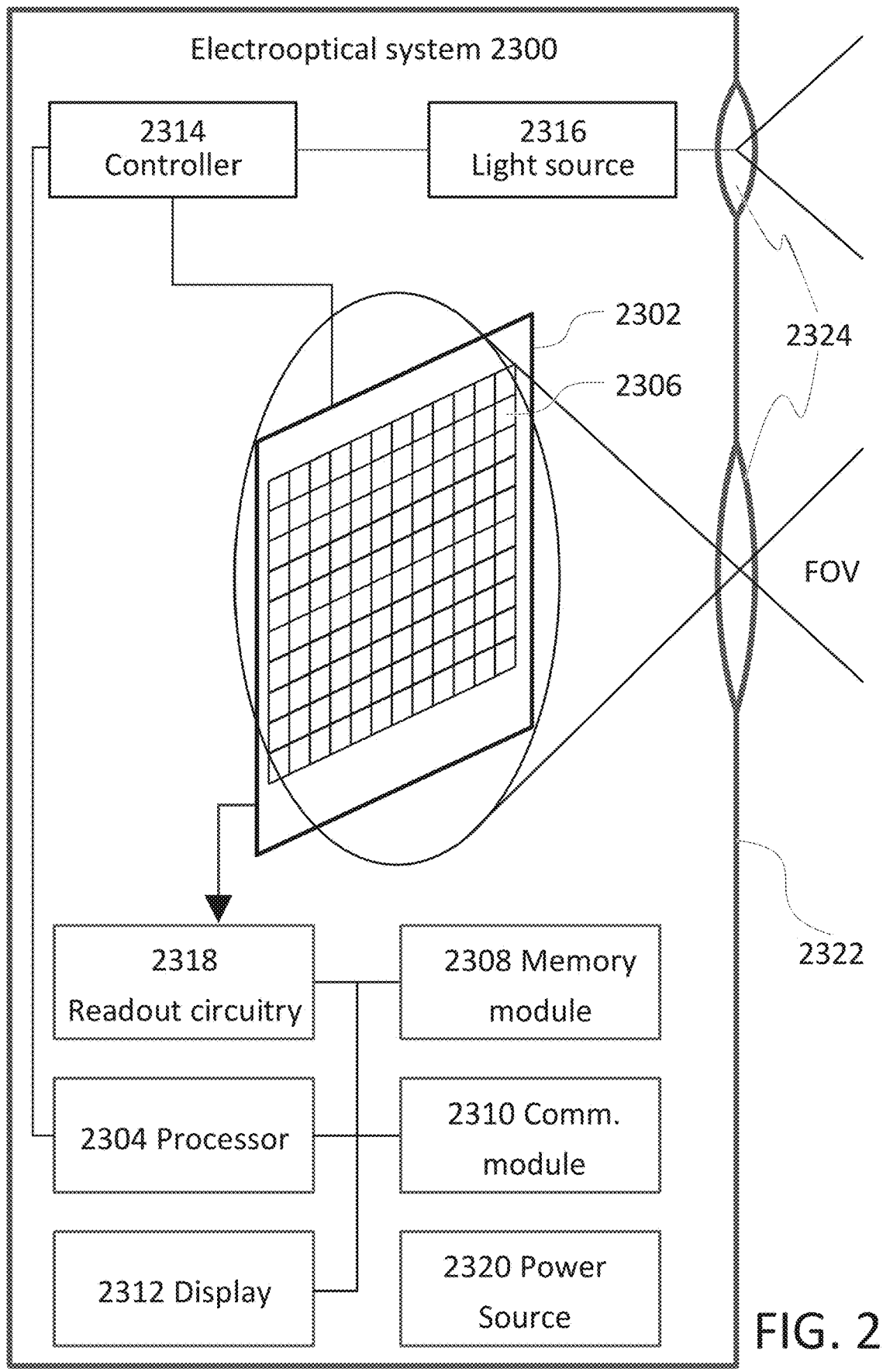
FIG. 23 illustrates an EO system according to some embodiments.

FIG. 23 illustrates an EO system 2300, in accordance with examples of the presently disclosed subject matter. EO system 2300 includes at least one PDA 2302 and at least one processor 2304 which is operative to process detection signals from PSs 2306 of the PDA. EO system 2300 may be any type of EO system which uses PDA for detection, such as a camera, a spectrograph, a LIDAR, and so on.

The at least one processor 2304 is operative to and configured for processing detection signals output by PSs 2306 of the at least one PDA 2302. Such processing may include, for example, signal processing, image processing, spectroscopy analysis, and so on. Optionally, processing results by processor 2304 may be provided to any one or more of: a tangible memory module 2308 (for storage or later retrieval), for external systems (e.g., a remote server, or a vehicle computer of a vehicle in which EO system 2300 is installed), e.g., via a communication module 2310, a display 2312 for displaying an image or other type of result (e.g., graph, textual results of spectrograph), another type of output interface (e.g. a speaker, not shown), and so on.

EO system 2300 may include a controller 2314 which controls operational parameters of EO system 2300 (e.g., of PDA 2302 and of an optional light source 2316). Especially, controller 2314 may be configured to set (or otherwise change) the frame exposure times used for the capturing of different frames by EO system 2300. Optionally, processing results of light detection signals by processor 2304 may be used for modifying operation of controller 2314. Optionally, controller 2314 and processor 2304 may be implemented as a single processing unit.

EO system 2300 may include at least one light source 2316, operative to emit light onto the field of view (FOV) of EO system 2300. Some of the light of light source 2316 is reflected from objects in the FOV and is captured by PSs 2306 (at least those PS which are positioned in a photosensitive area which is exposed to external light during frame exposure times of EO system 2300). Detection of light arriving from objects in the FOV (whether reflection of light source light, reflection of other light sources, or radiated light) is used to generated an image or another model (e.g., a three dimensional depth map) of the objects. Any suitable type of light source may be used (e.g., pulsed, continuous, modulated, LED, laser). Optionally, operation of light source 2316 may be controlled by a controller (e.g., controller 2314).

EO system 2300 may include a readout circuitry 2318 for reading out the electric detection signals from the different PSs 2306. Optionally, readout circuitry 2318 may process the electric detection signals before providing them to processor 2304. Such pre-processing may include, for example, amplification, sampling, weighting, denoising, correcting, digitalization, capping, level-adjustments, dark current compensation, and so on).

In addition, EO system 2300 may include additional components such as (but not limited to) any one or more of the following optional components:
  a. memory module 2308 for storing at least one of detection signals output by the PSs 2306 or by readout circuitry 2318 (e.g., if different), and detection information generated by processor 2304 by processing the detection signals.
  b. a power source 2320 such as a battery, an AC power adapter, a DC power adapter, and so on. Power source 2320 may provide power to the PDA, to readout circuitry 2318, or to any other component of EO system 2300.
  c. a hard casing 2322 (or any other type of structural support).
  d. optics 2324 for directing light of light source 2316 (if implemented) to the FOV and/or for directing light from the FOV to PDA 2300. Such optics may include, for example, lenses, mirrors (fixed or movable), prisms, filters, and so on.

Optionally, PDA 2302 may be characterized by relatively high dark current (e.g., as a result of the type and characteristics of its PDs). Because of the high level of dark current, the capacitances of the individual PSs 2306 in which detection charge is collected may become saturated (partly or fully) by the dark current, leaving little to no dynamic range for detection of ambient light (arriving from the FOV). Even if readout circuitry 2318 or processor 2304 (or any other component of system 2300) subtracts dark current levels from the detection signals (e.g., to normalize the detection data), the lack of dynamic range for detection means that the resulting detection signal of the respective PS 2306 is overly saturated, insufficient for meaningful detection of ambient light levels. Since dark current from the PD of the respective PS 2306 is accumulated in the capacitance (whether actual capacitor or parasitic or residual capacitance of other components of the PSs) for the entire duration of the frame exposure time (FET), different PSs 2306 with different capacitance may be rendered unusable at different FETs.

FIG. 24 illustrates an example of method 2400 for generating image information based on data of a PDA, in accordance with the presently disclosed subject matter. Referring to examples set forth with respect to the previous drawings, method 2400 may be executed by EO system 2300 (e.g., by processor 2304, controller 2314, etc.). In such a case, the PDA of method 2400 may optionally be PDA 2302. Other relevant components discussed in method 2400 may be the corresponding components of EO system 2300. Method 2400 includes changing a frame FET (FET) during which the PDA collects charges from its PD. Such collected charge may result from photoelectric response to light impinging on the PDs and from intrinsic sources within the detection system, such as from dark current of the PD. Impinging light may be arriving, for example, from a field of view (FOV) of a camera or another EO system in which the PDA is installed. The FET may be controlled electronically, mechanically, by controlling flash illumination duration and so on, or in any combination thereof.

It is noted that the FET may be an overall FET which is a summation of a plurality of distinct durations during which the PDA collects charge resulting from photoelectric activity in PSs of the PDA. An overall FET is used in cases charges collected during the different distinct durations are summed to provide a single output signal. Such overall FET may be used, for example, with pulsed illumination, or with active illumination during which collection is withheld for short times (e.g., to avoid being saturated by a bright reflection in the FOV). It is noted that optionally in some frames a single FET may be used, while in other frames an overall FET may be used.

Stage 2402 of method 2400 includes receiving first frame information. The first frame information includes—for each out of a plurality of PSs of a PDA—a first frame detection level indicative of an intensity of light detected by the respective PS during a first FET. The receiving of the first frame information may include receiving readout signals from all of the PSs of the PDA, but this is not necessarily so. For example, some PSs may be defective and not provide a signal. For example, a region of interest (ROI) may be defined for the frame, indicating data is to be collected from only a part of the frame, and so on.

The frame information may be provided in any format, such as a detection level (or levels) for each of the PSs (e.g., between 0 and 1024, three RGB values, each between 0 and 255, and so on), scalar, vector, or any other formats. Optionally, the frame information (for the first frame or for later frames) may optionally be indicative of detection signals in indirect manners (e.g., information pertaining to the detection level of a given PS may be given with respect to the level of a neighboring PS or with respect to the level of the same PS in a previous frame). The frame information may also include additional information (e.g., serial number, timestamp, operational conditions), some of which may be used in following steps of method 2400. The first frame information (as well as frame information for later frames, received in later stages of method 2400) may be received directly from the PDA, or from one or more intermediary units (such as intermediary processor, memory unit, data aggregator, and so on). The first frame information (as well as frame information for later frames, received in later stages of method 2400) may include the raw data as acquired by the respective PS, but may also include preprocessed data (e.g., after weighting, denoising, correcting, digitalization, capping, level-adjustments, and so on).

Stage 2404 includes identifying, based on the first FET, at least two types of PSs out of the plurality of PSs of the PDD:
  a. A group of usable PSs for the first frame (referred to as "first group of usable PSs"), that includes at least a first PS, a second PS, and a third PS of the PSs of the PDA.
  b. A group of unusable PSs for the first frame (referred to as "first group of unusable PSs"), that includes at least a fourth PS of the PSs of the PDA.

The identifying of stage 2404 may be implemented in different ways, and may optionally include identifying (explicitly or implicitly) each of the pluralities of PSs as belonging to one of the aforementioned at least two groups. Optionally, each PS of the PDA (or of a previously determined subgroup of it, such as all of the PSs of an ROI) may be assigned to one of the two pluralities with respect to the first frame—either the first group of usable PSs or the first group of unusable PSs. However, this is not necessarily so, and some of the PSs may be unassigned for some frames, or may be assigned to another plurality (e.g., a plurality of PSs whose usability will be determined based on parameters other than the FET of the respective first frame, such as based on collected data). Optionally, the identifying of stage 2404 may include determining which PSs qualify for one of the first pluralities of PSs, and automatically regarding the rest of the PSs of the PDA (or of a predetermined subgroup of it, such as ROI) as belonging to the other plurality of PSs of the two.

It should be noted that the identifying of stage 2404 (and of stages 2412 and 2402) does not have to reflect an actual usability states of the respective PSs (also in some implementations is does reflect these actual usability states). For example, a PS which was included in the first group of unusable PSs may in fact be usable in the conditions of the first frame, while another PS which was included in the first group of usable PSs may in fact be unusable in the conditions of the first frame. The identifying of stage 2404 is an estimation or assessment of the usability of PSs of the PDA, and not a testing of the respective PSs. It is also noted that usability of PSs may also be estimated in stage 2404 based on other factors. For example, a preexisting list of defective PSs may be used to exclude such PSs from being considered usable.

The identifying of stage 2404 (and of stages 2412 and 2420) may include identifying of at least one out of the groups of unusable PSs (and/or at least one out of the groups of usable PSs) based on compound FET that includes a sum of durations during which sampling PSs of the PDD are sensitive to light and which excludes intermediate times between the durations during which the sampling PSs are not sensitive to light.

The identifying of groups of usable and unusable PSs (in stages 2404, 2412 and/or 2420) may be partly based on an assessment of temperature. Optionally, method 2400 may include processing one or more frames (especially previous frames or the present frame) for determining a temperature assessment (e.g., by assessing dark current level in a dark frame, or in darkened PSs which do not image the FOV). Method 2400 may than include using the temperature assessment for identifying a group of usable PSs and a group of unusable PSs for a later frame, which affects the generating of the respective image. The assessment of temperature may be used in assessing how quickly will the dark current saturate the dynamic range of a given PS for the duration of the relevant FET. Optionally, the temperature assessment may be used as a parameter for utilizing a usability model of the PS (e.g., one which is generated in method 2500).

The timing of execution of stage 2404 with respect to the timing of execution of stage 2402 may vary. For example, stage 2404 may optionally be executed before, concurrently, partly-concurrently, or after stage 2402 is executed. Referring to the examples of the accompanying drawings, stage 2404 may optionally be carried out by processor 2304 and/or by controller 2314. Examples of methods for executing of the identifying of stage 2404 are discussed with respect to method 1100.

Stage 2406 includes generating a first image based on the first frame detection levels of the first group of usable PSs, disregarding first frame detection levels of the first group of unusable PSs. The generating of the first image may be implemented using any suitable method, and may optionally be based on additional information (e.g., data received from an active illumination unit, if used, data from additional sensors such as humidity sensors). Referring to the examples set forth with respect to the previous drawings, it is noted that stage 2406 may optionally be implemented by processor 2304. It is noted that the generating may include different stages of processing the signals (e.g., weighting, denoising, correcting, digitalizing, capping, level-adjustments, and so on).

With respect to the first group of unusable PSs, it is noted that since detection data by those PSs is ignored in the generating of the first image, replacement values could be computed in any suitable way (if required). Such replacement values may be computed, for example, based on first frame detection levels of neighboring PSs, based on earlier detection levels of earlier frames, either of the same PS (e.g., if usable in a preceding frame) or of one or more neighboring PSs (e.g., based on kinematic analysis of the scene). For example, a Wiener filter, local mean algorithms, non-local means algorithms, and so on may be used. Referring to the generating of images based on the PDA data, optionally the generating of any one or more of such images (e.g., the first image, the second image and the third image) may include computing a replacement value for at least one pixel associated with a PS identified as unusable for the respective image based on detection level of at least one other neighboring PS identified as usable for the respective image. In cases in which nonbinary usability assessment is used (and the identifying of stages 2404, 2412 and/or 2420 includes identifying at least one PS as belonging to a third group of PSs of partial usability), detection signals of each such PS identified as partly usable can be combined or averaged with detection signals of neighboring PSs and/or with other readings of the same PSs in other times in which it was usable (or partly usable).

Optionally, the generating of the first image (as well as that of the second image and the third image, later) may also include disregarding outputs of PSs which are determined as defective, inoperative or unusable for any other reason, or which are determined to have a defective, inoperative or unusable detection path. An example for additional method for detecting defectivity of PSs and/or associated detection paths is discussed with respect to method 2200, which may be combined with method 2400. The outputs of method 2200 may be used for the generating of stage 2406, 2414, and 2422. In such a case, method 2200 may be executed periodically and provide outputs for the generating of the images, or may be triggered specifically to be used in the generating of images according to method 2400.

Optionally, the generating of the first image (as well as that of the second image and the third image, later) may include computing a replacement value for at least one pixel associated with a PS identified as unusable for the respective image based on a detection level of the PS measured when the PS was identified as usable. Such information may be used together with information of neighboring PSs or independently from it. Using detection levels of a PS from other times may include, for example: taking into account detection levels from previous frames (e.g., for stationary scenes), using detection information from another snap of a series of image acquisitions used in generation of a compound image such as a High-dynamic-range image (HDRI) or a multiple-wavelength compound image (in which several shots are taken using different spectral filters and are then combined to a single image).

It is noted that in the first image (as well as in any other frames generated based on detection data of the PDA), a single pixel may be based on the detection data from a single PS or from a combination of PSs; likewise, the information from a single PSs may be used for determining pixel color of one or more pixels on the image. For example, a field of view of $\Theta$ by $\Phi$ degrees may be covered by X by Y PSs, and may be translated to M by N pixels in the image. A pixel value for one of those M×N pixels may be calculated as a sum of Pixel-Value(i,j)=$\Sigma(a_{p,s} \cdot DL_{p,s})$ for one or more PSs, where $DL_{p,s}$ is the detection level of PS (p,s) for that frame, and $a_{p,s}$ is an averaging coefficients for the specific pixel (i,j).

Following stage 2406, the first image may than be provided to an external system (e.g., a screen monitor, a memory unit, a communication system, an image processing computer). The first image may than be processed using one or more image processing algorithm. Following stage 2406, the first image may then be otherwise handled as desired.

Stages 2402 through 2406 may be reiterated several times for many frames captured by the photodetector sensor, whether consecutive frames or not. It is noted that in some implementations, the first image may be generated based on detection levels of several frames, e.g., if High-dynamic-range (HDR) imaging techniques are implemented. In other implementations, the first image is generated by on first frame detection levels of a single frame. Multiple instances of stages 2402 and 2406 may follow a single instance of stage 2404 (e.g., if using the same FET for several frames).

Stage 2408 is executed after receiving the first frame information, and includes determining a second FET which is longer than the first FET. The determining of the second FET includes determining a duration for the exposure of the relevant PDs (e.g., in milliseconds, parts thereof or multiples thereof). Stage 2408 may also include determining additional timing parameters (e.g., a start time for the exposure), but this is not necessarily so. The second FET, which is longer with respect to the first FET, may be chosen for any reason. Such a reason may include, for example, any one or more of the following: overall light intensity in the FOV, light intensity in parts of the FOV, employing bracketing techniques, employing high dynamic range photography techniques, changes in aperture, and so on. The second FET may be longer than the first FET by any ratio, whether relatively low (e.g., ×1.1 times, ×1.5 times), several times over (e.g., ×2, ×5) or any higher value (e.g., ×20, ×100, ×5,000). Referring to the examples of the accompanying drawings, stage 2408 may optionally be carried out by controller 2314 and/or by processor 2304. Optionally, an external system may determine the first FET or influence the setting of the FET by EO system 2300 (e.g., a control system of a vehicle in which EO system 2300 is installed).

It is noted that optionally, at least one of stage 2408 and stage 2416 may be replaced by do-determining together with such an external entity a new FET (the second FET and/or the third FET, respectively). Such an external entity may be, for example, an external controller, an external processor, an external system. It is noted that optionally, at least one of stage 2408 and stage 2416 may be replaced by receiving from an external entity an indication of a new FET (the second FET and/or the third FET, respectively). The indication of the FET may be explicit (e.g., duration in milliseconds) or implicit (e.g., indication of changes in aperture opening and/or exposure value (EV), indication of changes in lightning duration which correspond to the FET). It is noted that optionally, at least one of stage 2408 and stage 2416 may be replaced by receiving from an external entity an indication of changes to expected dark current (or at least of the part of the dark current which are transmitted to the capacitance of the PSs, e.g., if dark current mitigation strategies are implemented).

Stage 2410 includes receiving second frame information. The second frame information includes for each of the plurality of PSs of the PDA a second frame detection level which is indicative of an intensity of light detected by the respective PS during the second FET. It is noted that the second frame (during which the detection data for the second frame information is collected) may directly follow the first frame, but this is not necessarily so. FETs of any of the one or more intermediate frames (if any) between the first frame and the second frame may be equal to the first FET, the second FET, or any other FET (longer or shorter). Referring to the examples of the accompanying drawings, stage 2410 may optionally be carried out by processor 2304 (e.g., via readout circuitry 2318).

Stage 2412 includes identifying out of the plurality of PSs of the PDD, based on the second FET, at least two types of PSs of the PDA:

a. A group of usable PSs for the second frame (referred to as "second group of usable PSs"), that includes the first PS.
  b. A group of unusable PSs for the second frame (referred to as "a second group of unusable PSs") that includes the second PS, the third PS, and the fourth PS.

That is, the second PS and the third PSs which were identified in stage 2404 as belonging to the first group of usable PSs (i.e., the aforementioned group of usable PSs for the first frame), are identified in stage 2412 as belonging to the second group of unusable PSs (i.e., the aforementioned group of unusable PSs for the second frame), due to the longer FET for the second frame. The identifying of stage 2412 may be implemented in different ways, such as any one or more of those discussed above with respect to stage 2404. PSs which were considered as usable for shorter FET may be considered unusable in stage 2412 for the longer FET for various reasons. For example, if such PSs have charge storage capability (e.g., capacitance) which is lower than an average charge storage capability of PSs in the PDA, the charge storage capability of those PSs may be considered insufficient for both the detection signal and the accumulated dark current over longer integration time. Any PS which is rendered unusable in the first FET due to its inability to maintain sufficient dynamic range would also be identified as unusable for the longer second FET, if the dark current level is maintained (e.g., the temperature and bias on the PD are unchanged).

Stage 2412 is executed after stage 2408 (as it is based on the outputs of stage 2408). The timing of execution of stage 2412 with respect to the timing of execution of stage 2410 may vary. For example, stage 2412 may optionally be executed before, concurrently, partly-concurrently, or after stage 2410 is executed. Referring to the examples of the accompanying drawings, stage 2412 may optionally be carried out by processor 2304. Examples of methods for executing of the identifying of stage 2412 are discussed with respect to method 2500.

Stage 2414 includes generating a second image based on the second frame detection levels of the second group of usable PSs, disregarding second frame detection levels of the second group of unusable PSs. Significantly, stage 2414 includes generating the second image while ignoring the outputs (detection levels) of at least two PSs whose outputs were used in the generating of the first image. These at least two PSs are identified as usable based on the FET of the first frame, and are identified as usable for the generating of the first image (i.e., at least the second PS and the third PSs). The generating of the second image may be implemented using any suitable method, including any method, technique and variations discussed above with respect to the generating of the first image. With respect to the second group of unusable PSs, it is noted that since detection data by those PSs is ignored in the generating of the second image, replacement values could be computed in any suitable way (if required). Following stage 2414, the second image may than be provided to an external system (e.g., a screen monitor, a memory unit, a communication system, an image processing computer), may than be processed using one or more image processing algorithm, or may then be otherwise handled as desired.

Stages 2410 through 2414 may be reiterated several times for many frames captured by the photodetector sensor, whether consecutive frames or not. It is noted that in some implementations, the second image may be generated based on detection levels of several frames, e.g., if High-dynamic-range (HDR) imaging techniques are implemented. In other implementations, the second image is generated by on second frame detection levels of a single frame. Multiple instances of stages 2410 and 2414 may follow a single instance of stage 2412 (e.g., if using the same second FET for several frames).

Stage 2416 is executed after receiving the second frame information, and includes determining a third FET which is longer than the first FET and shorter than the second FET. The determining of the third FET includes determining a duration for the exposure of the relevant PDs (e.g., in milliseconds, parts thereof or multiples thereof). Stage 2416 may also include determining additional timing parameters (e.g., a start time for the exposure), but this is not necessarily so. The third FET may be chosen for any reason, such as the ones discussed above with respect to the determining of the second FET in stage 2408. The third FET may be longer than the first FET by any ratio, whether relatively low (e.g., ×1.1 times, ×1.5 times), several times over (e.g., ×2, ×5) or any higher value (e.g., ×20, ×100, ×5,000). The third FET may be shorter than the second FET by any ratio, whether relatively low (e.g., ×1.1 times, ×1.5 times), several times over (e.g., ×2, ×5) or any higher value (e.g., ×20, ×100, ×5,000). Referring to the examples of the accompanying drawings, stage 2416 may optionally be carried out by controller 2314 and/or by processor 2304. Optionally, an external system may determine the first FET or influence the setting of the FET by EO system 2300.

Stage 2420 of method 2400 includes receiving third frame information. The third frame information includes for each of the plurality of PSs of the PDA a third frame detection level which is indicative of an intensity of light detected by the respective PS during the third FET. It is noted that the third frame (during which the detection data for the third frame information is collected) may directly follow the second frame, but this is not necessarily so. FETs of any of the one or more intermediate frames (if any) between the second frame and the third frame may be equal to the second FET, the third FET, or any other FET (longer or shorter). Referring to the examples of the accompanying drawings, stage 2420 may optionally be carried out by processor 2304 (e.g., via readout circuitry 2318).

Stage 2420 includes identifying out of the plurality of PSs of the PDD, based on the third FET, at least two types of PSs of the PDA:
  a. A group of usable PSs for the third frame (referred to as "third group of usable PSs") that includes the first PS and the second PS.
  b. A group of unusable PSs for the third frame (referred to as "a third group of unusable PSs") that includes the third PS and the fourth PS.

That is, the second PS which was identified in stage 2404 as belonging to the first group of usable PSs (i.e., the aforementioned group of usable PSs for the first frame) is identified in stage 2420 as belonging to the third group of unusable PSs (i.e., the aforementioned group of unusable PSs for the third frame), due to the longer FET for the third frame with respect to the first frame. The third PS which was identified in stage 2412 as belonging to the second group of unusable PSs (i.e., the aforementioned group of unusable PSs for the second frame) is identified in stage 2420 as belonging to the third group of usable PSs (i.e., the aforementioned group of usable PSs for the third frame), due to the shorter FET for the third frame with respect to the second frame.

The identifying of stage 2420 may be implemented in different ways, such as any one or more of those discussed above with respect to stage 2404. PSs which were considered as usable for shorter FET may be considered unusable in stage 2420 for the longer FET for various reasons, e.g., as discussed above with respect to stage 2412. PSs which were considered as unusable for longer FET may be considered usable in stage 2420 for the shorter FET for various reasons. For example, if such PSs have charge storage capability (e.g., capacitance) which is larger than that of some of the PSs in the second group of unusable PSs, the charge storage capability of those differing PSs may be considered sufficient for both the detection signal and the accumulated dark current over a shorter integration time than the second FET.

Stage 2420 is executed after stage 2416 (as it is based on the outputs of stage 2416). The timing of execution of stage 2420 with respect to the timing of execution of stage 2416 may vary. For example, stage 2420 may optionally be executed before, concurrently, partly-concurrently, or after stage 2416 is executed. Referring to the examples of the accompanying drawings, stage 2420 may optionally be carried out by processor 2304 and/or by controller 2314. Examples of methods for executing of the identifying of stage 2420 are discussed with respect to method 1100.

Stage 2422 includes generating a third image based on the third frame detection levels of the third group of usable PSs, disregarding third frame detection levels of the third group of unusable PSs. Significantly, stage 2422 includes generating the third image while ignoring the outputs (detection levels) of at least one PS whose outputs were used in the generating of the first image (e.g., the second PS) while utilizing the outputs of at least one PS whose outputs were ignored in the generating of the second image (e.g., the third PS). The generating of the third image may be implemented using any suitable method, including any method, technique and variations discussed above with respect to the generating of the first image. With respect to the third group of unusable PSs, it is noted that since detection data by those PSs is ignored in the generating of the third image, replacement values could be computed in any suitable way (if required). Following stage 2422, the third image may than be provided to an external system (e.g., a screen monitor, a memory unit, a communication system, an image processing computer). Following stage 2422, the third image may than be processed using one or more image processing algorithm. Following stage 2422, the third image may then be otherwise handled as desired.

Optionally, the generating of one or more images in method 2400 (e.g., the first image, the second image, the third image) may be based on a previous stage of assessing dark current accumulation of at least one of the PSs for the respective image (e.g., based at least on the respective FET, on electrical measurement during the capturing of the light signal or close thereto, and so on. For example, such measurement may include measuring dark current (or another indicative measurement) on a reference PS kept in the dark. The generating of the respective image may include subtracting from the detection signal of one or more PSs a magnitude which is related to the dark current assessment for that PS, to give a more accurate representation of the FOV of the PDA. Optionally, this stage of compensating for dark current accumulation is carried out only for usable PSs for the respective image.

In a PDA which is characterized by relatively high dark current (e.g., as a result of the type and characteristics of its PDs), the capacitance of the individual PSs in which detection charge is collected may become saturated (partly or fully) by the dark current, leaving little to no dynamic range for detection of ambient light (arriving from a field of view of the system). Even when means for subtracting dark current levels from the detection signals are implemented (e.g., to normalize the detection data), the lack of dynamic range for detection means that the resulting signal is completely saturated, or insufficient for meaningful detection of ambient light levels. Since dark current from the PD is accumulated in the capacitance (whether actual capacitor or parasitic or residual capacitance of other components of the PSs) for the FET, the method uses the FET for determining that the PS is usable for the respective FET—is there sufficient dynamic range left in the capacitance after the charge of the dark current (or at least relevant part thereof) is collected for the entire FET. The identifying of a group of unusable PSs for a frame may include identifying PSs whose dynamic range is below an acceptable threshold (or is otherwise expected to fail a dynamic range sufficiency criterion) given the FET of the respective frame. Likewise, the identifying of a group of usable PSs for a frame may include identifying PSs whose dynamic range is above an acceptable threshold (or is otherwise expected to meet a dynamic range sufficiency criterion) given the FET of the respective frame. The two aforementioned thresholds of acceptability may be the same threshold or different threshold (for example, if PSs whose dynamic range are between those thresholds are treated differently, e.g., are identified as belonging to a partly usable group of PSs for the relevant frame).

Referring to method 2400 as a whole, it is noted that additional instances of stages 2416, 2418, 2420 and 2422 may be repeated for additional FETs (e.g., a fourth FET and so on). Such time may be longer, shorter, or equal to any of the previously used FETs. It is also noted that optionally, the first FET, the second FET, and the third FET are consecutive FETs (i.e., not other FETs are used by the PDA between the first FET and the third FET). Alternatively, other FETs may be used between the first FET and the third FET.

It is noted that different groups of usable PSs and unusable PSs may be determined for different FETs in method 2400, even if the exposure value (EV) remains the same. For example, consider a case in which the first FET is extended by a factor q to provide the second FET, but the f number is increased by a factor of q, such that the overall illumination received by the PDA is substantially the same. In such a case, even though the EV remains constant, the second group of unusable PSs would include PS other than those included in the first group of unusable PSs, because the dark current accumulation will grow by a factor of q.

A non-transitory computer-readable medium is provided for generating image information based on data of a PDA, including instructions stored thereon, that when executed on a processor, perform the steps of: receiving first frame information comprising for each out of a plurality of PSs of the PDA a first frame detection level indicative of an intensity of light detected by the respective PS during a first FET; based on the first FET, identifying out of the plurality of PSs of the PDD: a first group of usable PSs comprising a first PS, a second PS, and a third PS, and a first group of unusable PSs comprising a fourth PS; generating a first image based on the first frame detection levels of the first group of usable PSs, disregarding first frame detection levels of the first group of unusable PSs; (d) determining, after receiving the first frame information, a second FET which is longer than the first FET; receiving second frame information comprising for each of the plurality of PSs of the PDA a second frame detection level indicative of an intensity of light detected by the respective PS during a second FET; based on the second FET, identifying out of the plurality of PSs of the PDD: a second group of usable PSs comprising the first PS, and a second group of unusable PSs comprising the second PS, and the third PS, and the fourth PS; generating a second image based on the second frame detection levels of the second group of usable PSs, disregarding second frame detection levels of the second group of unusable PSs; determining, after receiving the second frame information, a third FET which is longer than the first FET and shorter than the second FET; receiving third frame information comprising for each of the plurality of PSs of the PDA a third frame detection level indicative of an intensity of light detected by the respective PS during a third FET; based on the third FET, identifying out of the plurality of PSs of the PDD: a third group of usable PSs comprising the first PS and the second PS, and a third group of unusable PSs comprising the third PS and the fourth PS; and generating a third image based on the third frame detection levels of the third group of usable PSs, disregarding third frame detection levels of the third group of unusable PSs.

The non-transitory computer-readable medium of the previous paragraph may include additional instructions stored thereon, that when executed on a processor, perform any other step or variation discussed above with respect to method 2400.

Figure 25:
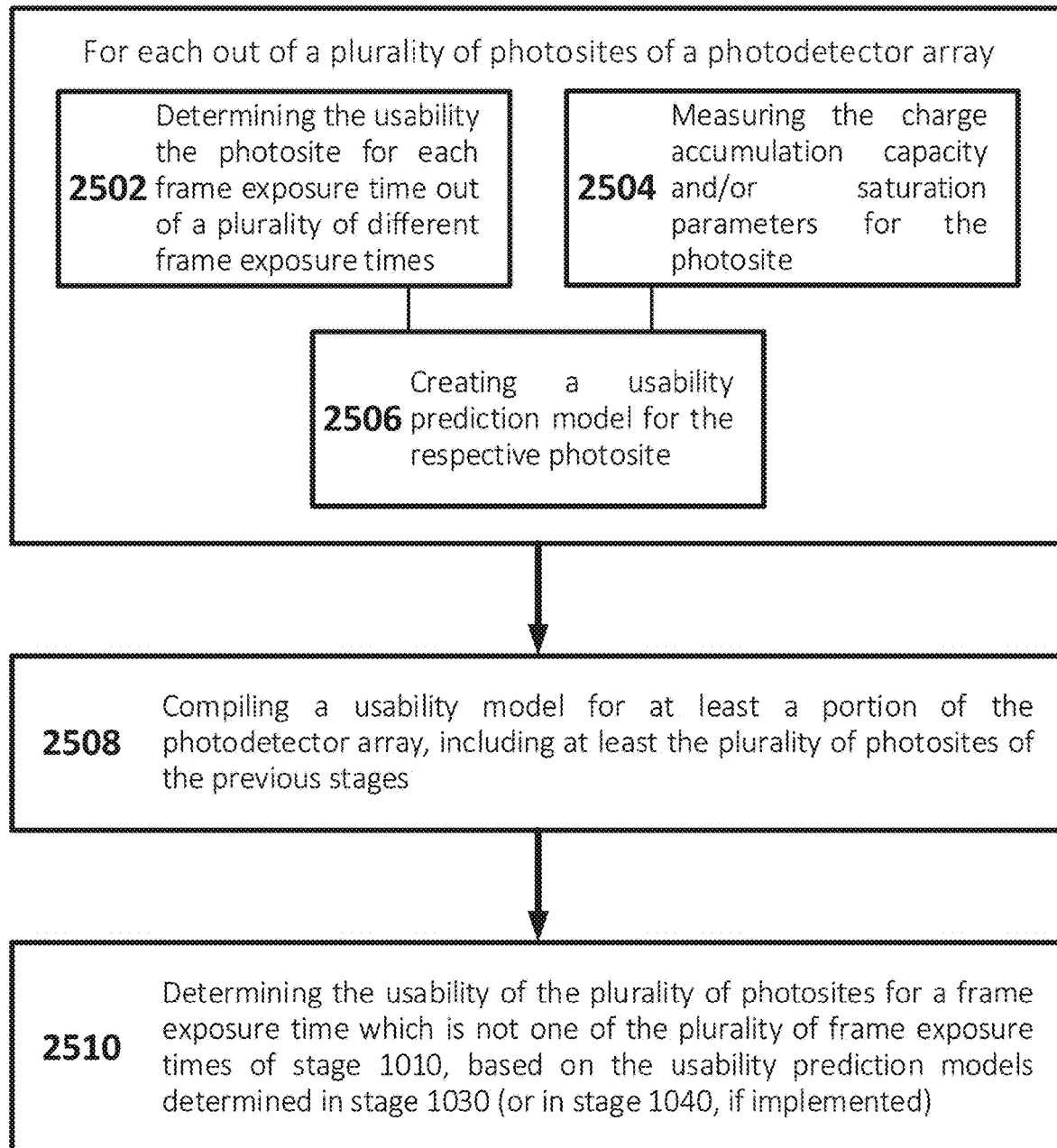
FIGS. 25 and 26 show respectively a flow chart illustrating a method for generating a model for PDA operation in different frame exposure times, and a graphical representation of execution of that method for different frames which are taken of the same scene in different frame exposure times.

FIG. 25 is a flow chart illustrating method 2500 for generating a model for PDA operation in different FETs, in accordance with examples of the presently disclosed subject matter. Identifying which of the PSs belong to a group of usable PSs provided with a given FET (and possibly additional parameters, such as temperature, biases on PDs, PSs capacitance, etc.) may be based on a model of the behavior of each of the PSs at different FETs. Such modeling may be part of method 2400 or may be executed separately before it. Stages 2502, 2504 and 2506 of method 2500 are executed for each out of a plurality of PSs of the PDA (e.g., PDA 1 602), and possibly for all of the PSs of the photodetector array.

Stage 2502 includes determining the usability of the respective PS for each FET out of a plurality of different FETs. The determining of the usability may be executed in different ways. For example, a detection signal of the PS may be compared to an expected value (e.g., if illumination level is known—possibly completely dark, or a known higher illumination level), to an average of other PSs, to detection levels in other PSs (e.g., if all PSs are imaging a chromatically uniform target), to detection results in other FETs (e.g., determining if the detection level at duration T—for example, 200 nanoseconds—is about double the detection level at T/2—in that example, 330 nanoseconds), and so on. The determined usability may be a binary value (e.g., usable or unusable), a non-binary value (e.g., a scalar assessing level of usability or indicative thereof), a set of values (e.g., a vector), or any other suitable format. Optionally, the same plurality of frame FETs is used for all of the plurality of PSs, but this is not necessarily so. For example, in a non-binary usability assessment, an intermediate value between completely unusable to fully usable may indicate that the detection signal of the respective PS should be combined or averaged with detection signals of neighboring PSs and/or with other readings of the same PSs in other times in which it was usable (or partly usable).

Method 2500 may include an optional stage 2504 of measuring the charge accumulation capacity and/or saturation parameters for the respective PS. The charge capacity may be measured in any suitable way, e.g., using current coming from the PD, from other source in the PS (e.g., current source), from other source in the PDA, or from an external source (e.g., calibration machine in the manufacturing facility in which the photodetector is manufactured). Stage 2504 may be omitted, for example, in case the difference is capacitance between the different PSs are negligible or simply ignored.

Stage 2506 includes creating a usability prediction model for the respective PS, which provides estimation of usability of the PS when operated under different FET which are not included in the plurality of FETs for which the usability was actively determined in stage 2502. The different FETs may be included in the same span of durations of the plurality of FETs of stage 2502, longer from it, or shorter from it. The created usability prediction model may provide different types of usability indications, such as: a binary value (e.g., usable or unusable), a nonbinary value (e.g., a scalar assessing level of usability or indicative thereof), a set of values (e.g., a vector), or any other suitable format. The usability type indicated by the model may be the same type of usability determined in stage 2502 or different thereof. For example, stage 2502 may include assessing the dark current collected in different FETs, while stage 2504 may include determining a temporal threshold which indicates the maximal permissible FET for this PS to be considered usable. Optionally, the usability model may take into account the charge accumulation capacity of the respective PS.

Any suitable way may be used for creating the usability prediction model. For example, different dark currents may be measured or assessed for the PD for different FETs, followed by a regression analysis to determine a function (polynomial, exponential, etc.) which allow assessing the dark current in other FETs.

Optional stage 2508 includes compiling a usability model for at least a portion of the PDA, including at least the plurality of PSs of the previous stages. For example, stage 2508 may include generating one or more matrixes or other types of maps which store model parameters in its cells for the respective PSs. For example, if stage 2506 includes creating a dark current linear regression function for each PS (p,s) is provided by $DarkCurrent(p,s)=A_{p,s} \cdot \tau + B_{p,s}$ (where T is the FET and $A_{p,s}$ and $B_{p,s}$ are the linear coefficients of the linear regression), than a matrix A may be generated for storing the different Aps values, and a matrix B may be generated for storing the different $B_{p,s}$ values. If needed, a third matrix C may be used for storing a different capacitance values $C_{p,s}$ (or different saturation values $S_{p,s}$) for the different PSs.

Stage 2506 (or stage 2508, if implemented) may be followed by optional stage 2510 that includes determining the usability of the plurality of PSs for a FET which is not one of the plurality of FETs of stage 2502 based on the results of stage 2506 (or of stage 2508, if implemented). For example, stage 2510 may include creating a mask (e.g., a matrix) of unusable PSs for the different PSs of the photodetector array.

Referring to method 2500 in its entirety, stage 2502 may include determining the dark current for each PS of the PDA at four different FETs (e.g., 33 ns, 330 ns, 600 ns, and 2000 ns). Stage 2504 may include determining a saturation value for each of the PSs, and stage 2506 may include creating a polynomial regression for dark current accumulation over time for each of the PSs. Stage 2508 in this example may include generating a matrix, storing in each cell the FET in which the dark current of that PS (according to the regression analysis) will saturate the PS. Stage 2510 may include receiving a new FET, and determining for each cell of the matrix if it is lower or higher than the stored value, following by generating a binary matrix storing a first value (e.g., "0") for each unusable PS (in which the FET is higher than the stored value) and a second value (e.g., "1") for each usable PS (in which the FET is lower than the stored value).

Any stage of method 2500 may be carried out during manufacturing of the PDA (e.g., during factory calibration), during operation of the system (e.g., after an EO system which includes the PDA is installed in its designated location such as a vehicle, surveillance system, etc.), or in any other suitable time between or after those times. Different stages may be carried out in different times.

Referring to method 2400 in its entirety, it is noted that the different stages may be extended to measure effects of dark current on the different PSs in different FETs under different operational conditions (e.g., when different subject to different temperatures, when different biases are applied to the PDs), mutatis mutandis.

Optionally, the determining of a FET as part of method 2400 (e.g., the second FET, the third FET) may include maximizing the respective FET while maintaining a number of unusable PSs for the respective frame below a predetermined threshold. For example, to maximize collection of signals, method 2400 may include setting a FET which is approaching a threshold which correlates to a predetermined number of unusable PSs (e.g., requiring at least 99% of the PDA PSs to be usable, permitting up to 1% of the PSs to be unusable). It is noted that is some cases the maximizing may not yield the exact maximal duration, but a duration which is close to it (e.g., above 320% or above 325% of the mathematically maximal duration). For example, the maximal frame duration out of discrete predefined time spans may be selected.

For example, a determining of a FET as part of method 2400 may include determining a FET which is longer than other possible FETs, thereby causing more PSs than a previous FET, thereby causing a higher number of PSs deemed unusable in comparison to such other possible FETs, but improving the image quality in the remaining PSs. This may be useful, for example, in relatively dark conditions. It is noted that optionally, the determining of the FET (e.g., by way of attempting to maximize it) may take into consideration the spatial distribution of PSs which are considered unusable in different FETs. For example, knowing that in some area of the PDA there is an accumulation of PSs with high percentage of PSs which will be deemed unusable above a certain FET may cause determining a FET which is lower than that threshold, especially if this an important part of the FOV (e.g., in a center of the FOV, or where pedestrians or vehicles were identified in a previous frame).

Method 2400 may include creating a single image based on detection levels of two or more frames which are detected at different FETs, in which different groups of unusable PSs are used for the different FETs. For example, three FETs may be used: ×1, ×10, and ×100. The color determined for each pixel of the image may be determined based on the detection levels of one or more PSs (e.g., at FETs in which the PS is usable, not saturated, and detecting a nonnegligible signal) or on detection levels of neighboring PSs (e.g., if not providing any usable detection signal, even in cases in which the respective PS is determined to be usable, such as because in such times the signal is negligible). Method 2400 may include determining a plurality of FETs for combining different exposures to a single image (e.g., using High-Dynamic-Range imaging techniques-HDR). The determining of such FETs may be based on modeling of the usability of different PSs in different FETs such as the model generated in method 2500. Method 2400 may also include determining to capture a single image in two or more distinct detection instances (where the detection signals are read separately in each instance and are later summed), each of which providing sufficient usable PSs. For example, instead of taking a single capture of a scene using 2 milliseconds FET, method 2400 may include determining to capture the scene twice (e.g., two 1 ms FETs, a 1.5 ms and a 0.5 ms FETs), such that the number of usable PSs in each exposure would exceed a predetermined threshold.

Optionally, method 2400 may include determining at least one of the FETs based on a usability model of the different PSs in different FETs (e.g., generated in method 2500) and on saturation data of at least one previous frame captured by the PDA. The saturation data includes information about PSs which were saturated in at least one FET of at least one previous frame (e.g., number of PSs, which PSs, which parts of the PDA) and/or about which PSs were almost saturated in at least one FET of at least one previous frame. The saturation data may pertain to the immediately preceded frame (or several frame), so it is indicative on saturation behavior for a curtain imaged scene.

Method 2400 may further include modeling usability of PSs of the PDA at different FETs (e.g., by implementing method 2500 or any other suitable modeling method). Provided a model of usability of PSs of the PDA at different FETs (either as part of method 2400 or not), method 2400 may include: (a) determining of at least one FET out of the second FET and the third FET based on results of the modeling; and/or (b) identifying of at least one out of the groups of unusable PSs based on results of the modeling.

Optionally, in determining any one or more of the FETs, method 2400 may include determining a FET which balances between extending the FET due to darkness of the FOV scene and reducing of the FET to limit the amount of PSs rendered unusable which rises in longer FET (e.g., based on the model of method 2500). For example, when working in the same temperature and bias on the PD (such that the dark current in each FET remains constant), stage 2408 may include determining a longer FET because the scene got darker (at the expense of a larger number of unusable PSs), and stage 2416 may include determining a shorter FET because the scene got brighter again (thereby reducing the number of unusable PSs). This is especially relevant in darker images, where usability of PSs resulting from dark current accumulation (which result from temperature and operational conditions but not from illumination level) limits the elongating of the FET which would be carried out if dark current accumulation would not significantly limit the dynamic range of the respective PSs. In another example, within a time span in which the scene lighting remains constant, stage 2408 may include determining a longer FET enabled by temperature fall (thereby lowering the dark current and with it the percentage of unusable PSs at each FET), while stage 2416 may include determining a shorter FET because the temperature of the PDA rose again.

Figure 26:
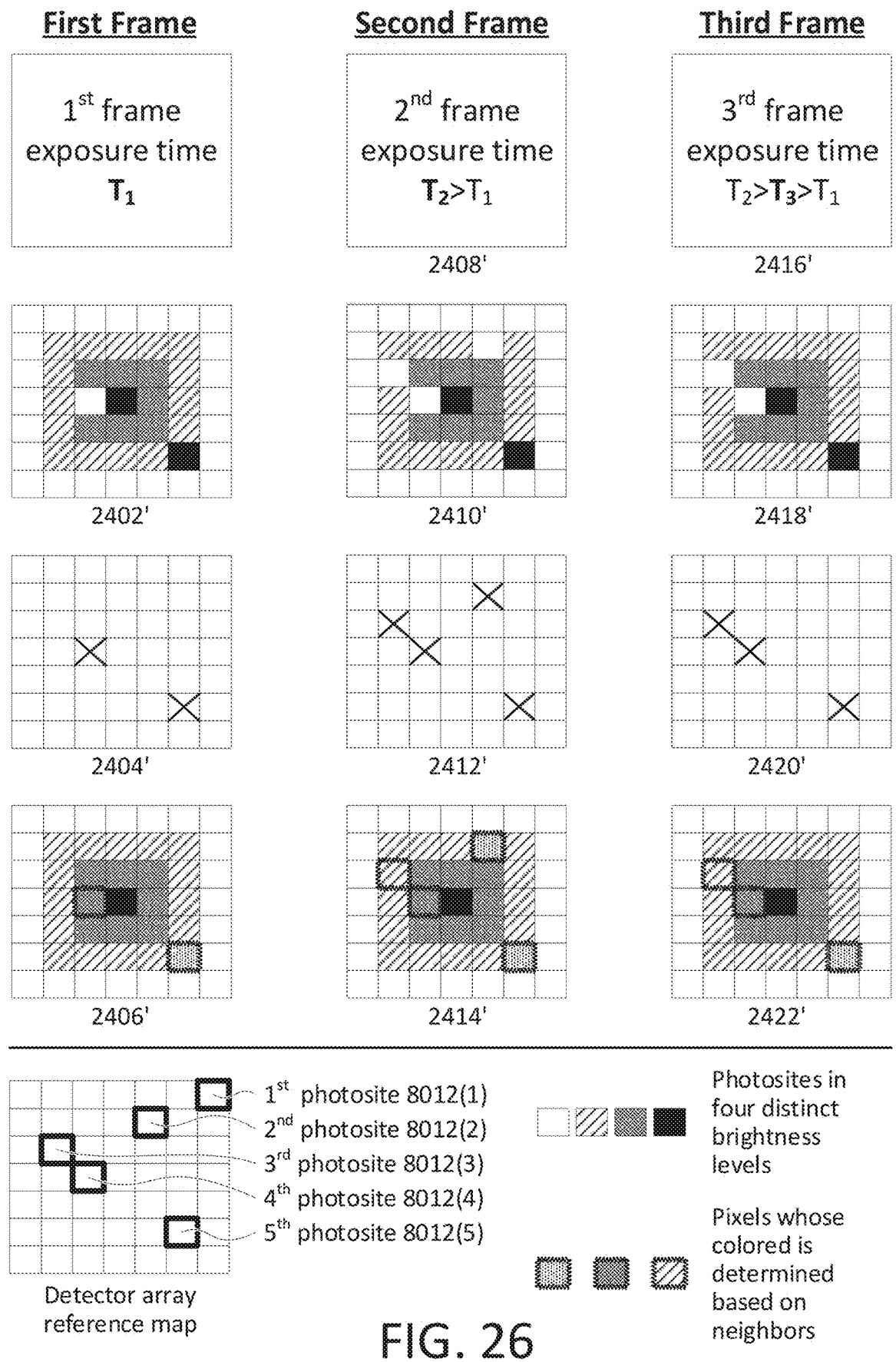

FIG. 26 is a graphical representation of execution of method 2400 for three frames which are taken of the same scene in different FETs, in accordance with examples of the presently disclosed subject matter. The example scene includes including four concentric rectangles, each darker from the one surrounding it. Different diagrams of FIG. 26 correspond to a stage of method 2400, and are numbered with an equivalent reference number with an apostrophe. For example, diagram 2406' matches an execution of stage 2406, and so on. Each rectangle in the lower nine diagrams represents a single PS, or a pixel which maps directly onto such PS (in the lower three diagrams). In all of the diagrams, the location of the PSs with respect to the PDD remains constant.

As common in many types of PDAs, the PDA from which frame information is received may include bad, defective, or otherwise misbehaving PSs (also referred to as bad, defective, or otherwise misbehaving pixels). The term "Misbehaving PS" broadly pertains to a PS deviating from its expected response, encompassing but not limited to stuck, dead, hot, lit, warm, defective, and flashing PSs. Misbehaving PSs may be individual PSs or clusters of PSs. Non-limiting examples of defects which may cause a PS to misbehave include: PS bump bond connectivity, addressing faults in the multiplexer, vignetting, severe sensitivity deficiency of some PSs, non-linearity, poor signal linearity, low full well, poor mean-variance linearity, excessive noise and high dark current. One or more of the PSs which are identified as an unusable PS in method 2400 may be a permanently misbehaving PS, or such which is misbehaving based on conditions which are unrelated to FET (e.g., due to high temperature). Such PSs may be identified as unusable for all of the FETs of method 2400 (e.g., PS 8012.5). It is nevertheless noted that some functional PSs (which are not "misbehaving") may be considered unusable in all of the FETs of method 2400 because of limited capacity and sufficiently long FETs (e.g., PS 8012.4). Optionally, method 2400 may include determining usability of one or more of the PSs of the PDA based on other parameters in addition to FET (e.g., temperature, electric parameters, ambient light level). It is noted that in such cases, a PS which would be rendered unusable for reasons of FET cannot usually be nevertheless considered usable due to other considerations (such as temperature), because of its capacitance limitation.

In the illustrated example:
a. PS 8012.5 outputs no signal regardless of the amount of light impinging on it in all three FETs ($T_1, T_2, T_3$); possibly under all conditions.
b. PS 8012.4 outputs saturated signal regardless of the amount of light impinging on it in all three FETs ($T_1, T_2, T_3$); possibly under all conditions.
c. PS 8012.3 outputs a usable signal at the shortest FET, $T_1$, but a non-usable (saturated) signal at the longer FETs $T_2$ and $T_3$.
d. PS 8012.2 outputs a usable signal at the shorter FETs $T_1$ and $T_3$, but a non-usable (saturated) signal at the longest FET, $T_2$.

It is noted that other types of defects and of erroneous outputs may also occur. Such errors may include, by way of example: outputting a highly non-linear signal response, consistently outputting too strong a signal, consistently outputting too week a signal, outputting random or semi-random output, and so on. Also, many PSs (such as first PS 8012.1) may be usable in all FETs used in the detection.

Reverting to FIG. 23, it is noted that optionally system 2300 may be an EO system which have dynamic PS usability assessment capabilities. That is, EO system 2300 may be able to alternately assign different PSs as usable or unusable, based on FET and possibly other operational parameters, and to utilize the detection signals of PSs only when determined that the respective PSs were usable at the time of capturing (e.g., according to a usability model).

In such a case, EO system 2300 includes:
a. PDA 2302, which includes a plurality of PSs 2306, each operative to output detection signals at different frames. The detection signal output for a frame by the respective PS 2306 being indicative of amount of light impinging on the respective PS during a respective frame (and possibly also on dark current of the PD of the respective PS).
b. A usability filtering module (e.g., implemented as part of processor 2304, or separately thereof). The usability filtering module is operative to determine for each PSs 2306 that the PS is unusable based on a first FET (which may be different between different PSs 2306), and to later determine that the same PS 2306 is usable based on a second FET that is shorter than the first FET. That is, PSs 2306 which were unusable at one point (and whose output was ignored in the generating of one or more images) may later become usable again (e.g., if the FET gets shorter) and the outputs of those PSs 2306 can be useful again in the generation of following images.
c. Processor 2304 which is operative to generate images based on frame detection levels of the plurality of PSs 2306. Among other configurations of the processor 2304, it is configured to: (a) exclude, when generating a first image based on first frame detection levels, a first detection signal of a filtered PS that was determined by the usability filtering module as unusable for the first image, and (b) include, when generating a second image based on second frame detection levels captured by the PDA after the capturing of the first frame detection levels, a second detection signal of the filtered PS that was determined by the usability filtering module as usable for the second image.

Optionally, controller 2314 may determine different FETs for different frames, based on differing illumination levels of objects in the field of view of the EO system.

Optionally, controller 2314 may be configured to determine FETs for the EO system by maximizing FETs while maintaining a number of unusable PSs for the respective frames below a predetermined threshold (e.g., as discussed with respect to method 2400).

Optionally, EO system 2300 may include comprising at least one shielded PD which is shielded from ambient illumination (e.g., by a physical barrier, or using deflecting optics), as well as dedicated circuitry which is operative to output electric parameter indicative of level of dark current based on signal level of the at least one shielded PD. Processor 2304 may be configured to generate images based on the electric parameter, on the respective FET, and on the detection signals of the PDA, thereby compensating for differing degrees of dark current accumulation in different frames.

Optionally, processor 2304 may be operative to compute a replacement value for at least one pixel of the first image that is associated with the filtered PS, based on a detection level of the filtered PS measured when the PS was identified as usable. Optionally, processor 2304 may be configured to compute replacement values for PSs when detection signals by the respective PSs are excluded from the generating of images, based on detection level of neighboring PSs. Optionally, processor 2304 may be operative to compute a replacement value for at least one pixel of the first image that is associated with the filtered PS, based on a first frames detection levels neighboring PSs.

Optionally, processor 2304 (or usability filter module, if not part of the processor) may be operative to determine a degree of usability for PSs based on a FET, the degree including a sum of durations during which sampling PSs of the PDD are sensitive to light and which excludes intermediate times between the durations during which the sampling PSs are not sensitive to light.

Optionally, processor 2304 may utilize a usability model generated according to method 2500 to determine when to include and when to exclude detection signals of different PSs, captured at different FETs. Optionally, EO system 2300 may be operative to execute method 2500. Optionally, EO system 2300 may be configured to participate in execution of method 2500 together with an external system (such as a factory calibration machine used in the manufacturing of EO system 2300).

FIG. 27 is a flow chart illustrating an example of method 3500, in accordance with the presently disclosed subject matter. Method 3500 is used for generating images based on different subsets of PSs in different operational conditions. Referring to examples set forth with respect to the previous drawings, method 3500 may be executed by processor 1 604, where the PDA of method 3500 may optionally be PDA 1 602. Method 3500 includes at least stages 3510, 3520, 3530 and 3540, which are repeated as a sequence for different frames captured by a photodetector array. The sequence may be executed in full for every frame in a stream, but this is not necessarily so, as discussed below in greater detail.

The sequence starts with stage 3510 of receiving from the PDA frame information indicative of detection signals for the frame which are provided by a plurality of PSs of the PDA. The frame information may include detection level (or levels) for each of the PSs (e.g., between 0 and 1024, three RGB values, each between 0 and 255, and so on), or any other formats. The frame information may be indicative of detection signals in indirect manners (e.g., information pertaining to the detection level of a given PS may be given with respect to the level of a neighboring PS or with respect to the level of the same PS in a previous frame). The frame information may also include additional information (e.g., serial number, timestamp, operational conditions), some of which may be used in following steps of method 3500. The PDA from which frame information is received may include bad, defective, or otherwise misbehaving PSs.

Stage 3520 includes receiving operational conditions data indicative of operational conditions of the PDA during the frame duration. The operational conditions may be received from different types of entities, such as any one or more of the following entities: the PDA, a controller of the PDA, the at least one processor which executes method 3500, one or more sensors, one or more controllers of the at least one processor which executes method 3500, and so on. Non-limiting examples of operational conditions which may be referred in stage 3520 include FET of the PDA (e.g., electronic or mechanical shutter, flash illumination duration and so on), amplification gain of the PDA or connected circuitry, bias applied to PDs of the PDA, ambient light levels, dedicated illumination levels, image processing mode of downstream image processor, filtering applied to the light (e.g., spectral filtering, polarization) and so on.

Stage 3530 includes determining-based on the operational conditions data—a group of defective PSs that includes at least one of the PSs and exclude a plurality of the other PSs.

When stage 3530 is executed for different frames based on different operational conditions data received for these frames in different corresponding instances of stage 3520, different groups of defective PSs are selected for different frames whose operational conditions are different for each other. However, the same group of defective pixels may be selected for two frames with different operational conditions (e.g., when the difference in operational conditions relatively small).

It is noted that the determining is based on the operational conditions data and not on evaluating the PSs themselves, and therefore the defectivity of the various PSs included in the different groups is an estimation of their condition, and not a statement about their actual operability conditions. Thus, a PS which is included in the group of defective PSs in stage 3530 is not necessarily defective or inoperative in the operational conditions indicated in the operational conditions data. The determining of stage 3530 is intended to match as accurately as possible to the actual real-life state of the PDA.

Stage 3540 includes processing the frame information to provide an image representing the frame. The processing is based on detection signals of PSs of the photodetector, excluding PSs included in the group of defective PSs. That is, the detections signals from the PSs of the PDA are used to generate an image representing the field of view (or other scene, or one or more objects whose light reaches the PDA), but avoiding all detection signals originating in PSs which are included in the group of defective PSs (which, as aforementioned, is dynamically determined based on the operational conditions data during the time in which the relevant frame information was captured). Stage 3540 may optionally include computing replacement values to compensate for ignored detection signals. Such computing may include, for example, determining a replacement value for a defective PS, based on the detection signals of neighboring PSs. Such computing may include, for example, determining a replacement value for a pixel of the image based on the values of neighboring pixels of the image. Any technique discussed above with respect to generating of images in method 2400 may also be used for the generating of images in stage 3540.

An example for execution of the method for two frames (a first frame and a second frame) may include, for example:

a. Receiving from the PDA first frame information indicative of first detection signals provided by a plurality of PSs and pertaining to a first frame duration, the plurality of PSs including at least a first PS, a second PS, and a third PS. A frame duration is the time during which light collected by the PDA is aggregated to a single image or a frame of a video. Different frame duration may be mutually exclusive, but in some embodiment may optionally be partially overlapping.

b. Receiving first operational-conditions data, indicative of operational conditions of the PDA during the first frame duration.

c. Determining-based at least on the first operational conditions data—a first group of defective PSs, including the third PS and excluding the first PS and the second PS. The determining may include directly determining the first group of defective PSs, or determining other data which implies which pixels are considered defective (e.g., determining a complement set of non-defective pixels, assigning a defectivity level for each pixel and later setting a threshold or other determining criteria).

d. Processing, based on the first group of defective PSs, the first frame information to provide a first image, such that the processing is based at least on the first detection signals of the first PS and the second PS (optionally following preceding preprocessing, such as digitalization, capping, level-adjustments, and so on), and ignores information pertaining to detection signals of the third PS.

e. Receiving from the PDA second frame information indicative of second detection signals provided by a plurality of detection PSs. The second frame information pertains to a second frame duration other than the first frame duration.

f. Receiving second operational conditions data, indicative of operational conditions of the PDA during the second frame duration, which are different than the first operational conditions data. It is noted that the second operational-conditions data may be received from the same source from which the first operational-conditions data was received, but this is not necessarily so.

g. Determining, based on the second operational conditions, data a second group of defective PSs, including the second PS and the third PS and excluding the first PS. The determining may include directly determining the second group of defective PSs, or determining other data which implies which pixels are considered defective (e.g., determining a complement set of non-defective pixels, assigning a defectivity level for each pixel and later setting a threshold or other determining criteria).

h. Processing the second frame information based on the second group of defective PSs to provide a second image, such that the processing of the second image information is based at least on the second detection signals of the first PS and ignores information pertaining to detection signals of the and the second PS and of the third PS.

Figure 28A:
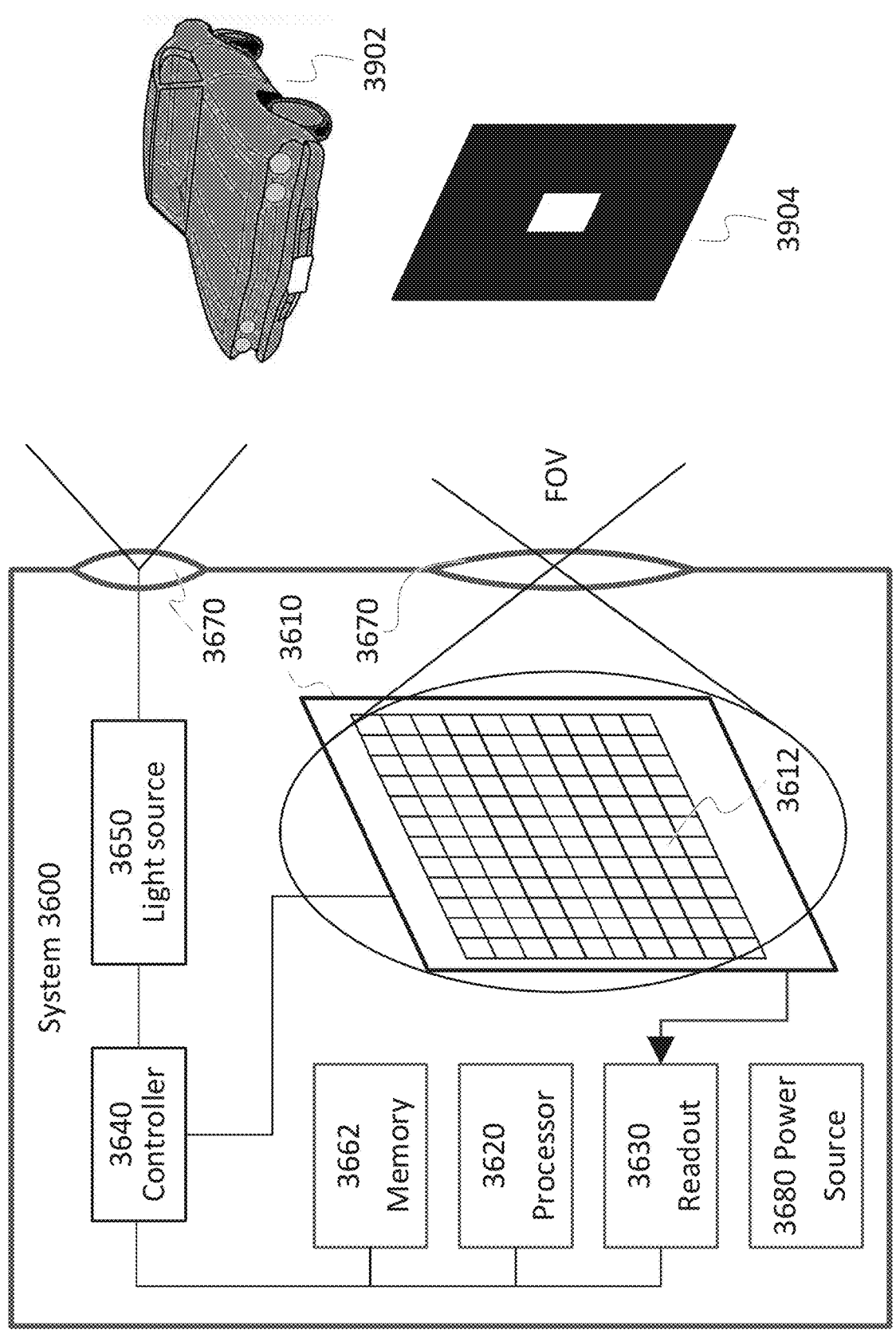

FIG. 28A illustrates system 3600 and exemplary target objects 3902 and 3904, in accordance with examples of the presently disclosed subject matter. EO system 3600 includes at least processor 3620 which is operative to process detection signals from at least one PDA (which may be part of the same system, but it not necessarily so) to generate images representing objects in a field of view of system 3600. System 3600 may be implemented by a system 2300, and similar reference number are used (for example, in such a case PDA 3610 may be PDA 2302, controller 3640 may be controller 2314, and so on), but this is not necessarily so. For reasons of brevity, not all of the description provided above with respect to system 2300 is repeated, and it is noted that any combination of one or more components of system 2300 may be implemented, mutatis mutandis, in system 3600, and vice versa. System 3600 may be a processing system (e.g., a computer, a graphical processing unit) or an EO system which further includes a PDA 3610 and optics. In the latter case, system 3600 may be any type of EO system which uses PDA for detection, such as a camera, a spectrograph, a LIDAR, and so on. Optionally, system 2600 may include one or more illumination sources 3650 (e.g., lasers, LEDs) for illuminating objects in the FOV (e.g., for illuminating the object for at least the first FET and the second FET). Optionally, system 3600 may include controller 3640 which is operative to determine different FETs for different frames, based on differing illumination levels of objects in the field of view of the EO system. Optionally, those different FETs may include the first FET and/or the second FET.

Two exemplary targets are illustrated in FIG. 28A: a dark color car 3902 (having low reflectivity body panels) with a highly reflective license plate, and a black rectangular panel 3904 with a white patch on it. It is noted that system 3600 is not necessarily limited to generating images of low reflectivity objects with high reflectivity patches. However, the way system 3600 generates images of such targets is interesting.

Processor 3620 is configured to receive from a PDA (e.g., PDA 3610, if implemented) multiple detection results of an object that includes a high reflectivity surface surrounded by low reflectivity surfaces on all sides (exemplified by targets 3902 and 3904). The multiple detection results include: (a) first frame information of the object detected by the PDA during a first FET, and (b) second frame information of the object detected by the PDA during a second FET that is longer than the first FET. The first frame information and the second frame information are indicative of detection signals output by different PSs of the PDA which are in turn indicative of light intensities of different parts of the target which are detected by the PDA. Some PSs detect light from low reflectivity parts of the objects while at least one other PS detects light from the high reflectivity surface.

Based on the different FETs, processor 3620 process the first frame information and the second frame information differently. FIG. 28B illustrates exemplary first image and the second image of targets 3902 and 3904, in accordance examples of the presently disclosed subject matter. When processing the first frame information, processor 3620 processes the first frame information, based on the first FET. It generates a first image that includes a bright region representing the high reflectivity surface, surrounded by a dark background representing the low reflectivity surfaces. This is illustrated in FIG. 28B as first images 3912 and 3914 (corresponding to objects 3902 and 3904 of FIG. 28A). When processor 3620 processes the second frame information, based on the second FET, which is longer than the first FET. Tt generates a second image that includes a dark background without a bright region. This is illustrated in FIG. 28B as second images 3922 and 3924 (corresponding to objects 3902 and 3904 of FIG. 28A).

That is, even though more light of the highly reflective surface reaches the respective PSs of the photodetector at the second frame, the image output is not lighter nor saturated, it is darker. Processor 3620 may determine the darker color for the pixels representing the high reflectivity surface in the second image by using information of neighboring PSs (which have lower intensity signals, as they capture lower reflectivity surfaces of the object) because it determined that the signals from the relevant PSs are unusable in that longer second FET. Optionally, processor 3620 may be configured to discard detected light signals corresponding to the high reflectivity surface when generating the second image based on the second FET (and optionally also on usability modeling of the respective PSs, e.g., as discussed with respect to method 2500), and to compute a dark color for at least one corresponding pixel of the second image in response to detected light intensities from neighboring low reflectivity surfaces of the objects captured by neighboring PSs. Optionally, the decision by processor 3620 to discard information of the respective PS is not based on the detection signal level but rather on the susceptibility of the respective PS to dark current (e.g., limited capacitance). Optionally, when processing of the second frame information, processor 3620 may identify at least one PS which detects light from the high reflectivity surface as unusable for the second frame, based on the second FET, e.g., similarly to the identifying stages of method 2400.

It is noted that the high reflectivity surface may be smaller than the low reflectivity surfaces, and may be surrounded by the low reflectivity surfaces on all sides, but this is not necessarily so. The high reflectivity surface may correspond in size (e.g., angular size) to a single PS, to less than one PS, but may also correspond in size to several PSs. The difference between the high reflectivity level and the low reflectivity level may vary. For example, the low reflectivity surfaces may have reflectivity of between 0 and 15 percent, while the high reflectivity surface may be reflectivity of between 80 and 100%. In another example, the low reflectivity surfaces may have reflectivity of between 50 and 55 percent, while the high reflectivity surface may be reflectivity of between 65 and 70%. For example, the minimal reflectivity of the high reflectivity surface may be ×2, ×3, ×5, ×10, or ×100 of the maximal reflectivity of the low reflectivity surface. Optionally, the high reflectivity surface has reflectivity of more than 95% at the spectral range detectable by the PSs (e.g., a white surface), and the low reflectivity surfaces have reflectivity of less than 5% at the spectral range detectable by the PSs (e.g., black surfaces). It is noted that as discussed above, a FET may correspond to a fragmented span of time (e.g., corresponding to several illumination pulses) or to a single continuous span of time.

It is noted that optionally, the amount light signal levels arriving from the high reflectivity surface to the relevant PS in the first FET and in the second FET may be similar. This may be achieved by filtering of incoming light, by changing an f-number of detection optics 3670 correspondingly (e.g. increasing FET by a factor q while increasing the f-number by a factor of q). Optionally, a first exposure value (EV) of the PDA during capturing of the first frame information is less than 1% different than a second EV of the PDA during capturing of the second frame information. Optionally, the difference in FET is the only main difference between operational conditions between the first frame and the second frame.

Assessing of temperature of the PDA to calibrate the usability model to different levels of dark current was discussed above. Optionally, processor 3620 may be further configured to: (a) process the detection signals reflected from the object for determining a first temperature assessment of the photodetection array during the capturing of the first frame information and a second temperature assessment of the photodetection array during the capturing of the first frame information, and (b) determine to discard detection results corresponding to the high reflectivity surface based on the second FET and on the second temperature assessment.

FIG. 29 is a flow chart illustrating method 3700 for generating image information based on data of a PDA, in accordance with examples of the presently disclosed subject matter. Referring to the examples set forth with respect to the previous drawings, it is noted that method 3700 may optionally be executed by system 3600. Any variation discussed above with respect to system 3600 may be applied to method 3700, mutatis mutandis. Especially, method 3700 (and at least stages 3710, 3720, 3730 and 3740 thereof) may be executed by processor 3620.

Stage 3710 includes receiving from a PDA first frame information of a black target that includes a white area, indicative of light intensities of different parts of the target detected by the PDA during a first FET. It is noted that the white area may be replaced by a bright area (or other highly reflective area). For example, any area whose reflectivity is higher than 50% may be used instead. It is noted that the black target may be replaced by a dark area (or other slightly reflective area). For example, any target whose reflectivity is lower than 10% may be used instead.

Stage 3720 includes processing the first frame information based on the first FET to provide a first image that includes a bright region surrounded by a dark background. Optionally, stage 3720 may be implemented using any of the image generation processes discussed above with respect to any of stages 2406, 2414, and 2422 of method 2400.

Stage 3730 includes receiving from the PDA second frame information of the black target that includes the white area, indicative light intensities of the different parts of the target detected by the PDA during a second FET which is longer than the first FET.

Stage 3740 includes processing the second frame information based on the second FET to provide a second image that includes a dark background without a bright region. Optionally, stage 3740 may be implemented using any of the image generation processes discussed above with respect to any of stages 2406, 2414, and 2422 of method 2400, and the preceding stages of identifying groups of usable and unusable PSs.

Regarding the order of execution of method 3700, stage 3720 is executed after stage 3710, and stage 3740 is executed after stage 3730. Other than that, any suitable order of the stages may be used. Method 3700 may also optionally include capturing the first frame information and/or the second frame information via a PDA.

Optionally, the receiving of the second frame information may be preceded by determining, after receiving the first frame information, the second FET which is longer than the first FET. Optionally, the processing of the second frame information may include discarding detected light intensity information of the white area based on the second FET, and determining a dark color an at least one corresponding pixel of the second image in response to detected light intensities of neighboring areas of the second frame information. Optionally, the processing of the second frame information may include identifying at least one PS which detects light from the white area as unusable for the second frame, based on the second FET. Optionally, a first exposure value (EV) of the PDA during capturing of the first frame information may be less than 1% different than a second EV of the PDA during capturing of the second frame information.

Optionally, during the first frame exposure time dark current accumulation on a PS associated with the low reflectivity data leaves a usable dynamic range for the PS, and during the second frame exposure time dark current accumulation on that PS leaves an insufficient dynamic range for the PS. In such a case, the PS corresponding to the high reflectivity area cannot be used for image generation in the second image, and replacement color value can be calculated to replace the missing detection level.

A non-transitory computer-readable medium is provided for generating image information based on data of a PDA, including instructions stored thereon, that when executed on a processor, perform the steps of: (a) receiving from a PDA first frame information of a black target that includes a white area, indicative of light intensities of different parts of the target detected by the PDA during a first FET; (b) processing the first frame information based on the first FET to provide a first image that includes a bright region surrounded by a dark background; (c) receiving from the PDA second frame information of the black target that includes the white area, indicative light intensities of the different parts of the target detected by the PDA during a second FET which is longer than the first FET; (d) processing the second frame information based on the second FET to provide a second image that includes a dark background without a bright region.

The non-transitory computer-readable medium of the previous paragraph may include additional instructions stored thereon, that when executed on a processor, perform any other step or variation discussed above with respect to method 3700.

In the disclosure above, multiple systems, methods, and computer code products where described, as well as ways of utilizing them to electro-optically capture and generate high quality images. Especially, such systems, methods, and computer code products may be utilized to generate high quality SWIR images (or other SWIR sensing data) in the presence of high PDs dark current. Such PDs may be Ge PDs, but not on all occasions are. Some ways of using such systems, methods, and computer program products in a synergetic way were discussed above, and many others are possible and are considered as part of the innovative subject matter of the present disclosure. Any system discussed above may incorporate any one or more components from any one or more of the other systems discussed above, to achieve higher quality results, to achieve similar result in a more effective or cost effective way, or for any other reason. Likewise, any of the methods discussed above may incorporate any one or more stages from any one or more of the other methods discussed above, to achieve higher quality results, to achieve similar result in a more effective or cost effective way, or for any other reason.

In the paragraphs below, few non-limiting examples of such combinations are provided, to demonstrate some of the possible synergies.

For example, imaging systems 100, 100' and 100", in which the integration time is sufficiently short to overcome excessive effect of dark current noise, may implement PDDs such as PDDs 1300, 1300', 1600, 1600', 1700, 1800 to be included in receiver 110 to reduce the time invariant (direct current, DC) parts of the dark noise. This way, the capacitance of the PSs is not overwhelmed by the time invariant parts of the dark current which are not accumulated in the detection signal, and the noise of the dark current does not overshadow the detection signal. Implementing any of PDDs 1300, 1300', 1600, 1600', 1700, 1800 in any of imaging systems 100, 100' and 100" may be used to extend the frame exposure time to a noticeable degree (because the DC part of the dark current is not accumulated in the capacitance), while still detecting a meaningful signal.

For example, imaging systems 100, 100' and 100", in which the integration time is set sufficiently short to overcome excessive effect of dark current noise, may implement any one or more of methods 2400, 2500 and 3500 to determine which PSs are usable at that frame exposure time, and possibly to reduce the frame exposure time (which corresponds to the integration time) even further to ascertain that a sufficient number of PSs are usable. Likewise, the expected ratio between the readout noise and the expected accumulated dark current noise level at a given FET and the expected usability of the different PS in such a FET may be used by the controller to set a balance between the quality of the detected signal, the amount of usable pixels, and the illumination level required from the light source (e.g., laser 600). The usability model at different FETs may also be used to determine the distance ranging of the gated images generated by imaging system 100, 100' and 100", when applicable. Further incorporating any of PDDs 1300, 1300',

1600, 1600', 1700, 1800 as the sensor of such imaging system would add the benefits discussed in the previous paragraph.

For example, any one or more of methods 2400, 2500 and 3500 may be implemented by system 1900 (or by any EO system that includes any of PDDs 1300, 1300', 1600, 1600', 1700, 1800). The reduction of the effects of dark current accumulation as discussed with respect to system 1900 (or any of the PDDs mentioned) allow utilization of longer FETs. Implementing any of methods may be used to facilitate the longer possible FETs, because determining which PSs are temporarily unusable in a relatively long FET enable system 1900 (or another EO system with one of the PDDs mentioned) to ignore such PSs, and optionally to replace their detection output with data of neighboring PSs.

Some stages of the aforementioned methods may also be implemented in a computer program for running on a computer system, at least including code portions for performing steps of a the relevant method when run on a programmable apparatus, such as a computer system or enabling a programmable apparatus to perform functions of a device or system according to the disclosure. Such methods may also be implemented in a computer program for running on a computer system, at least including code portions that make a computer execute the steps of a method according to the disclosure.

A computer program is a list of instructions such as a particular application program and/or an operating system. The computer program may for instance include one or more of: a subroutine, a function, a procedure, a method, an implementation, an executable application, an applet, a servlet, a source code, code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Optionally, the illustrated examples may be implemented as circuitry located on a single integrated circuit or within a same device. Alternatively, the examples may be implemented as any number of separate integrated circuits or separate devices interconnected with each other in a suitable manner. Optionally, suitable parts of the methods may be implemented as soft or code representations of physical circuitry or of logical representations convertible into physical circuitry, such as in a hardware description language of any appropriate type.

Other modifications, variations and alternatives are also possible. The specifications and drawings are, accordingly, to be regarded in an illustrative rather than in a restrictive sense. While certain features of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the disclosure. It will be appreciated that the embodiments described above are cited by way of example, and various features thereof and combinations of these features can be varied and modified. While various embodiments have been shown and described, it will be understood that there is no intent to limit the disclosure by such disclosure, but rather, it is intended to cover all modifications and alternate constructions falling within the scope of the disclosure, as defined in the appended claims.

In the claims or specification of the present application, unless otherwise stated, adjectives such as "substantially" and "about" modifying a condition or relationship characteristic of a feature or features of an embodiment, are understood to mean that the condition or characteristic is defined to within tolerances that are acceptable for operation of the embodiment for an application for which it is intended. It should be understood that where the claims or specification refer to "a" or "an" element, such reference is not to be construed as there being only one of that element.

All patent applications, white papers and other publicly available data published by the assignee of the present disclosure and/or by TriEye LTD. of Tel Aviv, Israel are incorporated herein by reference in their entirety. No reference mentioned herein is admitted to be prior art.

What is claimed is:

1. A passively Q-switched (P-QS) laser, comprising:
   a gain medium comprising a ceramic gain medium crystalline (GMC) material that includes a ceramic neodymium-doped rare-earth element crystal;
   a saturable absorber (SA) rigidly coupled to the gain medium, the SA comprising a ceramic saturable absorber crystalline (SAC) material selected from a group of doped crystalline materials consisting of (a) three-valence vanadium-doped yttrium aluminum garnet ($V^{3+}$:YAG) and (b) Cobalt-doped crystalline materials;

an undoped YAG in addition to the gain medium and to the SA, for preventing heat from accumulating in an absorptive region of the gain medium, wherein the undoped YAG is shaped as a cylinder encircling the gain medium and the SA; and an optical cavity within which the gain medium and the SA are positioned, the optical cavity including a high reflectivity mirror and an output coupler.

2. The P-QS laser of claim 1, wherein the rare-earth element is yttrium.

3. The P-QS laser of claim 2, wherein the ceramic neodymium-doped rare-earth element crystalline material is selected from a group consisting of Nd:YLF and Nd:YVO$_4$.

4. The P-QS laser of claim 1, wherein the high reflectivity mirror and the output coupler are rigidly coupled to the gain medium and the SA, such that the P-QS laser is a monolithic microchip P-QS laser.

5. The P-QS laser of claim 1, wherein at least one of the GMC material and the SAC material is polycrystalline.

6. The P-QS laser of claim 5, wherein the ceramic neodymium-doped rare-earth element crystalline material is selected from a group consisting of Nd:YLF and Nd:YVO$_4$.

7. The P-QS laser of claim 1, wherein the high reflectivity mirror and the output coupler are rigidly coupled to the gain medium and the SA, such that the P-QS laser is a monolithic microchip P-QS laser.

8. The P-QS laser of claim 7, wherein the ceramic neodymium-doped rare-earth element crystalline material is selected from a group consisting of Nd:YLF and Nd:YVO$_4$.

9. The P-QS laser of claim 1, wherein the GMC material is neodymium-doped yttrium orthovanadate (Nd:YVO$_4$).

10. The P-QS laser of claim 1, wherein the SAC material is cobalt-doped Spinel ($Co^{2+}$:MgAl$_2$O$_4$).

11. The P-QS laser of claim 1, wherein the SAC material is cobalt-doped Zinc selenide ($Co^{2+}$:ZnSe).

12. The P-QS laser of claim 1, wherein the gain medium and the SA are implemented on a single piece of crystalline material doped with neodymium and at least one other material.

13. The P-QS laser of claim 1, wherein the initial transmission (To) of the SA is between 78% and 82%.

14. The P-QS laser of claim 13, wherein the ceramic neodymium-doped rare-earth element crystalline material is selected from a group consisting of Nd:YLF and Nd:YVO$_4$.

15. A passively Q-switched (P-QS) laser, comprising:
a gain medium comprising a ceramic gain medium crystalline (GMC) material that includes a ceramic neodymium-doped rare-earth element crystal;
a saturable absorber (SA) rigidly coupled to the gain medium, the SA comprising a ceramic saturable absorber crystalline (SAC) material, wherein the SAC material is $Co^{2+}$:YAG, and
an optical cavity within which the gain medium and the SA are positioned, the optical cavity including a high reflectivity mirror and an output coupler.

16. An electrooptical system, comprising:
a passively Q-switched (P-QS) laser, the P-QS laser comprising a gain medium comprising a ceramic gain medium crystalline (GMC) material that includes a ceramic neodymium-doped rare-earth element crystal, a saturable absorber (SA) rigidly coupled to the gain medium, the SA comprising a ceramic saturable absorber crystalline (SAC) material selected from a group of doped crystalline materials consisting of (a) three-valence vanadium-doped yttrium aluminum garnet ($V^{3+}$:YAG) and (b) Cobalt-doped crystalline materials, and an optical cavity within which the gain medium and the SA are positioned, the optical cavity including a high reflectivity mirror and an output coupler, wherein the P-QS laser is configured to illuminate a target; and
a sensor configured to sense radiation reflected from the illuminated target and convert the reflected illumination into image data.

17. The electrooptical system of claim 16, further comprising a processor operable to process the image data provided by the sensor for determining a presence of an object in a field of view of the electrooptical system.

* * * * *